(12) United States Patent
Venkatraman et al.

(10) Patent No.: US 9,917,184 B2
(45) Date of Patent: Mar. 13, 2018

(54) SEMICONDUCTOR COMPONENT THAT INCLUDES A CLAMPING STRUCTURE AND METHOD OF MANUFACTURING THE SEMICONDUCTOR COMPONENT

(71) Applicant: Semiconductor Components Industries, LLC, Phoenix, AZ (US)

(72) Inventors: Prasad Venkatraman, Gilbert, AZ (US); Balaji Padmanabhan, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/209,578

(22) Filed: Jul. 13, 2016

(65) Prior Publication Data
US 2017/0194486 A1 Jul. 6, 2017

Related U.S. Application Data

(60) Provisional application No. 62/196,662, filed on Jul. 24, 2015.

(51) Int. Cl.
| | |
|---|---|
| *H01L 21/336* | (2006.01) |
| *H01L 31/062* | (2012.01) |
| *H01L 27/01* | (2006.01) |
| *H01L 29/78* | (2006.01) |
| *H01L 29/66* | (2006.01) |
| *H01L 29/10* | (2006.01) |
| *H01L 27/088* | (2006.01) |
| *H01L 29/423* | (2006.01) |

(Continued)

(52) U.S. Cl.
CPC ........ *H01L 29/7813* (2013.01); *H01L 27/088* (2013.01); *H01L 29/0623* (2013.01); *H01L 29/0696* (2013.01); *H01L 29/1095* (2013.01); *H01L 29/407* (2013.01); *H01L 29/4236* (2013.01); *H01L 29/4238* (2013.01); *H01L 29/66734* (2013.01)

(58) Field of Classification Search
CPC .............. H01L 29/1095; H01L 29/407; H01L 29/4236; H01L 29/66734; H01L 29/7813; H01L 29/66348; H01L 29/7395; H01L 29/66712; H01L 29/7825; H01L 29/66333; H01L 29/78642; H01L 27/10876; H01L 27/0664
USPC ................ 257/302, 328–330, 339, 348, 349; 438/259, 270, 361
See application file for complete search history.

(56) References Cited

U.S. PATENT DOCUMENTS

| | | |
|---|---|---|
| 2011/0133251 A1 | 6/2011 | He |
| 2013/0069208 A1 | 3/2013 | Briere |

(Continued)

*Primary Examiner* — Hsien Ming Lee
(74) *Attorney, Agent, or Firm* — Rennie William Dover

(57) ABSTRACT

Embodiments include a method and structure to that provide a clamping structure in an integrated semiconductor device. In accordance with an embodiment, the method includes forming trenches in a semiconductor material and forming a shield electrode in a portion of at least one of the trenches. A clamping structure is formed adjacent to a trench. The clamping structure has an electrode that may be electrically connected to a source region of the integrated semiconductor device. In accordance with another embodiment, an impedance element is formed in a trench.

20 Claims, 44 Drawing Sheets

(51) Int. Cl.
*H01L 29/06* (2006.01)
*H01L 29/40* (2006.01)

(56) References Cited

U.S. PATENT DOCUMENTS

2013/0075810 A1\* 3/2013 Hsieh ................ H01L 29/66348
  257/328
2013/0088280 A1 3/2013 Lal et al.

\* cited by examiner

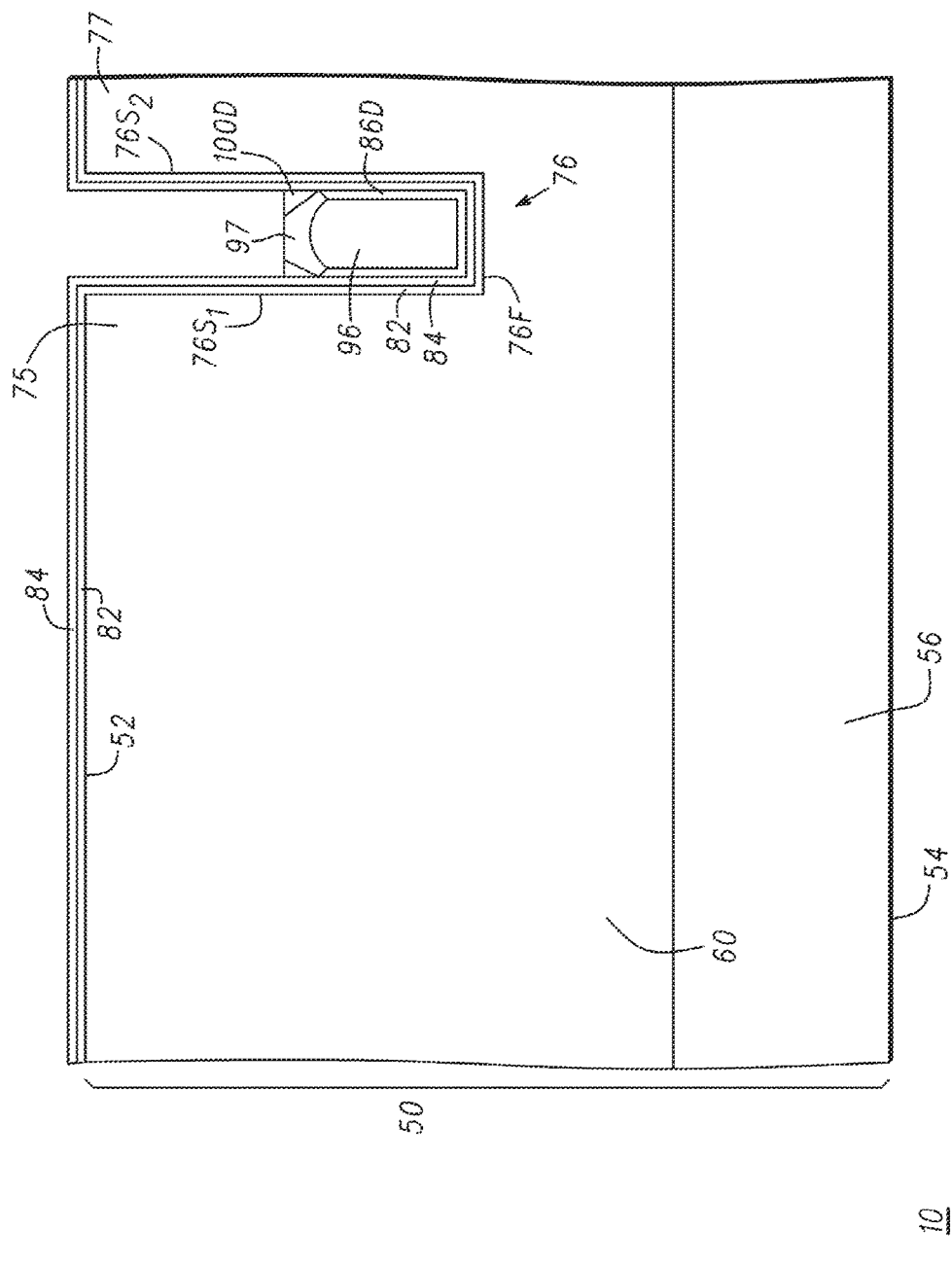

10A

US 9,917,184 B2

SEMICONDUCTOR COMPONENT THAT INCLUDES A CLAMPING STRUCTURE AND METHOD OF MANUFACTURING THE SEMICONDUCTOR COMPONENT

The present application is a nonprovisional application of Provisional Patent Application No. 62/196,662 filed on Jul. 24, 2015, by Prasad Venkatraman et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs), High Electron Mobility Transistors (HEMTs), etc. Devices such as diodes, Schottky diodes, and FETs were typically manufactured from a silicon substrate. Drawbacks with semiconductor devices manufactured from a silicon substrate include low breakdown voltages, excessive reverse leakage current, high drain to source resistance (Rds(on)), unsuitably poor switching characteristics, low power densities, and high costs of manufacture. To overcome these drawbacks, semiconductor manufacturers have turned to manufacturing semiconductor devices from compound semiconductor substrates such as, for example, III-N semiconductor substrates, III-V semiconductor substrates, II-VI semiconductor substrates, etc. Although these substrates have improved device performance, they are fragile and add to manufacturing costs. Thus, the semiconductor industry has begun using compound semiconductor substrates that are a combination of silicon and III-N materials to address the issues of cost, manufacturability, and fragility. A III-N compound semiconductor material formed on a silicon substrate or other semiconductor substrate has been described in U.S. Patent Application Publication Number 2011/0133251 A1 by Zhi He and published on Jun. 9, 2011, and in U.S. Patent Application Publication Number 2013/0069208 A1 by Michael A. Briere and published on Mar. 21, 2013.

Semiconductor manufacturers have used a combination of silicon semiconductor materials and III-N semiconductor materials to manufacture devices, such as a normally-on III-N depletion mode HEMT cascoded with a silicon device. Using this combination of materials helps achieve a normally-off state using a III-N depletion mode device that is normally-on. In cascoded devices configured as switches, the silicon device often operates in avalanche mode due to high leakage currents of the III-N device operating under a high drain bias. In the past, silicon trench MOSFETs have used a shielded gate architecture in which a shield electrode is disposed in a trench underlying a gate electrode. Typically, the shield electrode is connected to the source electrode of the MOSFET and extends into the N-type drift region of the MOSFET. The shield electrode is separated from the drift region by a shield dielectric. Under reverse bias, the shield electrodes assist in depleting the N-type drift region between two adjacent trenches. This type of structure enables a higher doping in the N-type drift region and hence a lower Rds(on). The spacing between two adjacent trenches and the doping of the N-type drift region are optimized so that the drift region is fully depleted at the breakdown voltage of the device. Further, to promote high reliability and high avalanche energy capability, the impurity material concentration of the drift region is optimized such that the impact ionization occurs near the bottom of the trench. One consequence of this is that under avalanche conditions, there may be charge injection into the shield dielectric near the bottom of the trench which impacts the electric field in the drift region and causes the breakdown voltage of the MOSFET to decrease, resulting in device failure in poor reliability. In addition, in the avalanche operating mode, the gate of the III-N device is under a large stress in which the absolute gate to source voltage exceeds the devices pinch-off voltage. Hard stress conditions such as operating the silicon device in the avalanche mode degrades device reliability, lowers the breakdown voltage, and increases leakage currents. Although cascoded semiconductor devices have been described in U.S. Patent Application Publication Number 2013/0088280 A1 by Rakesh K. Lal et al. and published on Apr. 11, 2013, techniques for protecting the silicon field effect transistor and the gate of the III-N device have not been addressed.

Accordingly, it would be advantageous to have a cascoded semiconductor device structure and a method for manufacturing the cascoded semiconductor device that include clamping structures for protecting the silicon field effect transistor. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 9A and FIG. 9B are cross-sectional views of the semiconductor component of FIG. 1 at a later stage of manufacture than that of the cross-sectional views of FIG. 8A and FIG. 8B, respectively, in accordance with an embodiment of the present invention;

Figure 1:
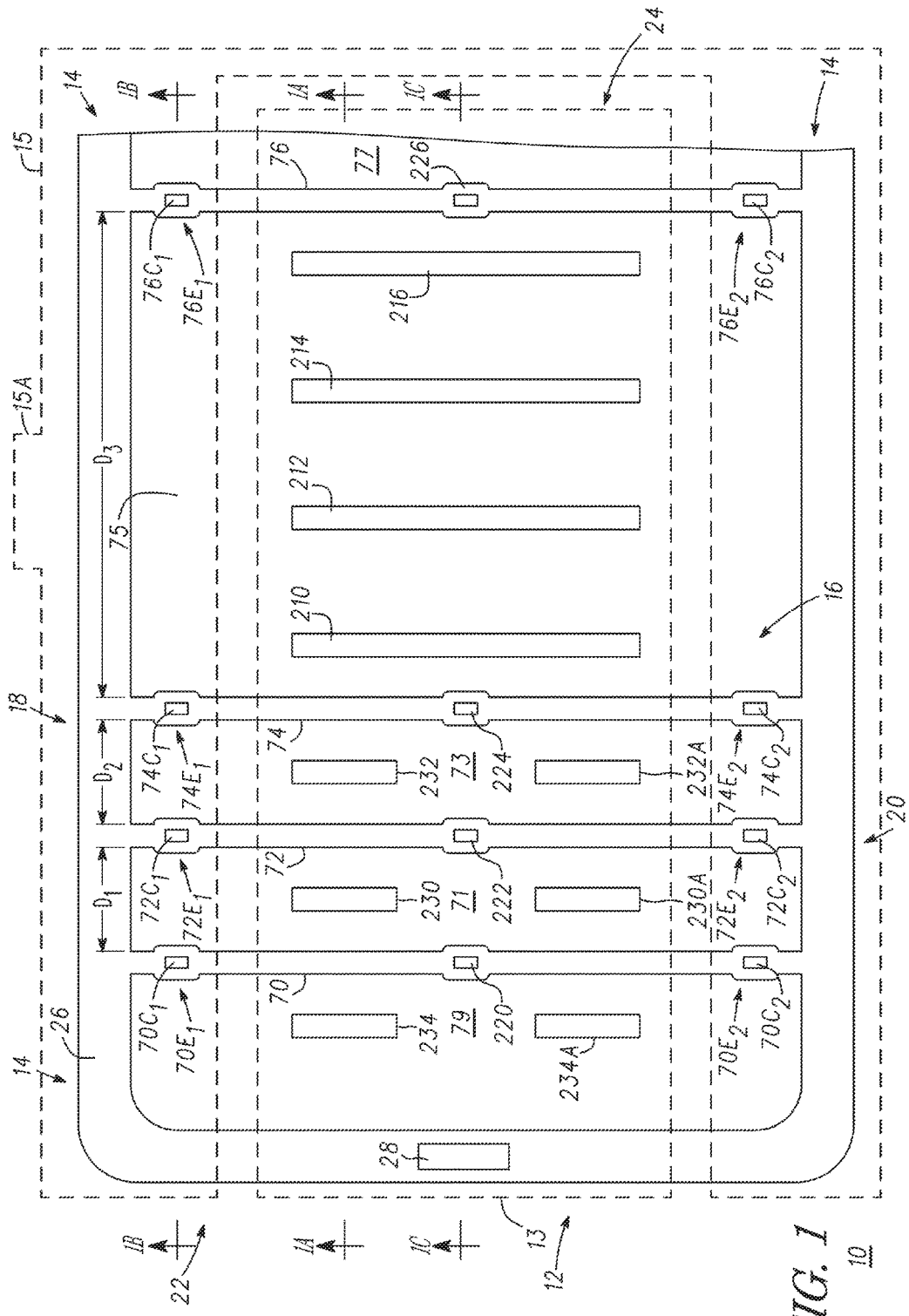
FIG. 1 is a top view of a semiconductor component having an active area and a peripheral area in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described. For clarity of the drawings, doped regions of device structures are illustrated as having generally straight-line edges and precise angular corners; however, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

DETAILED DESCRIPTION

FIG. 1 is an enlarged plan view of a semiconductor component 10 comprising a semiconductor chip 12 in accordance with an embodiment of the present invention. What is shown in FIG. 1 is a portion of semiconductor die or semiconductor chip 12 having edge regions 14, a center region 16, opposing sides 18 and 20, and opposing sides 22 and 24. Edge regions 14 are also referred to as die edges or inactive areas and center region 16 is also referred to as a die center or an active area. A peripherally located shield electrode trench 26 is formed in edge regions or inactive areas 14 and around active area 16. A contact 28 is formed in trench 26. Trenches 70, 72, 74, and 76 extend from side 18 to side 20 of semiconductor chip 12. Trench 70 has ends $70E_1$ and $70E_2$ and contacts $70C_1$ and $70C_2$, trench 72 has ends $72E_1$ and $72E_2$ and contacts $72C_1$ and $72C_2$, trench 74 has ends $74E_1$ and $74E_2$ and contacts $74C_1$ and $74C_2$, and trench 76 has ends $76E_1$ and $76E_2$ and contacts $76C_1$ and $76C_2$. In addition FIG. 1 illustrates clamping structures 210, 212, 214, and 216. It should be noted that a mesa structure 71 is formed between trenches 70 and 72, a mesa structure 73 is formed between trenches 72 and 74, a mesa structure 75 is formed between trenches 74 and 76, a mesa structure 77 is formed adjacent trench 76, and a mesa structure 79 is formed adjacent trench 70. Mesa structure 71 has a width $D_1$, mesa structure 73 has a width $D_2$, and mesa structure 75 has a width $D_3$, wherein width $D_3$ is greater than widths $D_1$ and $D_2$. In accordance with an embodiment, widths $D_1$ and $D_2$ are substantially equal. Thus, mesa structure 71 has a width in accordance with the spacing between trenches 70 and 72, mesa structure 73 has a width in accordance with the spacing between trenches 72 and 74, and mesa structure 75 has a width in accordance with the spacing between trenches 74 and 76.

Source contacts 230 and 230A are formed from portions of mesa structure 71, source contacts 232 and 232A are formed from portions of mesa structure 73, and source contacts 234 and 234A are formed from portions of mesa structure 79. Thus, an active Field Effect Transistor ("FET") is formed from trenches 70, 72, and 74 and from mesa structures 71 and 73. A clamping structure is formed from mesa structure 75 between trenches 74 and 76. It should be noted that active semiconductor devices such as, for example, a Field Effect Transistor ("FET") that make up portions of semiconductor components such as a cascode semiconductor component may be formed from trenches 70, 72, and 74 and mesa structures 71 and 73, whereas clamping structures that serve as protective devices for the active field effect transistors may be formed from trenches 74 and 76 and mesa structure 75.

Semiconductor component 10 includes a source metallization system 13 that connects the source contacts and a gate metallization system 15 that connects the gate contacts and a metal extension 15A for connecting the gate contacts to other circuit elements.

Figure 2A:
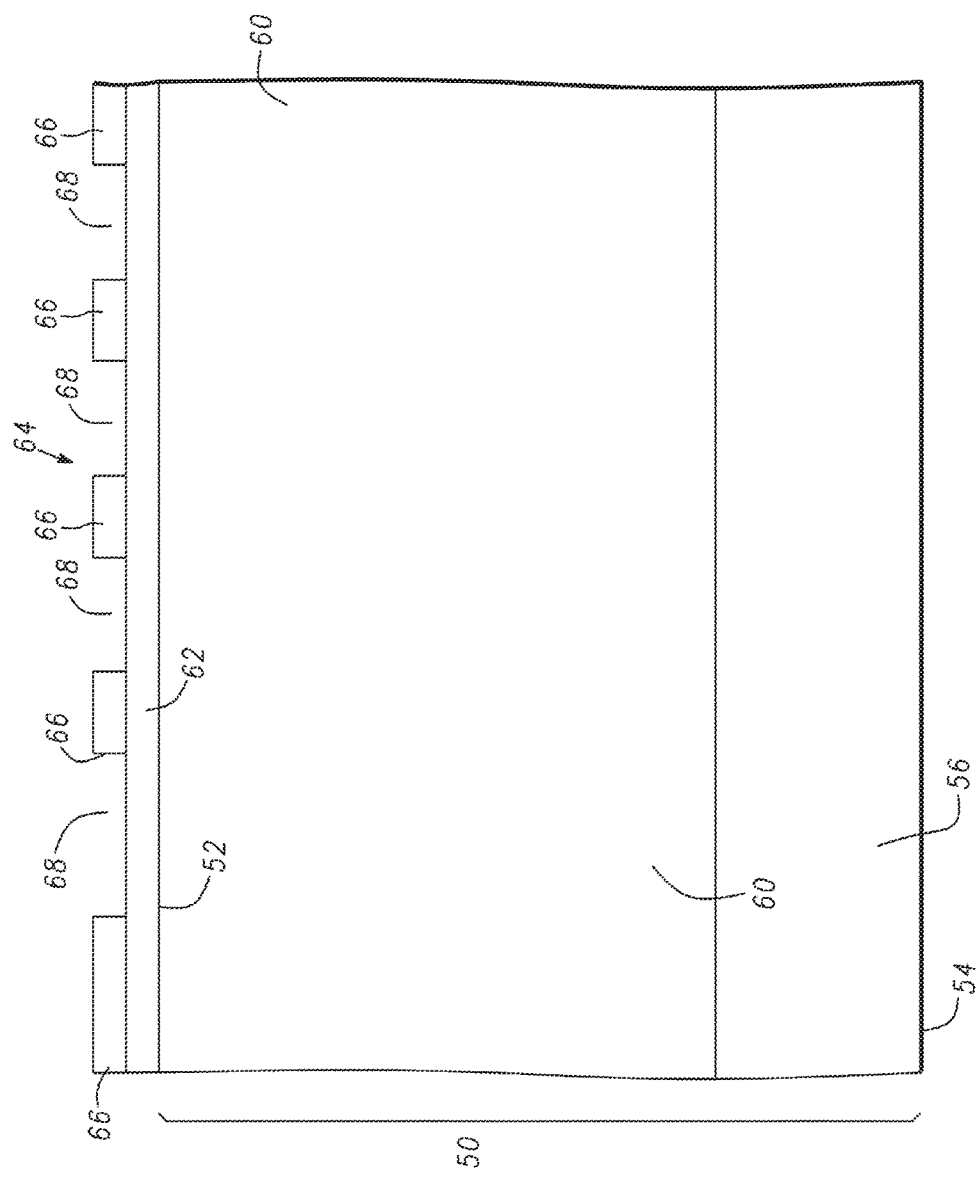
FIG. 2A and FIG. 2B are cross-sectional views of the semiconductor component of FIG. 1 taken along the area of section line 1A-1A of FIG. 1 during the manufacture of the semiconductor component.
Figure 2B:
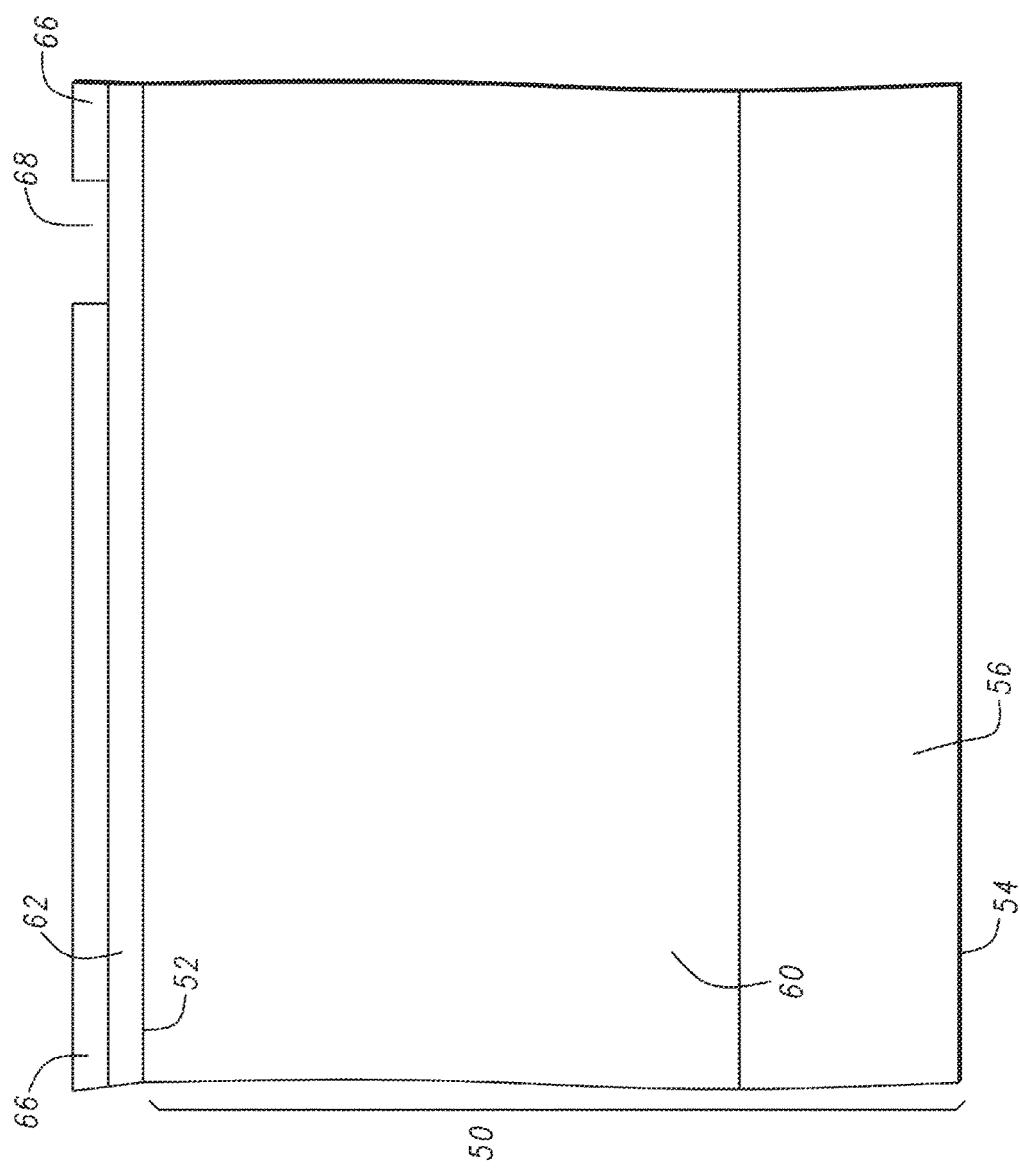

FIGS. 2A and 2B are cross-sectional views of semiconductor component 10 taken along section line 1A-1A of FIG. 1 in accordance with an embodiment of the present invention. It should be noted that FIGS. 2A and 2B are described together because they represent the region taken along section line 1A-1A of FIG. 1 and occur at the same time in the manufacture of semiconductor component 10. Collectively, FIGS. 2A and 2B may be referred to as FIG. 2. FIG. 2 is shown as two figures to expand FIG. 2 and better show the features of semiconductor component 10. What is shown in FIGS. 2A and 2B, i.e., FIG. 2, is a semiconductor material 50 having opposing surfaces 52 and 54. Surface 52 is also referred to as a front or top surface and surface 54 is also referred to as a bottom or back surface. In accordance with this embodiment, semiconductor material 50 comprises a semiconductor substrate 56 doped with an impurity material of N-type conductivity and has a resistivity ranging from about 0.0005 Ohm-centimeter (Ω-cm) to about 0.005 Ω-cm. Preferably, the resistivity of substrate 56 is about 0.001 Ω-cm. By way of example, substrate 56 may be doped with an impurity material of N-type conductivity such as, for example, phosphorus, arsenic, antimony, or the like. By way of example, substrate 56 is silicon.

In accordance with an embodiment, semiconductor material 50 further comprises a layer of semiconductor material 60 of N-type conductivity formed on substrate 56. Semiconductor layer 60 may be formed using semiconductor epitaxial growth techniques, semiconductor doping and diffusion techniques, or the like. By way of example, semiconductor layer 60 is formed by an epitaxial growth technique having a thickness ranging from about 2 micrometers (μm) to about 10 μm and a dopant concentration ranging from about $5.0 \times 10^{15}$ atoms per centimeter cubed (atoms/$cm^3$) to about $1.0 \times 10^{17}$ atoms/$cm^3$. As those skilled in the art are aware, a micrometer may be referred to as a micron. It should be noted that semiconductor layer 60 may be a single layer of semiconductor material with a uniform doping concentration; semiconductor layer 60 may be a single layer of semiconductor material having a graded doping concentration; or semiconductor layer 60 may be comprised of two or more semiconductor layers with different doping concentrations. The dopant concentration and thickness of semiconductor layer 60 can be increased or decreased depending on the desired drain-to-source breakdown voltage rating ("BVDSS") of semiconductor component 10. Alternatively, the conductivity type of substrate 56 can be opposite to the conductivity type of semiconductor layer 60 to form, for example, an insulated gate bipolar transistor (IGBT). Other semiconductor devices that can be manufactured using semiconductor material 50 include a vertical power MOSFET, MOS-gated thyristors, and other equivalent structures known to one of ordinary skill in the relevant art.

It should be noted that a region or layer doped with an N-type dopant or impurity material is said to be of an N-type conductivity or an N conductivity type and a region or layer doped with a P-type dopant or impurity material is said to be of a P-type conductivity or a P conductivity type.

A masking layer 62 can be formed on or from semiconductor material 50. Masking layer 62 can be a dielectric film or a film resistant to the etch chemistries used to form trenches or trench features. By way of example, masking layer 62 is a thermally grown oxide having a thickness ranging from about 0.1 μm to about 1.0 μm. Alternatively, masking layer 62 can be a TEOS layer formed using plasma enhanced chemical vapor deposition. Still referring to FIG. 2, a layer of photoresist is patterned over dielectric layer 62 to form a masking structure 64 having masking elements 66 and openings 68 that expose portions of dielectric layer 62.

Figure 3A:
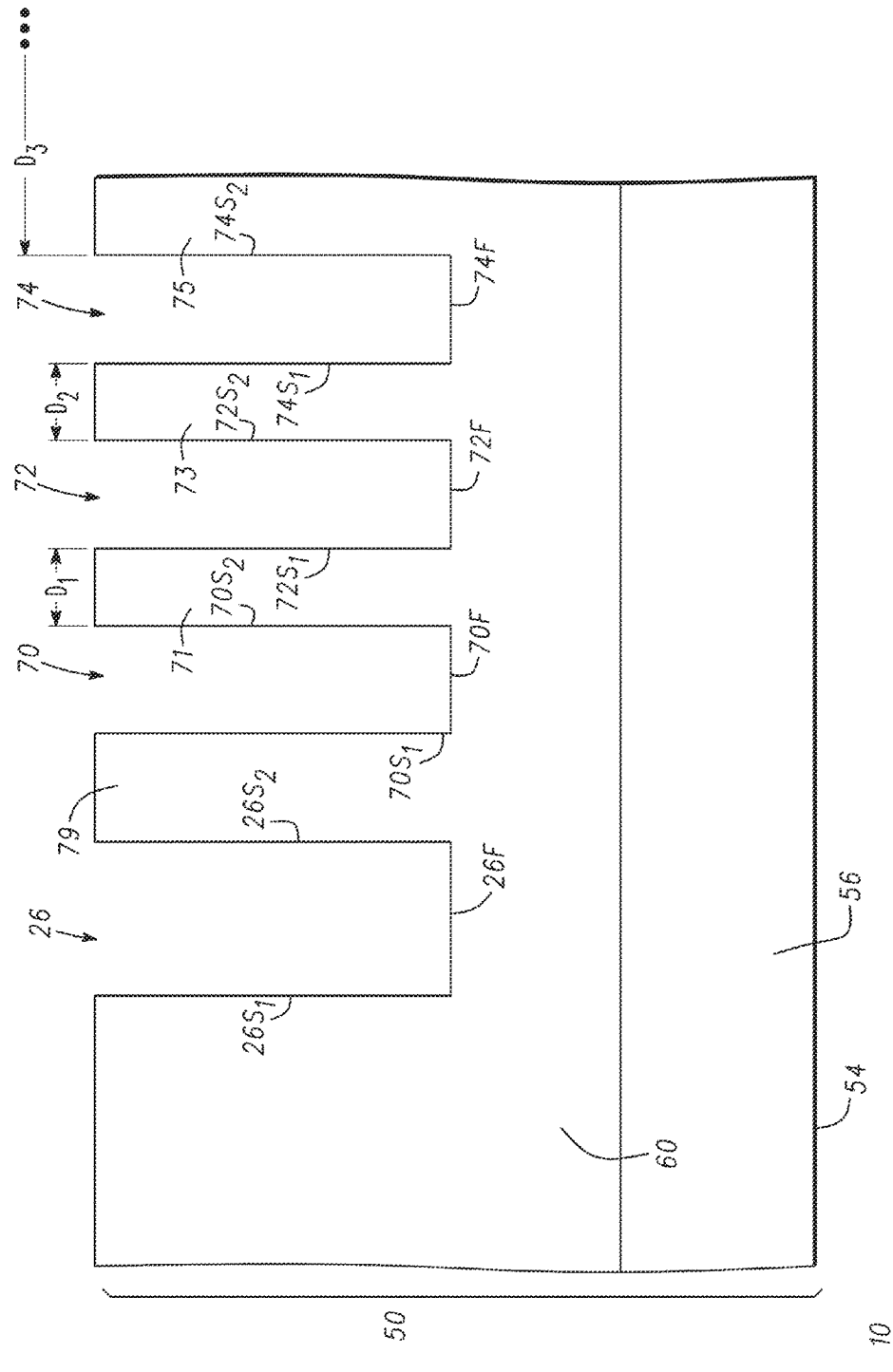
FIG. 3A and FIG. 3B are cross-sectional views of the semiconductor component of FIG. 1 at a later stage of manufacture than that of the cross-sectional views of FIGS. 2A and 2B, respectively, in accordance with an embodiment of the present invention.
Figure 3B:
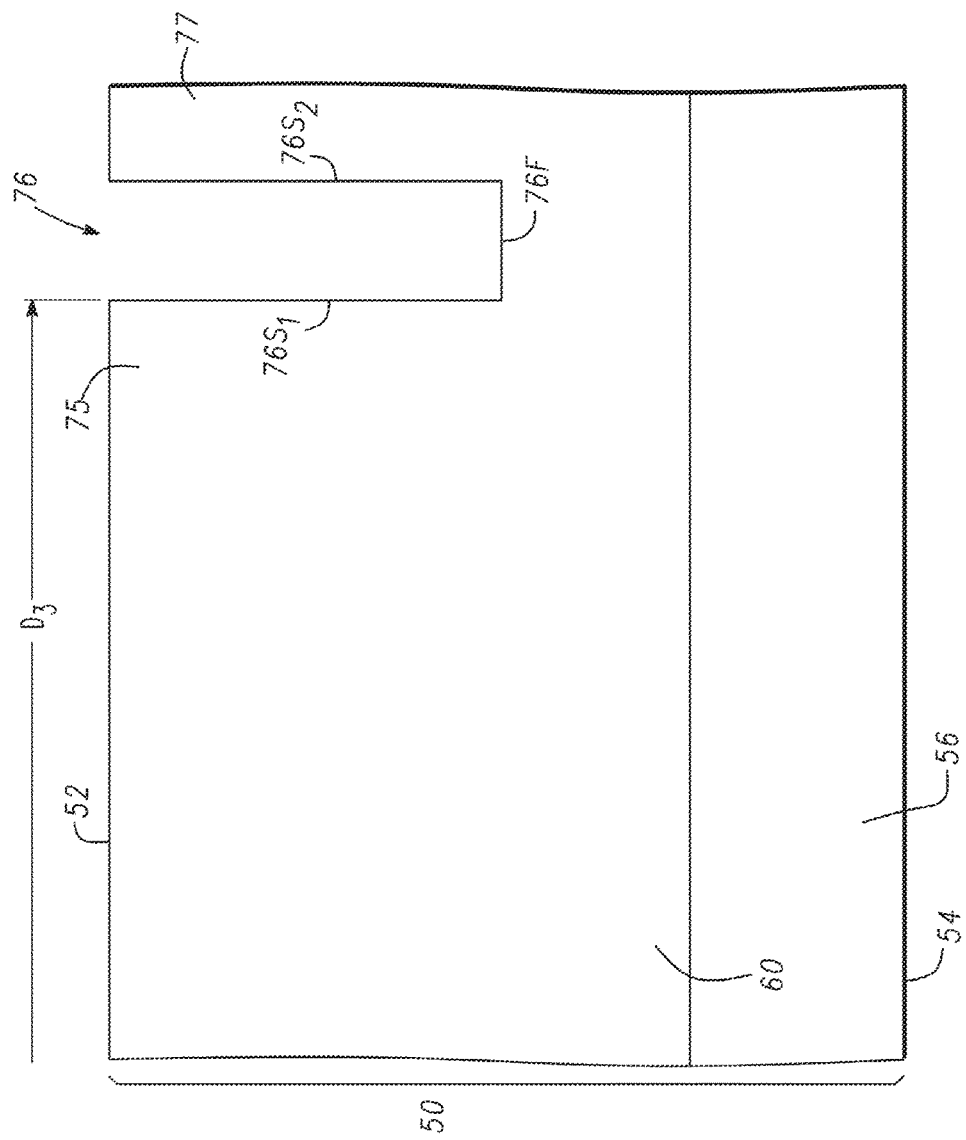

Referring now to FIGS. 3A and 3B, cross-sectional views of the manufacture of semiconductor component 10 at a later stage of manufacture than that of the cross-sectional views of FIGS. 2A and 2B, respectively, are illustrated in accordance with an embodiment of the present invention. It should be noted that FIGS. 3A and 3B are described together because they represent the region taken along section line 1A-1A of FIG. 1 and occur at the same time in the manufacture of semiconductor component 10 as each other. Collectively, FIGS. 3A and 3B may be referred to as FIG. 3. FIG. 3 is shown as two figures to expand FIG. 3 and better show the features of semiconductor component 10. More particularly, FIGS. 3A and 3B illustrate the formation of trenches 26, 70, 72, 74, and 76 that extend from portions of surface 52 into epitaxial layer 60. By way of example, trenches 26, 70, 72, 74, and 76 are formed by etching epitaxial layer 60 using, for example, plasma etching techniques with a fluorocarbon or fluorine-based etch chemistry (for example, $SF_6/O_2$). In accordance with an embodiment, trenches 26, 70, 72, 74, and 76 extend into epitaxial layer 60 but do not extend as far as substrate 56 and in accordance with another embodiment, trenches 26, 70, 72, 74, and 76 extend through epitaxial layer 60 and into substrate 56. By way of example, trenches 26, 70, 72, 74, and 76 have a depth ranging from about 1 μm to about 3 μm and are formed using a single etch step. Alternatively, trenches 26, 70, 72, 74, and 76 can be formed using a multi-step etch process. Techniques for forming trenches 26, 70, 72, 74, and 76 are not limitations of the present invention. Trench 26 has sidewalls $26S_1$ and $26S_2$, and a floor 26F; trench 70 has sidewalls $70S_1$ and $70S_2$, and a floor 70F; trench 72 has sidewalls $72S_1$ and $72S_2$, and a floor 72F; trench 74 has sidewalls $74S_1$ and $74S_2$, and a floor 74F; and trench 76 has sidewalls $76S_1$ and $76S_2$, and a floor 76F. Although trenches 26, 70, 72, 74, and 76 are shown with vertical sidewalls, horizontal bottoms, and sharp corners, one of ordinary skill in the art will appreciate that the sidewalls of trenches 26, 70, 72, 74, and 76 may be sloped and their floors may be rounded.

It should be noted that the portion of epitaxial layer 60 between trenches 70 and 72 may be referred to as a mesa structure 71, the portion of epitaxial layer 60 between trenches 72 and 74 may be referred to as a mesa structure 73, and the portion of epitaxial layer 60 between trenches 74 and 76 may be referred to as a mesa structure 75. The portion of epitaxial layer 60 adjacent side $76S_2$ of trench 76 may be referred to as mesa structure 77 and the portion of epitaxial layer 60 adjacent side $70S_1$ may be referred to as mesa structure 79. Mesa structure 71 has a width $D_1$, mesa structure 73 has a width $D_2$, and mesa structure 75 has a width $D_3$. Width $D_3$ is greater than widths $D_1$ and $D_2$. In accordance with an embodiment, width $D_1$ equals width $D_2$.

Figure 4A:
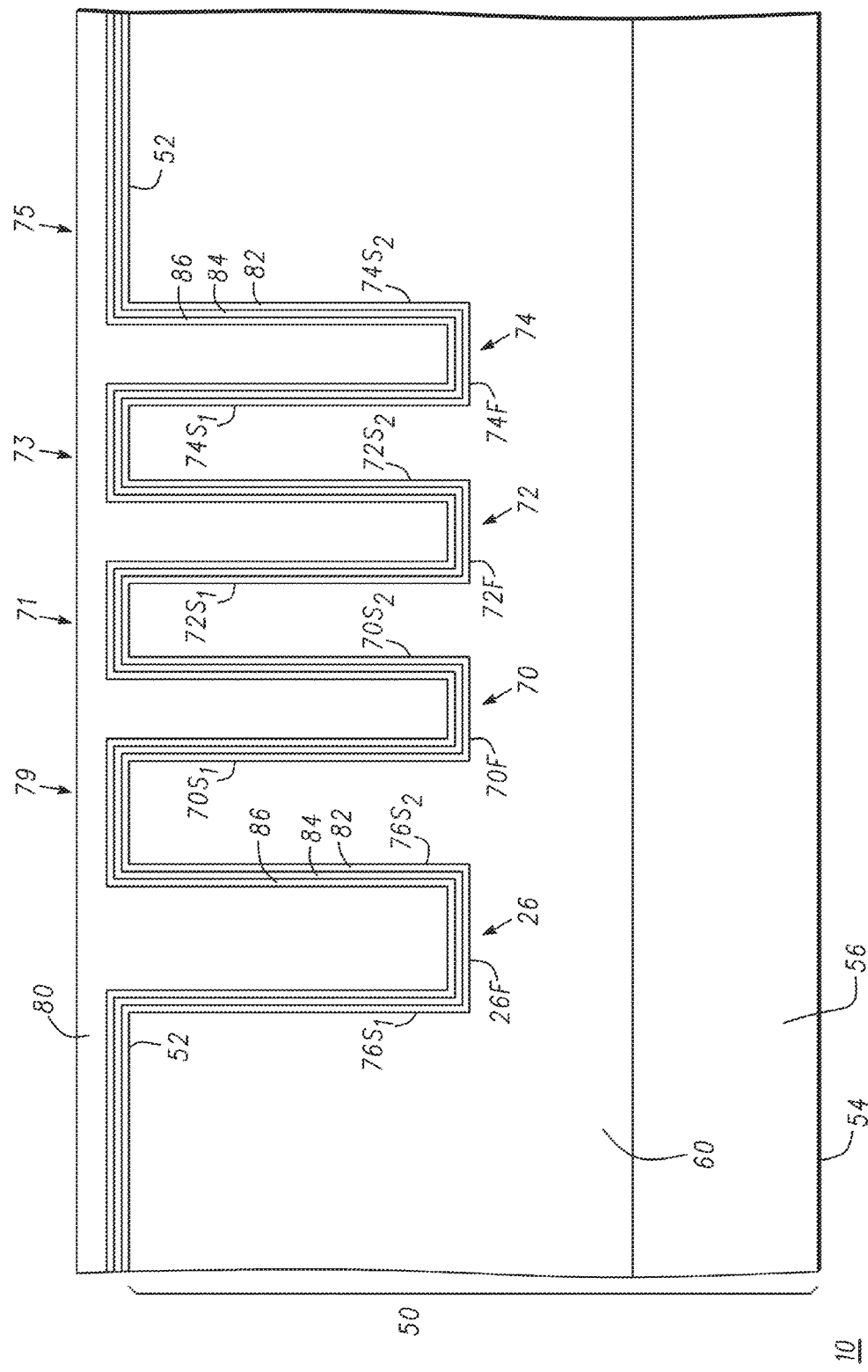
FIG. 4A and FIG. 4B are cross-sectional views of the semiconductor component of FIG. 1 at a later stage of manufacture than that of the cross-sectional views of FIG. 3A and FIG. 3B, respectively, in accordance with an embodiment of the present invention.
Figure 4B:
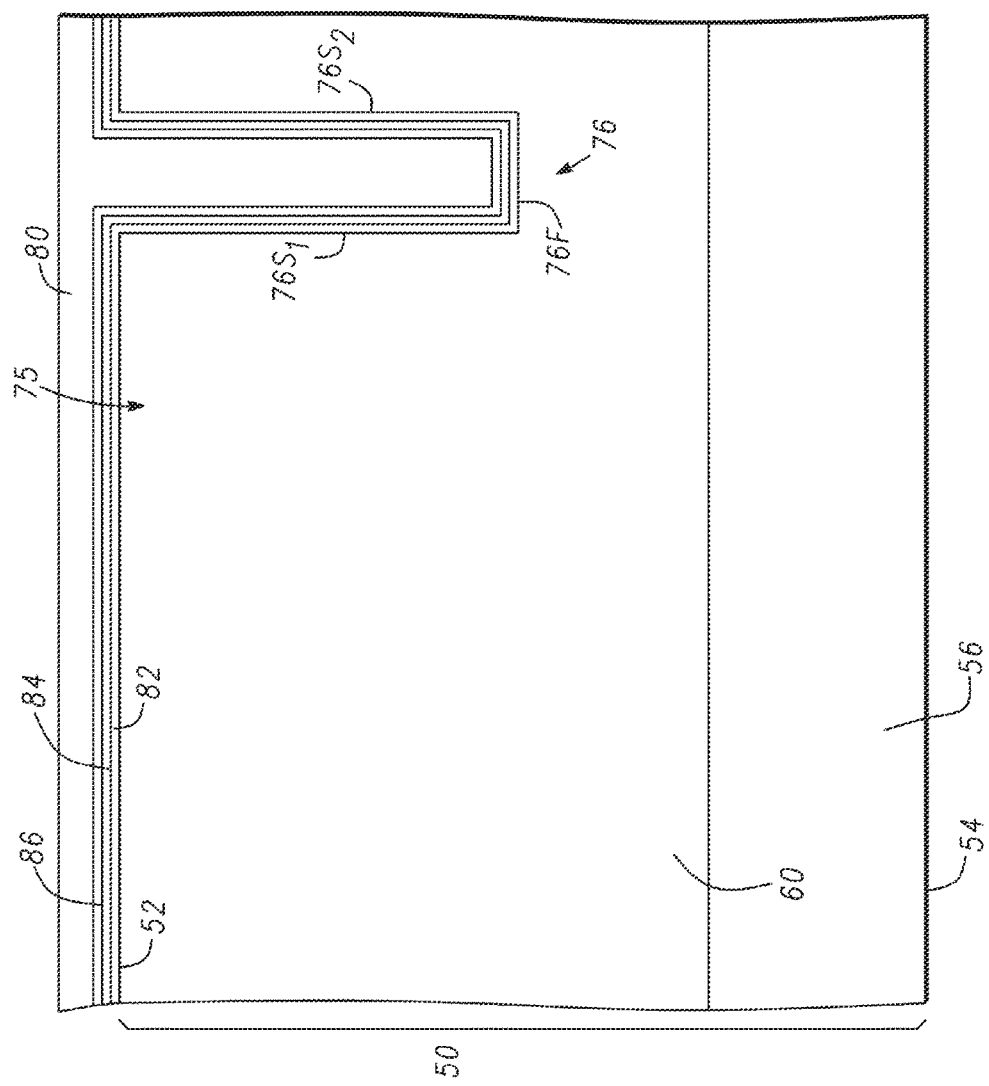

Referring now to FIGS. 4A and 4B, a cross-sectional view of the manufacture of semiconductor component 10 at a later stage of manufacture than that of the cross-sectional view of FIGS. 3A and 3B is illustrated. It should be noted that FIGS. 4A and 4B are described together because they represent the region taken along section line 1A-1A of FIG. 1 and occur at the same time in the manufacture of semiconductor component 10 as each other. Collectively, FIGS. 4A and 4B may be referred to as FIG. 4. FIG. 4 is shown as two figures to expand FIG. 4 and better show the features of semiconductor component 10. More particularly, FIGS. 4A and 4B illustrate that a layer of material 82 is formed on the sidewalls, ends, and floors of trenches 26, 70, 72, 74, and 76 and on surface 52 of semiconductor material 50. The portions of layer 82 in trenches 70, 72, 74, and 76 serve as a gate layer or a gate dielectric film. Suitable materials for gate layer 82 include silicon dioxide, nitride, tantalum pentoxide, titanium dioxide, barium strontium titanate, high k dielectric materials, combinations thereof or equivalent materials known to one of ordinary skill in the art. By way of example, gate layer 82 is silicon dioxide having a thickness ranging from about 0.01 μm to about 0.05 μm. In accordance with an embodiment, gate layer 82 is formed at an early stage of the process which helps maintain the integrity of the interface between gate layer 82 and semiconductor layer 60 and also provides a more uniform film thickness for gate layer 82.

Still referring to FIGS. 4A and 4B, a layer of material 84 is formed adjacent to gate layer 82. Layer 84 can be comprised of a material that is different from that of gate layer 82. In accordance with an embodiment layer 84 is silicon nitride when gate layer 82 is silicon dioxide. By way of example, layer 84 is formed using a low pressure chemical vapor deposition (LPCVD) technique and has a thickness ranging from about 0.01 μm to about 0.05 μm.

A layer of dielectric material 86 is formed adjacent to or on layer 84. In accordance with an embodiment, dielectric layer 86 is an oxide formed using an LPCVD technique with a tetraethyl-orthosilicate (TEOS) source material. Alternatively, dielectric layer 86 can be formed using LPCVD with a high temperature oxide (HTO) process (LPCVD/HTO), which can form a more dense deposited oxide compared to LPCVD oxides formed using TEOS source materials. By way of example, a silane source material can be used with an oxidizing reactant, such as nitrous oxide ($N_2O$) for the LPCVD/HTO process. In accordance with an example, dielectric layer 86 has a thickness ranging from about 0.04 μm to about 0.25 μm. It should be noted that the breakdown voltage for semiconductor component 10 can be adjusted by selecting the thickness of layer 86. For example, semiconductor component 10 may be manufactured to have a breakdown voltage BVDSS of about 60 volts by fabricating dielectric layer 86 to have a thickness ranging from about 0.2 μm to about 0.25 μm.

A layer of electrically conductive material 80 is formed on dielectric layer 86 and in trenches 26, 70, 72, 74, and 76. Electrically conductive layer 80 can be a metal or a doped crystalline semiconductor layer. By way of example, electrically conductive layer 80 is polysilicon doped with an N-type dopant such as, for example, phosphorus or arsenic. After doping, the polysilicon may be annealed in an inert ambient or oxidizing agent.

Figure 5A:
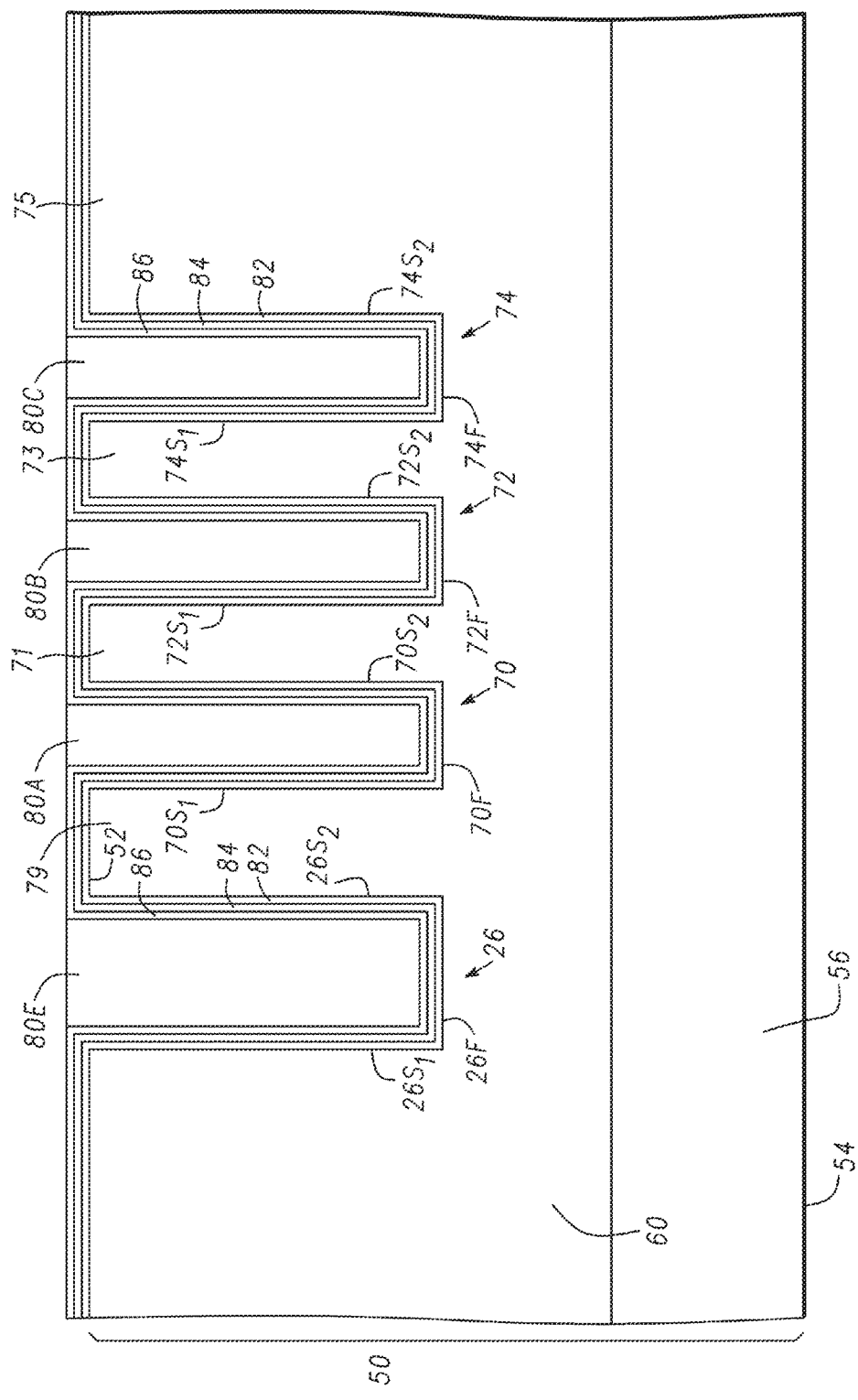
FIG. 5A and FIG. 5B are cross-sectional views of the semiconductor component of FIG. 1 at a later stage of manufacture than that of the cross-sectional views of FIG. 4A and FIG. 4B, respectively, in accordance with an embodiment of the present invention.
Figure 5B:
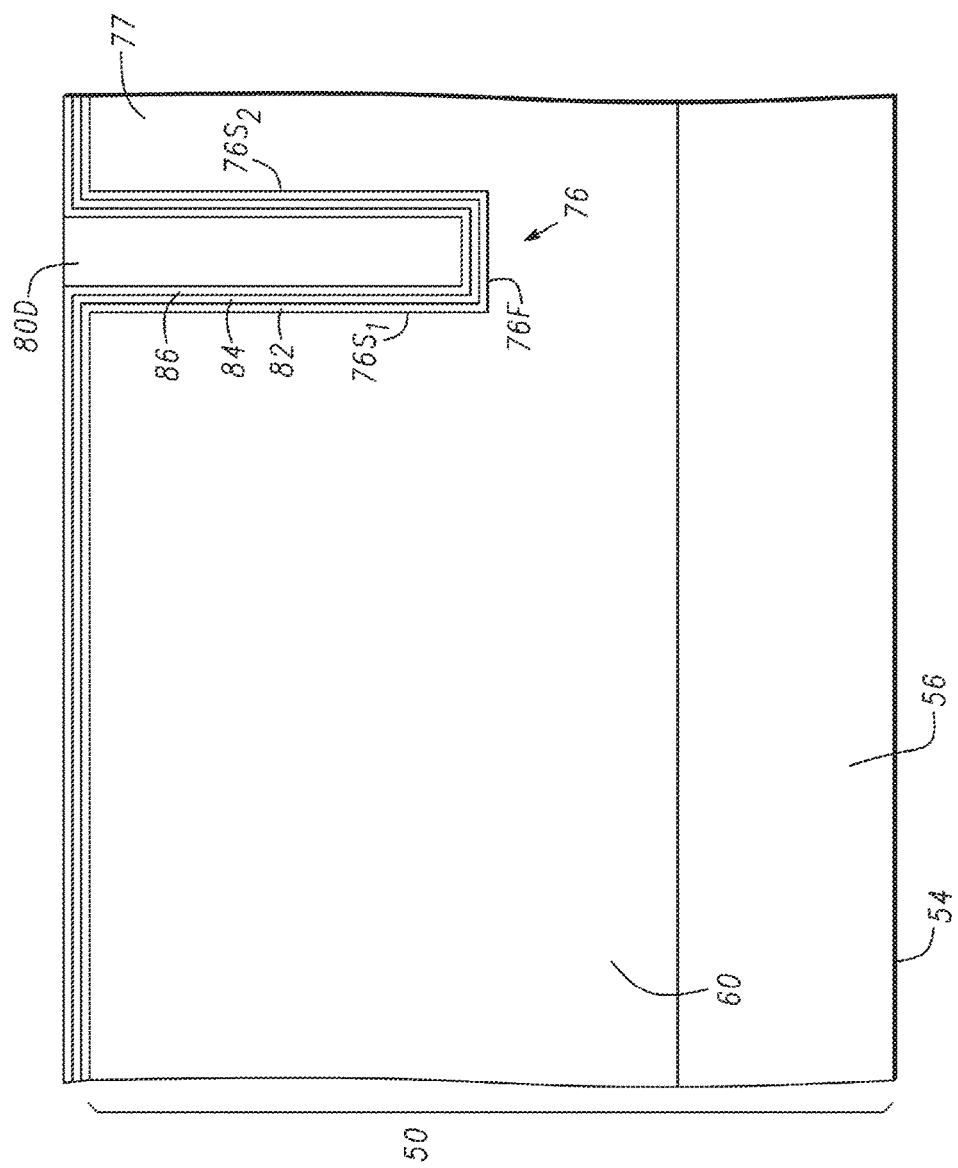

Referring now to FIGS. 5A and 5B, a cross-sectional view of the manufacture of semiconductor component 10 at a later stage of manufacture than the cross-sectional view of FIGS. 4A and 4B is illustrated. It should be noted that FIGS. 5A and 5B are described together because they represent the region taken along section line 1A-1A of FIG. 1 and occur at the same time in the manufacture of semiconductor component 10 as each other. Collectively, FIGS. 5A and 5B may be referred to as FIG. 5. FIG. 5 is shown as two figures to expand FIG. 5 and better show the features of semiconductor component 10. Electrically conductive layer 80 is planarized using, for example, a chemical mechanical planarization (CMP) technique leaving portions 80A, 80B, 80C, 80D, and 80E in trenches 70, 72, 74, 76, and 26, respectively.

Figure 6A:
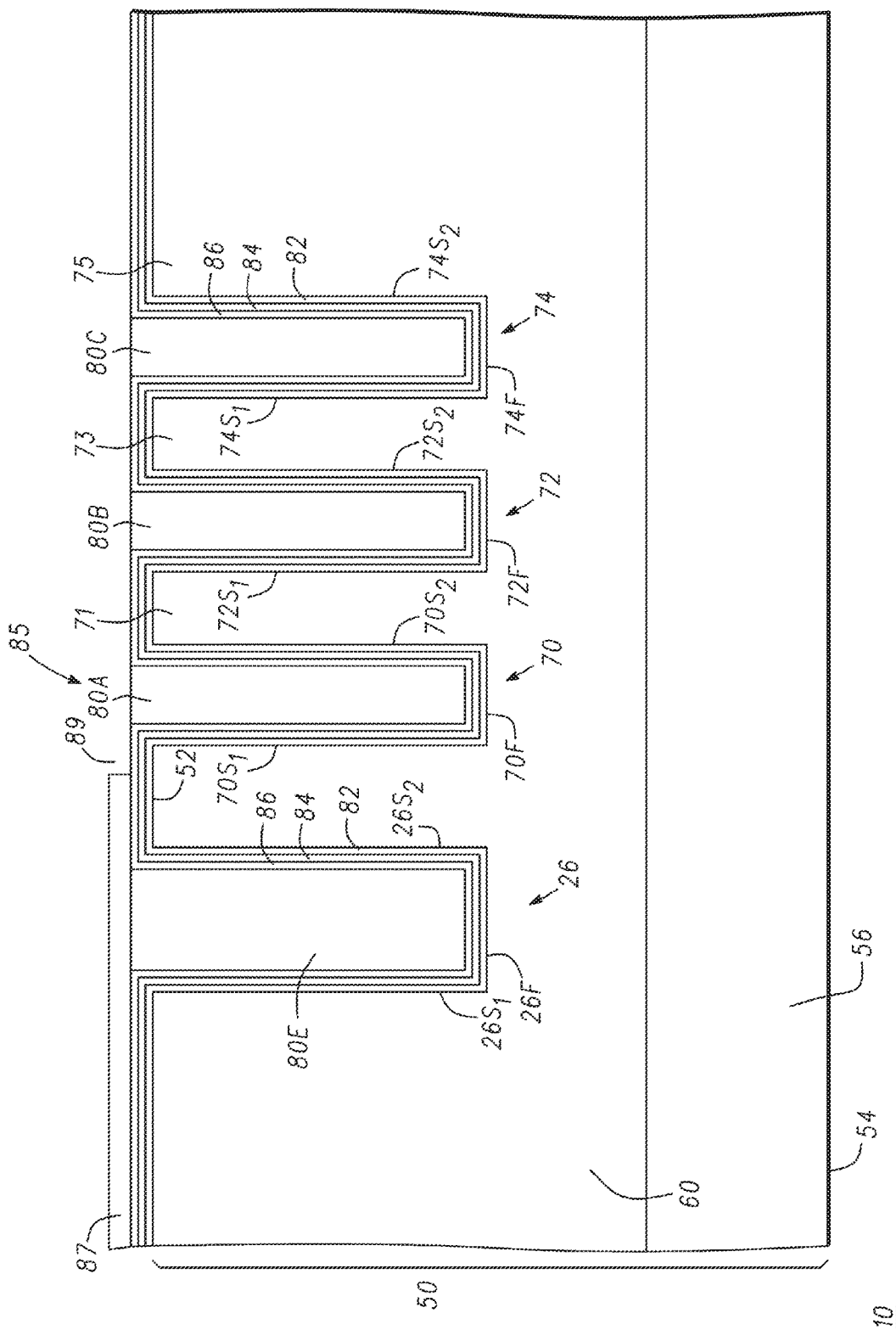
FIG. 6A and FIG. 6B are cross-sectional views of the semiconductor component of FIG. 1 at a later stage of manufacture than that of the cross-sectional views of FIG. 5A and FIG. 5B, respectively, in accordance with an embodiment of the present invention.
Figure 6B:
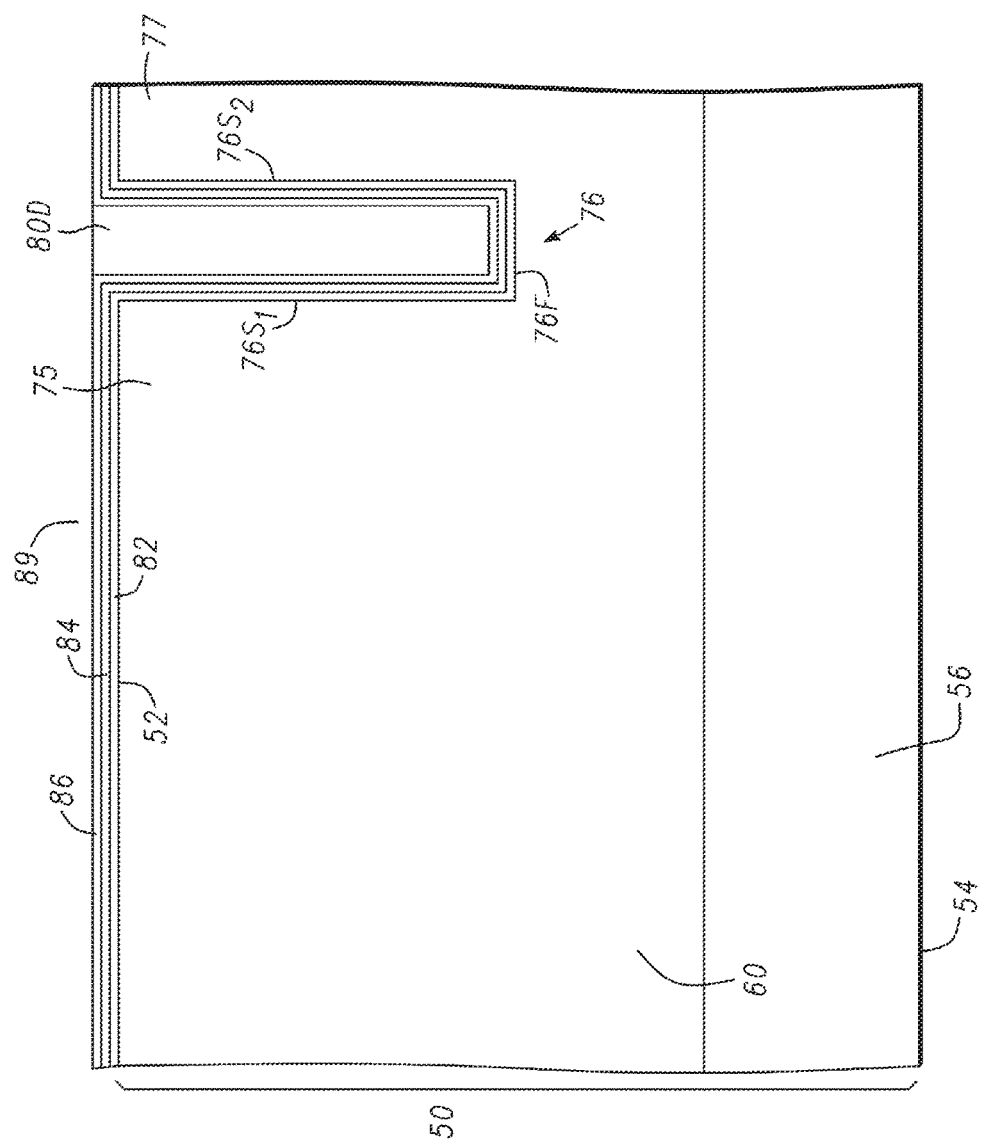

Referring now to FIGS. 6A and 6B, a cross-sectional view of the manufacture of semiconductor component 10 at a later stage of manufacture than that of the cross-sectional view of FIGS. 5A and 5B is illustrated. It should be noted that FIGS. 6A and 6B are described together because they represent the region taken along section line 1A-1A of FIG. 1 and occur at the same time in the manufacture of semiconductor component 10 as each other. Collectively, FIGS. 6A and 6B may be referred to as FIG. 6. FIG. 6 is shown as two figures to expand FIG. 6 and better show the features of semiconductor component 10. A layer of photoresist is patterned over the exposed portions of dielectric layer 86 and polysilicon portions 80A, 80B, 80C, 80D, and 80E to form a masking structure 85 having a masking element 87 and an opening 89 that exposes polysilicon portions 80A, 80B, 80C, and 80D in trenches 70, 72, 74, and 76, respectively. It should be noted that masking element 87 protects polysilicon portion 80E from being etched at a subsequent processing step and that a shield electrode will be fabricated from a portion of polysilicon portion 80E.

Figure 7A:
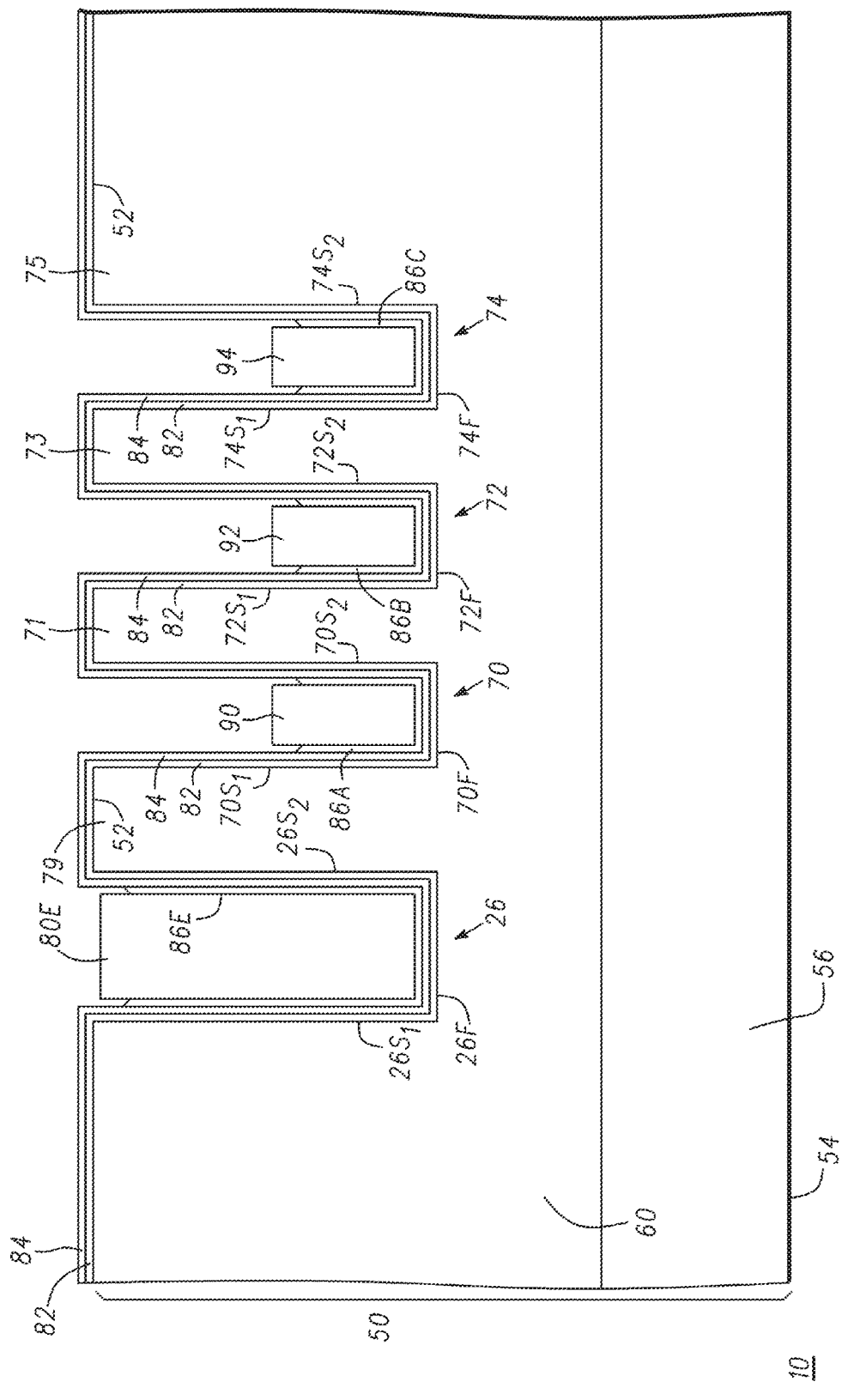
FIG. 7A and FIG. 7B are cross-sectional views of the semiconductor component of FIG. 1 at a later stage of manufacture than that of the cross-sectional views of FIG. 6A and FIG. 6B, respectively, in accordance with an embodiment of the present invention.
Figure 7B:
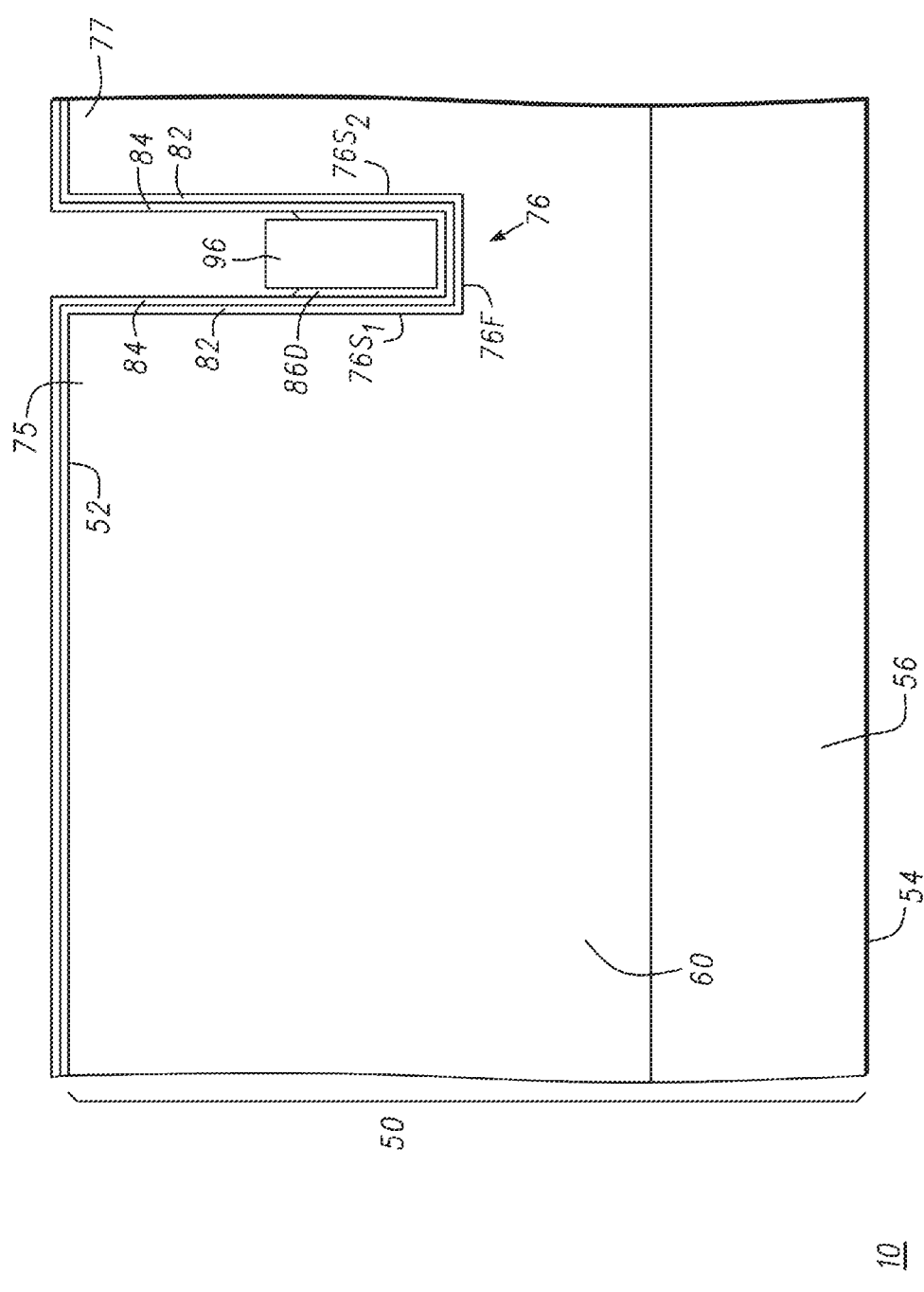

Referring now to FIGS. 7A and 7B, a cross-sectional view of the manufacture of semiconductor component 10 at a later stage of manufacture than that of the cross-sectional view of FIGS. 6A and 6B is illustrated. It should be noted that FIGS. 7A and 7B are described together because they represent the region taken along section line 1A-1A of FIG. 1 and occur at the same time in the manufacture of semiconductor component 10 as each other. Collectively, FIGS. 7A and 7B may be referred to as FIG. 7. FIG. 7 is shown as two figures to expand FIG. 7 and better show the features of semiconductor component 10. Portions 80A, 80B, 80C, and 80D that are in trenches 70, 72, 74, and 76, respectively, and exposed by opening 89 are anisotropically etched using, for example, a Reactive Ion Etch (RIE) to form shield electrodes 90, 92, 94, and 96, in the lower or bottom portions of trenches 70, 72, 74, and 76, respectively. It should be noted that polysilicon portion 80E in trench 26 is protected by masking element 87 and serves as a shield electrode. Masking element 87 is removed using techniques known to those skilled in the art.

After removing masking element 87, portions of shield electrodes 90, 92, 94, 96, and 80E that are in trenches 70, 72, 74, 76, and 26, respectively, are anisotropically etched to slightly recess the top surface of shield electrode 80E below major surface 52. Next, portions of dielectric layer 86 that are adjacent portions 80E, the portions of dielectric layer 86 exposed by the formation of shield electrodes 90, 92, 94, and 96, and the portions of dielectric layer 86 on top of the portions of layer 84 that are over major surface 52 are removed leaving portion 86A between shield electrode 90 and the portion of dielectric layer 84 in trench 70; leaving portion 86B between shield electrode 92 and the portion of dielectric layer 84 in trench 72; leaving portion 86C between shield electrode 94 and the portion of dielectric layer 84 in trench 74; leaving portion 86D between shield electrode 96 and the portion of dielectric layer 84 in trench 76; and leaving portion 86E between shield electrode 80E and the portion of dielectric layer 84 in trench 26.

Figure 8A:
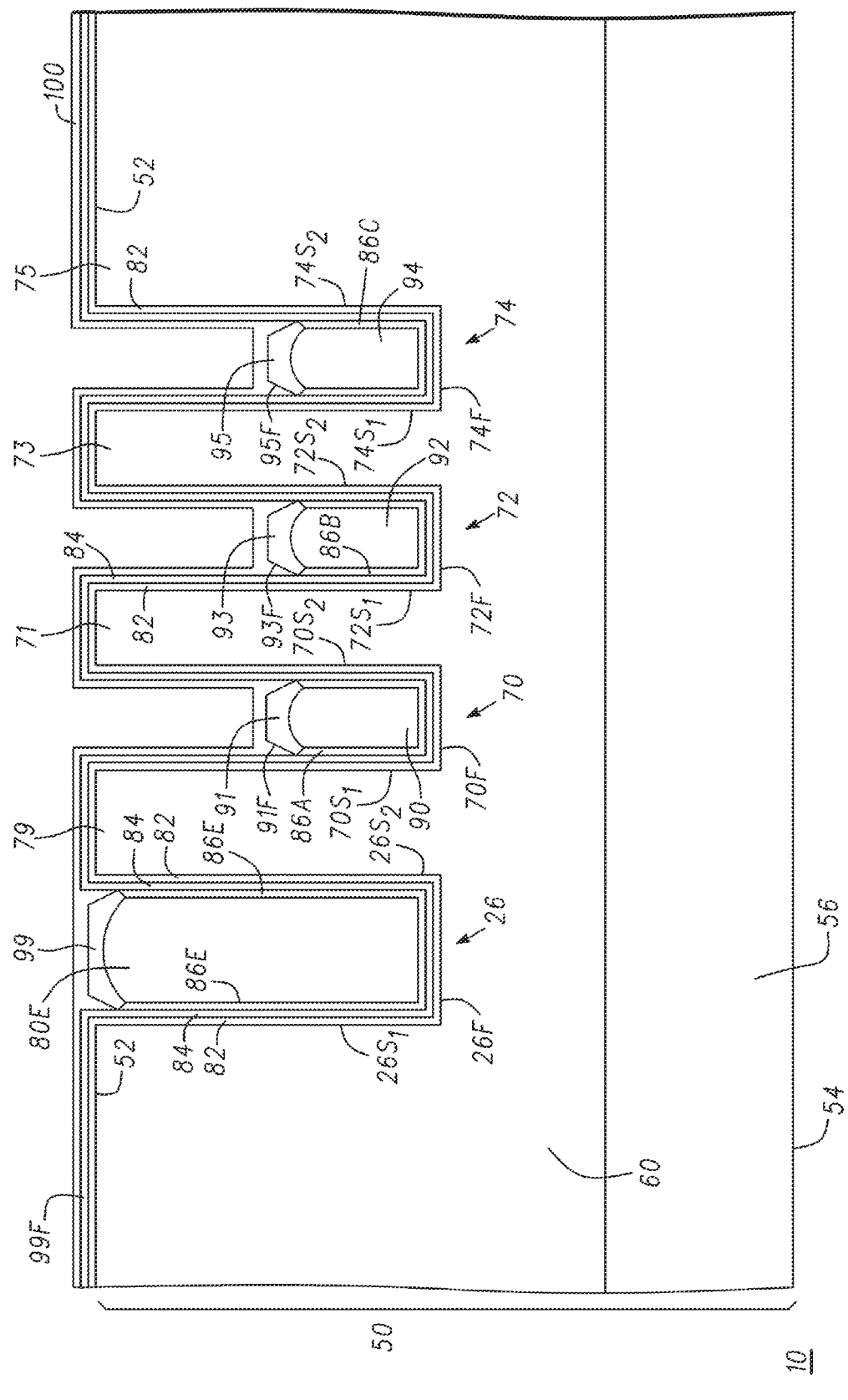
FIG. 8A and FIG. 8B are cross-sectional views of the semiconductor component of FIG. 1 at a later stage of manufacture than that of the cross-sectional views of FIG. 7A and FIG. 7B, respectively, in accordance with an embodiment of the present invention.
Figure 8B:
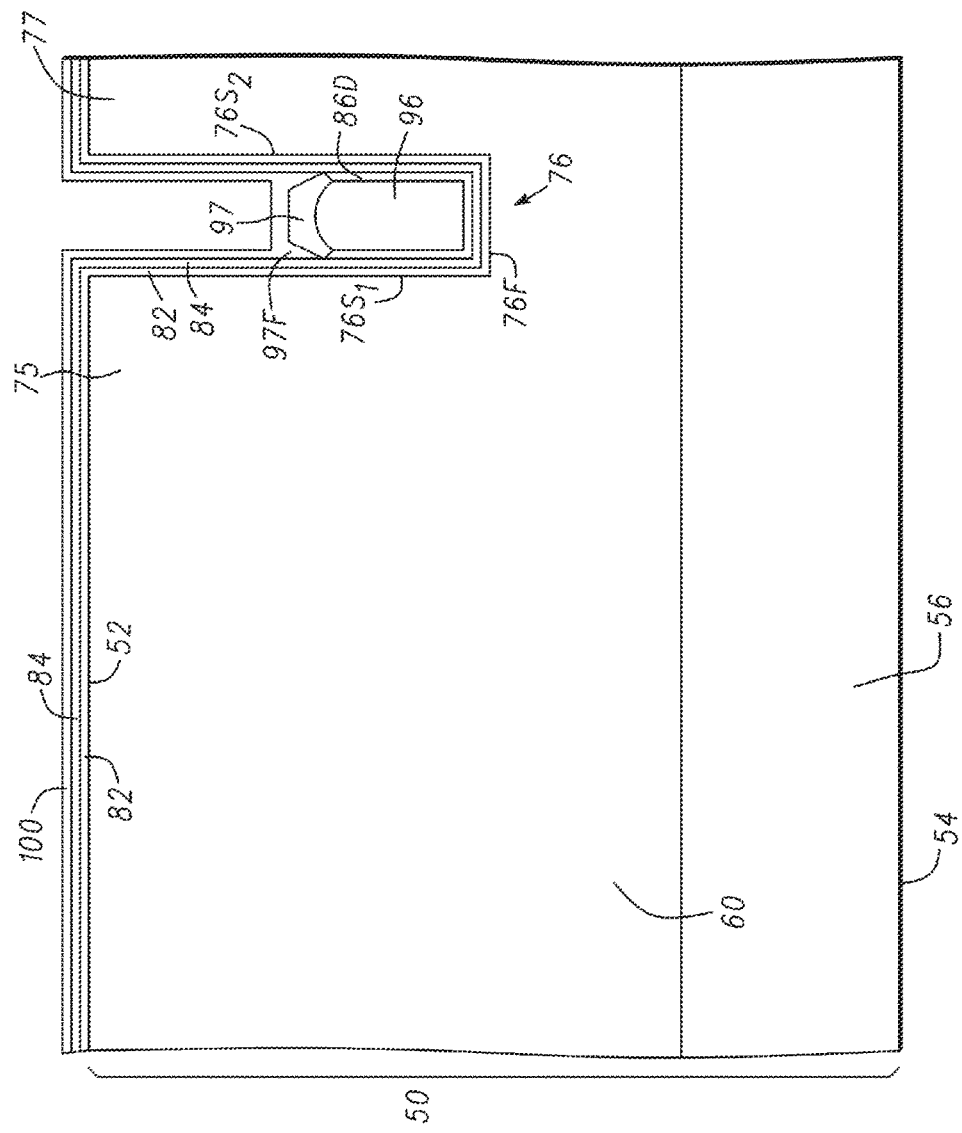

Referring now to FIGS. 8A and 8B, dielectric layers 91, 93, 95, 97, and 99 are formed overlying the upper surface of shield electrode 80E and shield electrodes 90, 92, 94, and 96, respectively. It should be noted that FIGS. 8A and 8B are described together because they represent the region taken along section line 1A-1A of FIG. 1 and occur at the same time in the manufacture of semiconductor component 10 as each other. Collectively, FIGS. 8A and 8B may be referred to as FIG. 8. FIG. 8 is shown as two figures to expand FIG. 8 and better show the features of semiconductor component 10. In accordance with an embodiment, dielectric layers 91, 93, 95, and 97 comprise silicon dioxide formed using thermal oxidation techniques. By way of example, dielectric layers 91, 93, 95, 97, and 99 are formed using a dry oxidation technique and have a thickness ranging from about 0.1 µm to about 0.3 µm.

It should be noted that during the formation of dielectric layers 91, 93, 95, 97, and 99, a recessed or "fanged" region 91F can be formed from dielectric layer 91; a fanged region 93F can be formed from dielectric layer 93; a fanged region 95F can be formed from dielectric layer 95; a fanged region 97F can be formed from dielectric layer 97; and a fanged region 99F can be formed from dielectric layer 99.

In an optional step, a dielectric layer 100 can be formed adjacent dielectric layer 84 and adjacent silicon dioxide layers 91, 93, 95, 97, and 99. In accordance with an embodiment, layer 100 is a deposited oxide layer formed having a thickness ranging from about 0.015 µm to about 0.15 µm. By way of example, dielectric layer 100 is formed using LPCVD techniques with a TEOS source material.

Figure 9A:
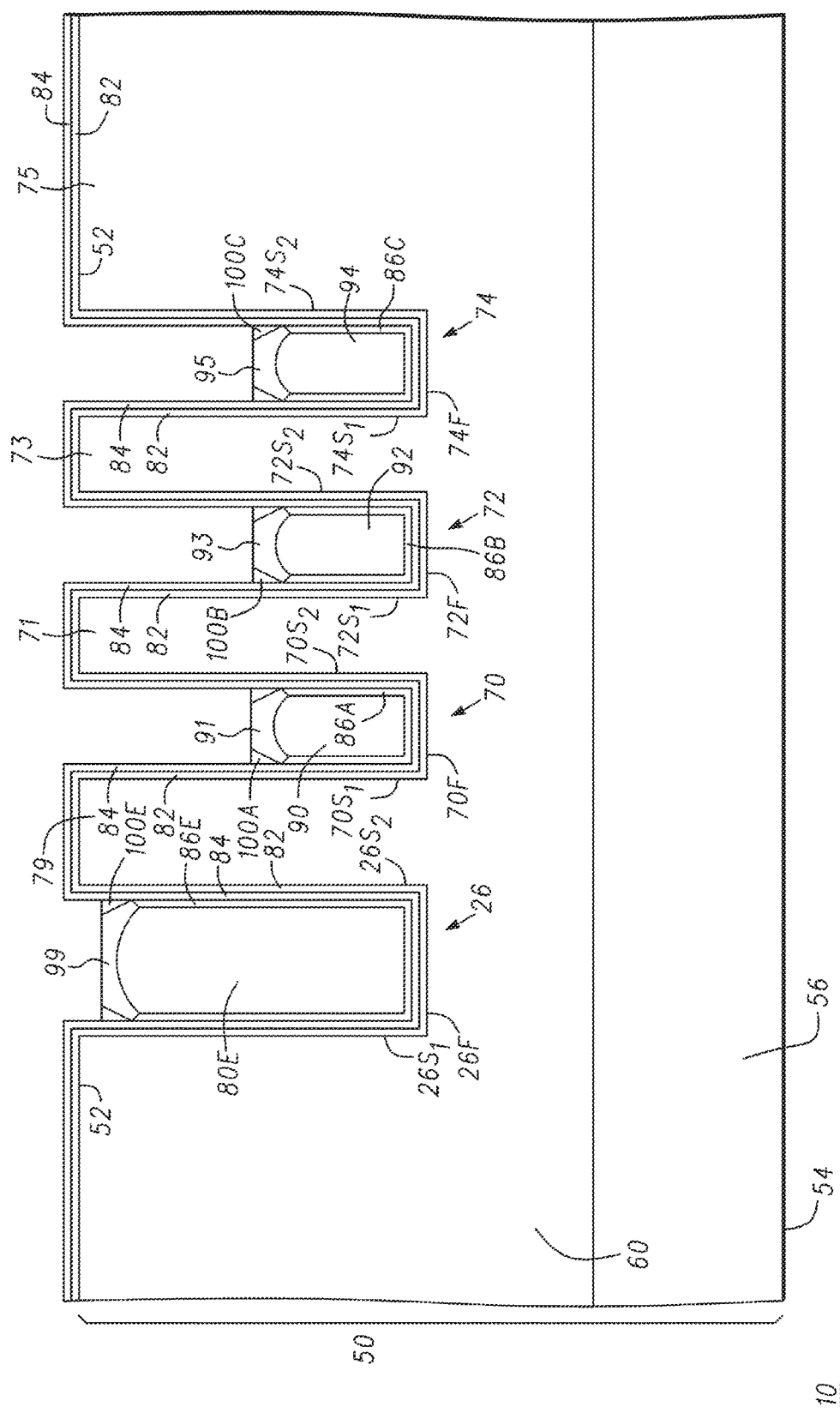

Referring now to FIGS. 9A and 9B, dielectric layer 100 is etched using, for example, a buffered hydrofluoric (HF) wet etch to form: dielectric fillers 100A between dielectric layer 91 and portions of dielectric layer 84 in trench 70; dielectric fillers 100B between dielectric layer 93 and portions of dielectric layer 84 in trench 72; dielectric fillers 100C between dielectric layer 95 and portions of dielectric layer 84 in trench 74; dielectric fillers 100D between dielectric layer 97 and portions of dielectric layer 84 in trench 76; and dielectric fillers 100E between dielectric layer 99 and portions of dielectric layer 84 in trench 26. A cleaning process such as, for example, an SC1 clean, can be used after the etch step. Alternatively, the formation of dielectric layer 100 can be skipped. It should be noted that FIGS. 9A and 9B are described together because they represent the region taken along section line 1A-1A of FIG. 1 and occur at the same time in the manufacture of semiconductor component 10 as each other. Collectively, FIGS. 9A and 9B may be referred to as FIG. 9. FIG. 9 is shown as two figures to expand FIG. 9 and better show the features of semiconductor component 10.

Figure 10A:
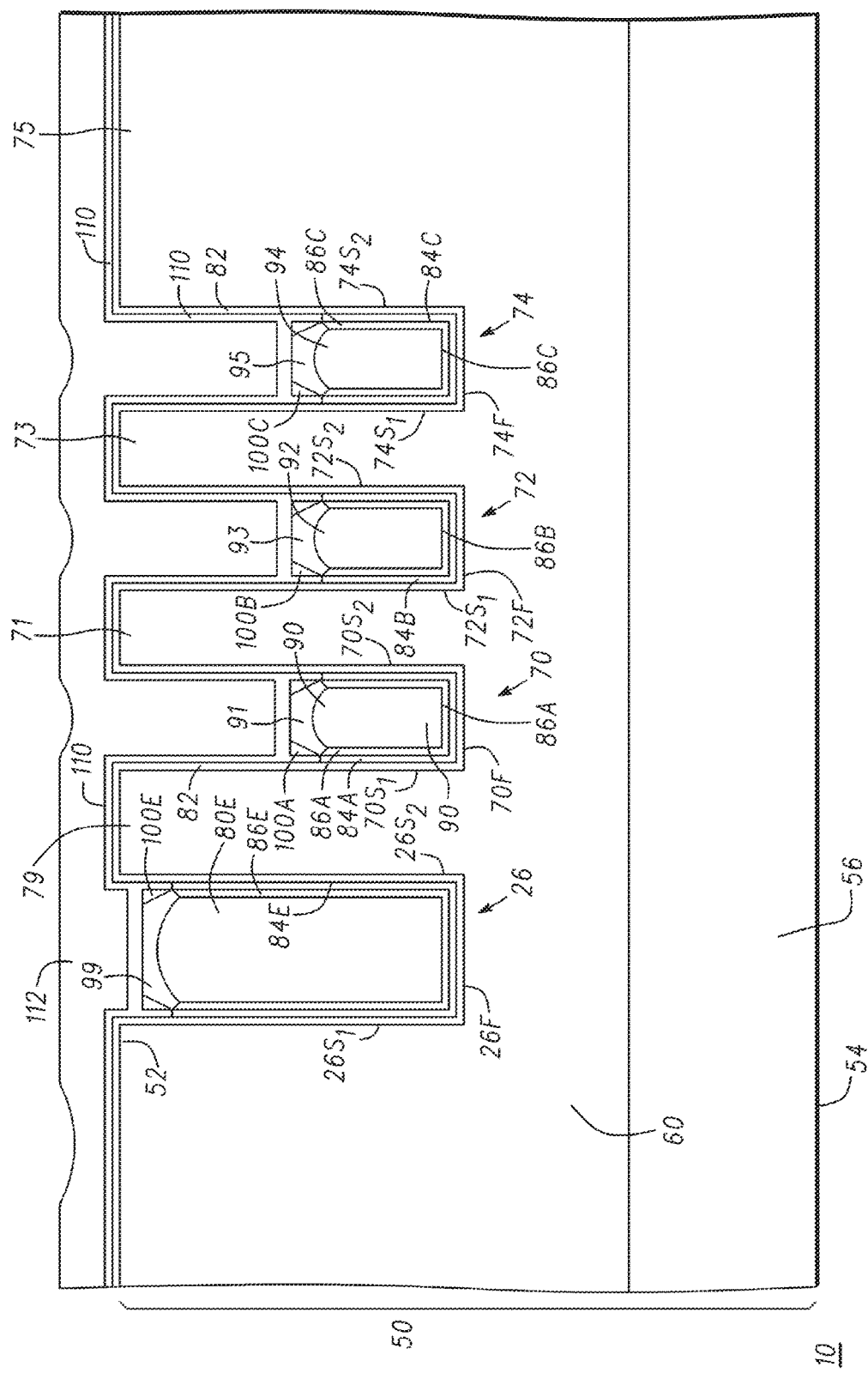
FIG. 10A and FIG. 10B are cross-sectional views of the semiconductor component of FIG. 1 at a later stage of manufacture than that of the cross-sectional views of FIG. 9A and FIG. 9B, respectively, in accordance with an embodiment of the present invention.
Figure 10B:
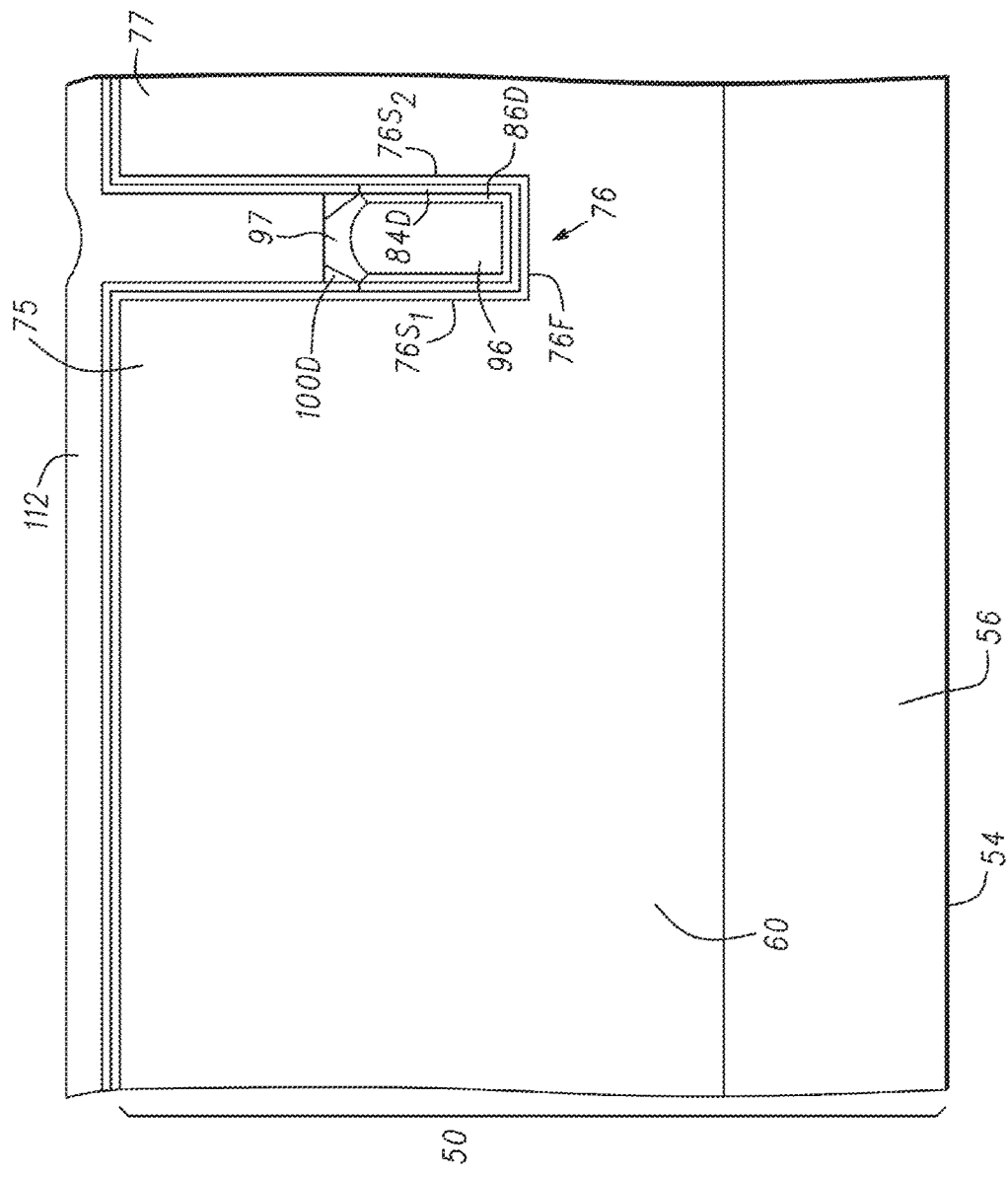

Referring now to FIGS. 10A and 10B, the exposed portions of dielectric layer 84 are removed and the portions of dielectric layer 84 in trenches 26, 70, 72, 74, and 76 are recessed, leaving portion 84E in trench 26, portion 84A in trench 70, portion 84B in trench 72, 84C in trench 74, and portion 84D in trench 76. In accordance with an embodiment in which layer 84 is silicon nitride, hot phosphoric acid can be used for the removal and recess step. Layer 84 can be recessed from about 0 µm to about 0.1 µm below dielectric layers 91, 93, 95, 97, and 99. Alternatively, layer 84 can be recessed from about 0.01 µm to about 0.05 µm below dielectric layers 91, 93, 95, 97, and 99. A cleaning process can be used after the etch step to, for example, clean the surface of gate layer 82. The cleaning step may be accomplished using an SC1/SC2 clean. It should be noted that FIGS. 10A and 10B are described together because they represent the region taken along section line 1A-1A of FIG. 1 and occur at the same time in the manufacture of semiconductor component 10 as each other. Collectively, FIGS. 10A and 10B may be referred to as FIG. 10. FIG. 10 is shown as two figures to expand FIG. 10 and better show the features of semiconductor component 10.

A layer 110 of dielectric material can be formed adjacent gate layer 82, on the exposed sub-portions of portions 84A, 84B, 84C, 84D, and 84E within the recessed portions of trenches 70, 72, 74, 76, and 26, respectively, and overlying dielectric layers 91, 93, 95, 97, and 99. In accordance with an embodiment, dielectric layer 110 can be configured to further isolate layers 84A, 84B, 84C, 84D, and 84E from other structures (for example gate electrode structures) within device 10. By way of example, dielectric layer 110 is a silicon dioxide layer formed using an LPCVD/HTO process with modified process conditions. In one embodiment dielectric layer 110 can have a thickness ranging from about 0.005 µm to about 0.05 µm. In an embodiment in which dielectric layer 100 is not used, dielectric layer 110 can have a thickness ranging from about 0.02 µm to about 0.05 µm. It should be noted that in this embodiment the gate dielectric structure includes gate layer 82 and dielectric layer 110.

In one embodiment, dielectric layer 110 can be formed as a conformal layer having a generally uniform thickness over the length of trenches 26, 70, 72, 74, and 76 including within recessed portions of dielectric layer 84.

Still referring to FIGS. 10A and 10B, an electrically conductive layer or a doped polycrystalline semiconductor layer 112 can be formed within portions of trenches 26, 70, 72, 74, and 76 and adjacent to dielectric layer 110. By way of example, the conductive layer is comprised of polysilicon. The conductive material may be doped with an N-type dopant such as, for example, phosphorus or arsenic.

Figure 11A:
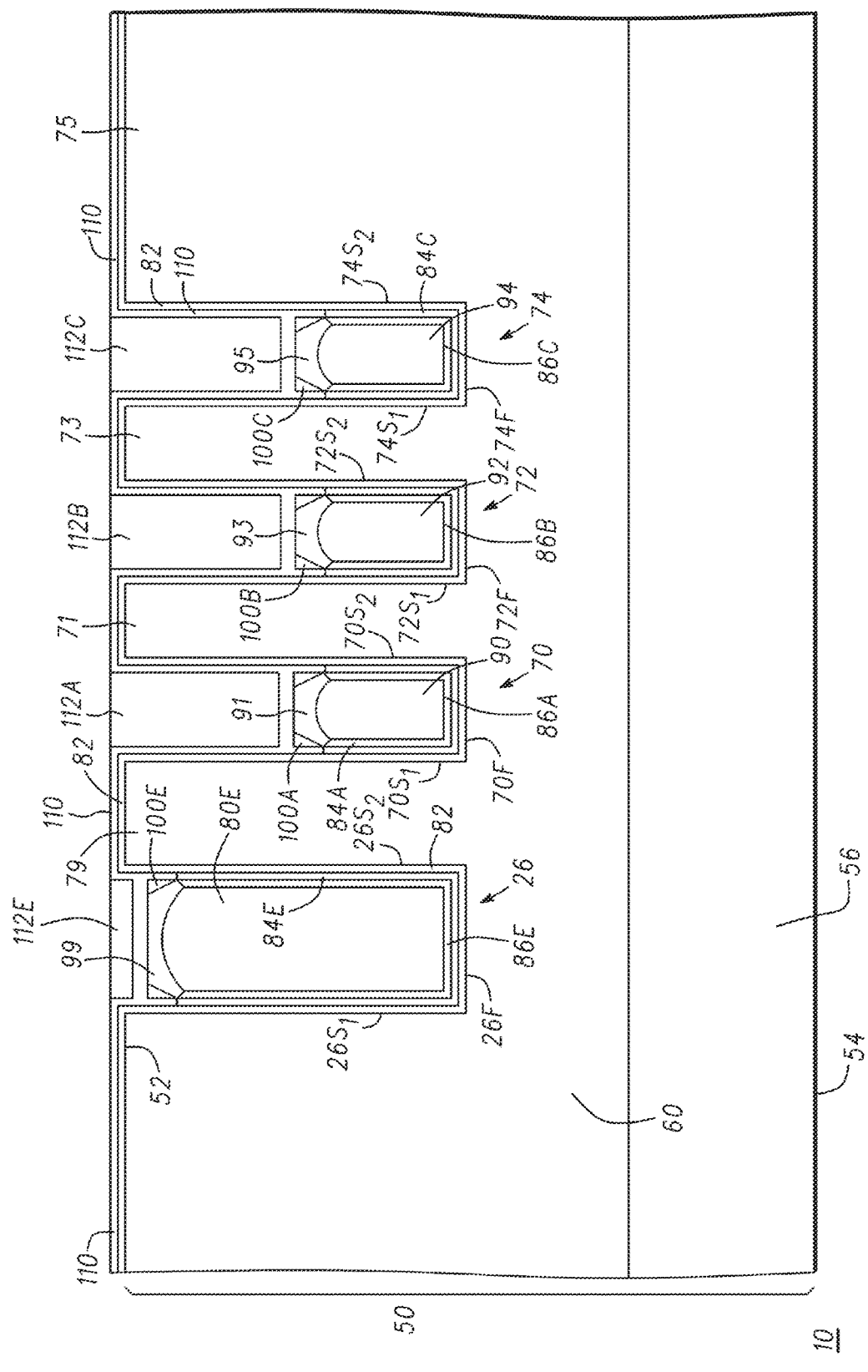
FIG. 11A and FIG. 11B are cross-sectional views of the semiconductor component of FIG. 1 at a later stage of manufacture than that of the cross-sectional views of FIG. 10A and FIG. 10B, respectively, in accordance with an embodiment of the present invention.
Figure 11B:
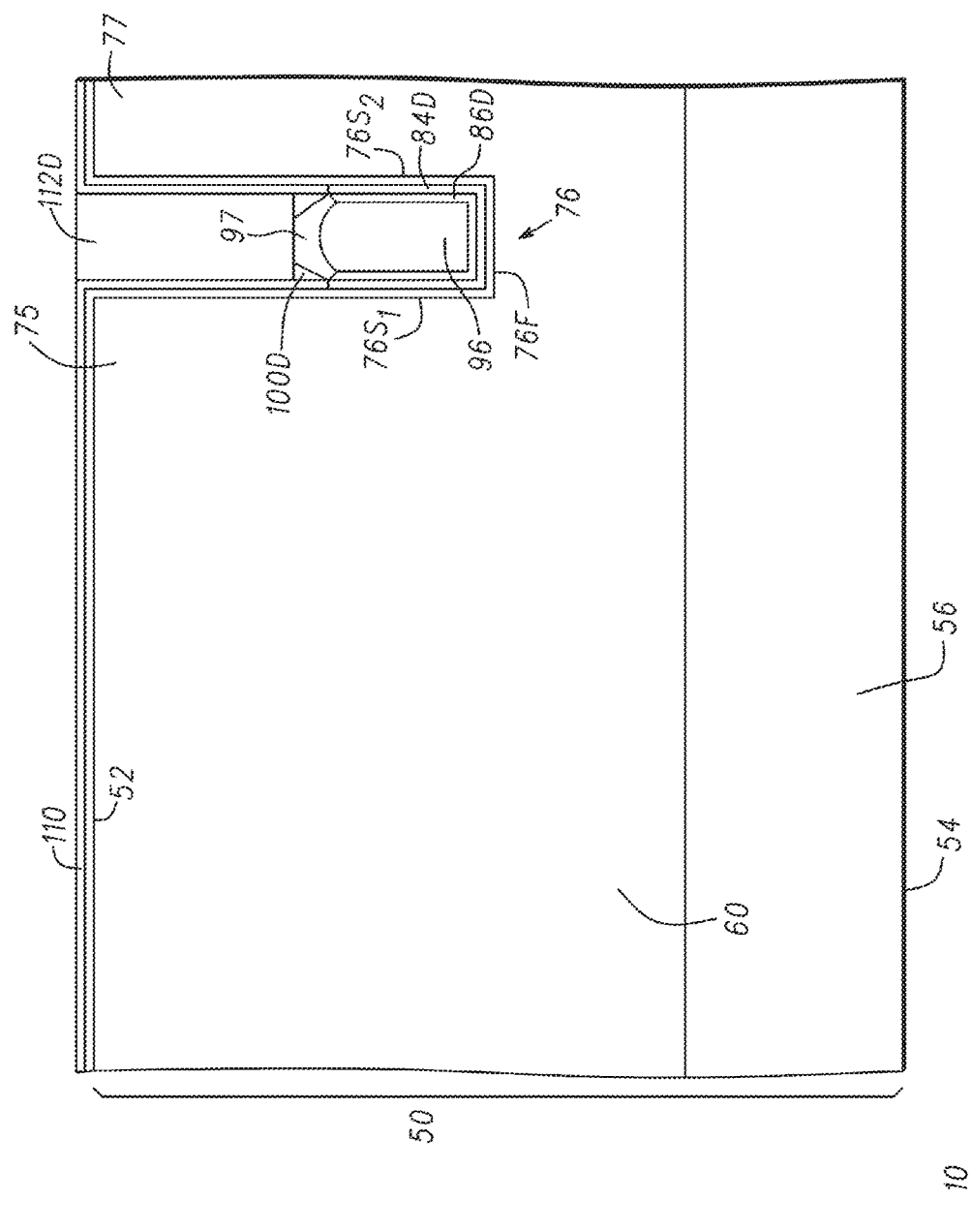

Referring now to FIGS. 11A and 11B, electrically conductive layer 112 is planarized using, for example, a CMP technique to create a gate electrode 112A in trench 70, a gate electrode 112B in trench 72, a gate electrode 112C in trench 74, and a gate electrode 112D in trench 76. It should be noted that gate electrodes 112A, 112B, 112C, and 112D are electrically isolated from shield electrodes 90, 92, 94, and 96 by dielectric layers 91, 93, 95, and 97, respectively. Gate electrodes 112A, 112B, 112C, and 112D may be referred to as gates. A portion 112E of conductive layer 112 remains in trench 26 after planarization of conductive layer 112. It should be further noted that FIGS. 11A and 11B are described together because they represent the region taken along section line 1A-1A of FIG. 1 and occur at the same time in the manufacture of semiconductor component 10 as each other. Collectively, FIGS. 11A and 11B may be referred to as FIG. 11. FIG. 11 is shown as two figures to expand FIG. 11 and better show the features of semiconductor component 10.

Figure 12A:
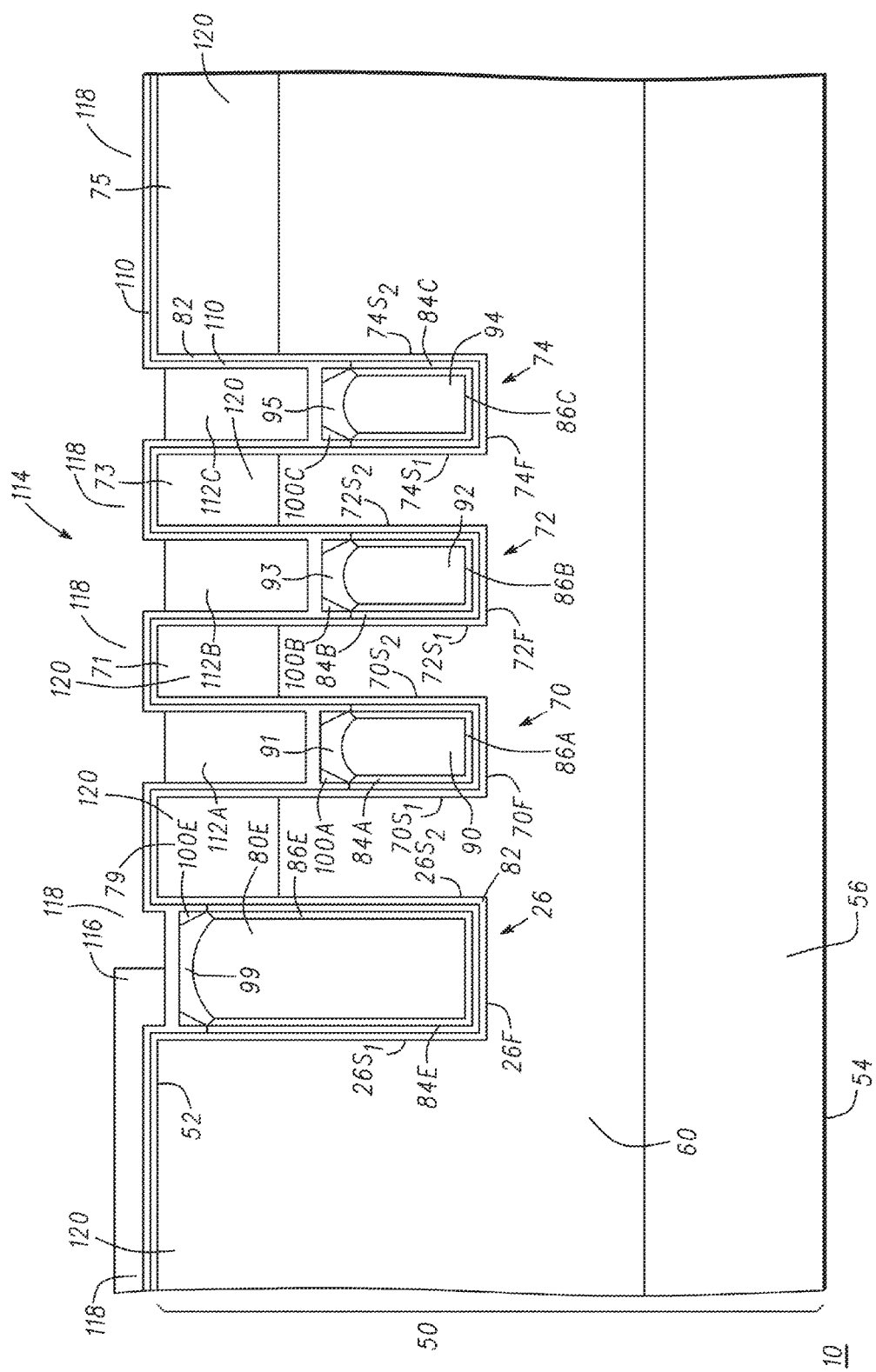
FIG. 12A and FIG. 12B are cross-sectional views of the semiconductor component of FIG. 1 at a later stage of manufacture than that of the cross-sectional views of FIG. 11A and FIG. 11B, respectively, in accordance with an embodiment of the present invention.
Figure 12B:
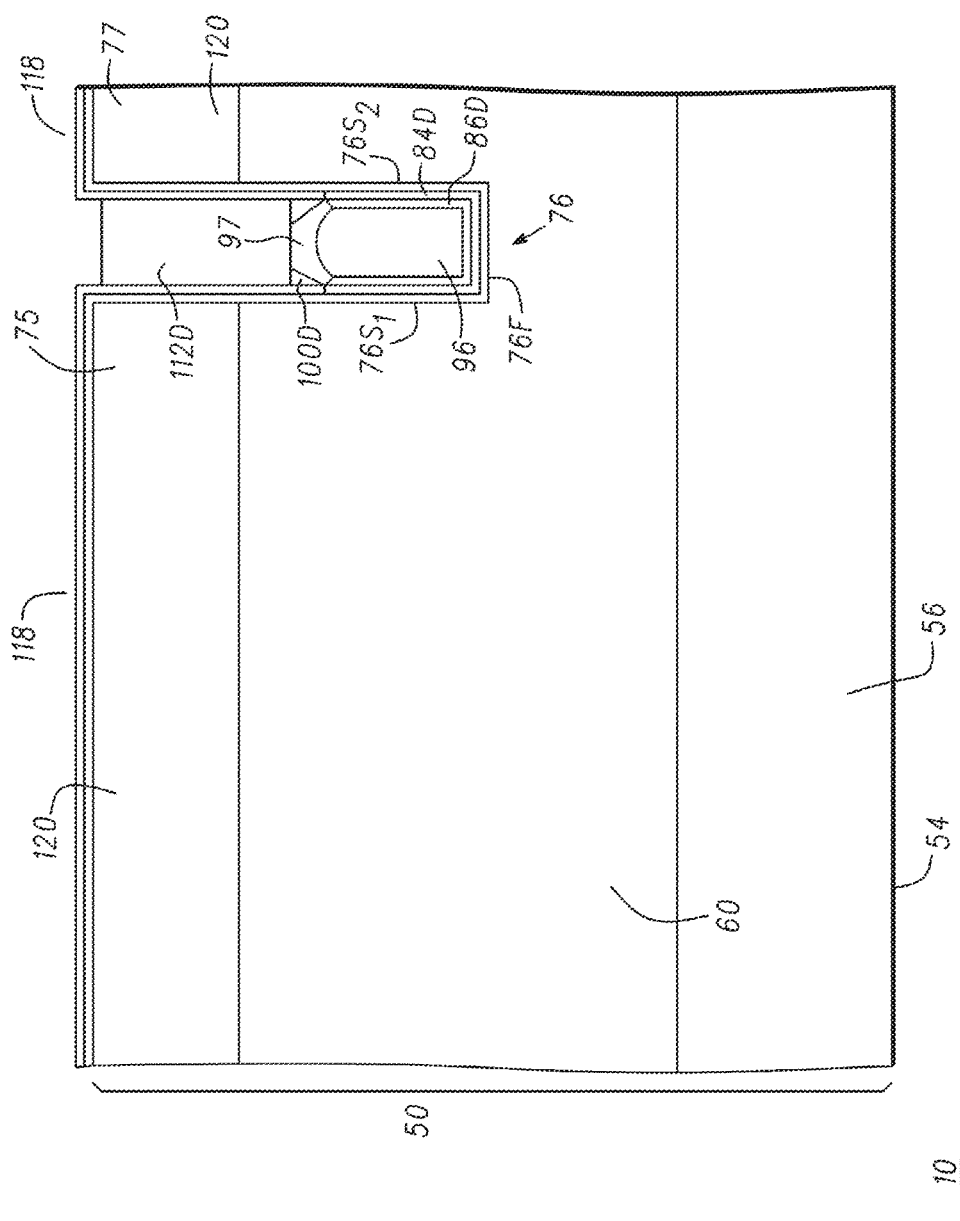

Referring now to FIGS. 12A and 12B, gate electrodes 112A, 112B, 112C, and 112D are recessed using, for example, a reactive ion etch. It should be further noted that FIGS. 12A and 12B are described together because they represent the region taken along section line 1A-1A of FIG. 1 and occur at the same time in the manufacture of semiconductor component 10 as each other. Collectively, FIGS. 12A and 12B may be referred to as FIG. 12. FIG. 12 is shown as two figures to expand FIG. 12 and better show the features of semiconductor component 10. In one embodiment, gate electrodes 112A, 112B, 112C, and 112D can be recessed below major surface 52 a distance from about 0.10 µm to about 0.25 µm. In addition, portion 112E of conductive layer 112 is recessed or, alternatively, removed, exposing dielectric layer 110 in trench 26. A layer of photoresist is patterned over dielectric layer 110 and gate electrodes 112A, 112B, 112C, and 112D to form a masking structure 114 having masking elements 116 and openings 118 that expose portions of dielectric layer 110. Body, base, or doped regions 120 are formed extending from portions of the major surface 52 into mesa structures 71, 73, 75, 77, and 79. Body regions 120 can have a conductivity type that is opposite to the conductivity type of epitaxial layer 60. Body regions 120 can extend from major surface 52 to a depth, for example, from about 0.5 µm to about 2 µm. The bottom of body regions 120 can be slightly above the bottom of gate electrodes 112A, 112B, 112C, and 112D. It is understood that body regions 120 can be formed at an earlier stage of fabrication, for example, before trenches 26, 70, 72, 74, and 76 are formed. Body regions 120 can be formed using doping techniques such as, ion implantation and anneal techniques. Masking structure 114 is removed. The body region 120 in mesa structures 71 and 73 provide a conductive channel for a field effect transistor.

Figure 13A:
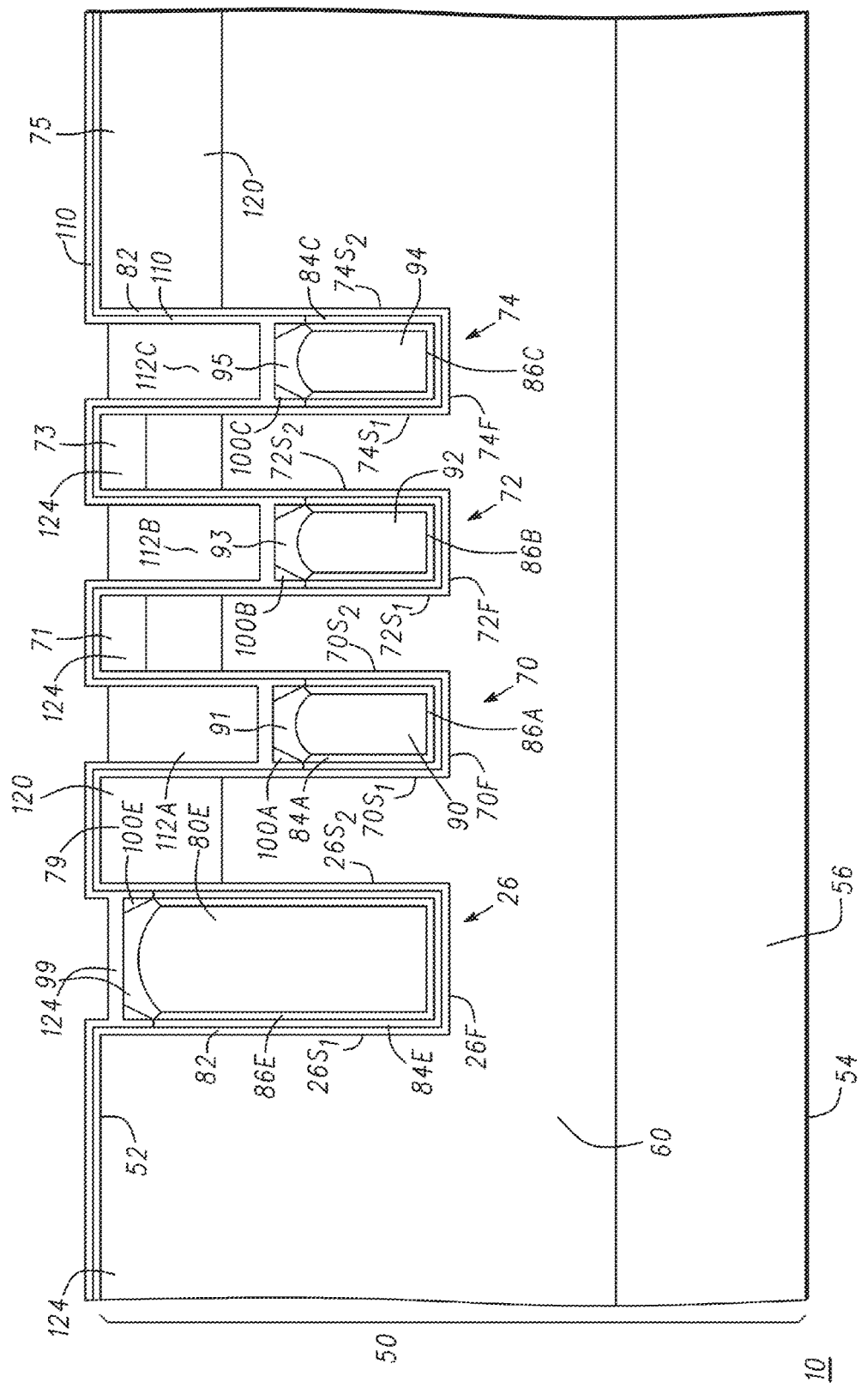
FIG. 13A and FIG. 13B are cross-sectional views of the semiconductor component of FIG. 1 at a later stage of manufacture than that of the cross-sectional views of FIG. 12A and FIG. 12B, respectively, in accordance with an embodiment of the present invention.
Figure 13B:
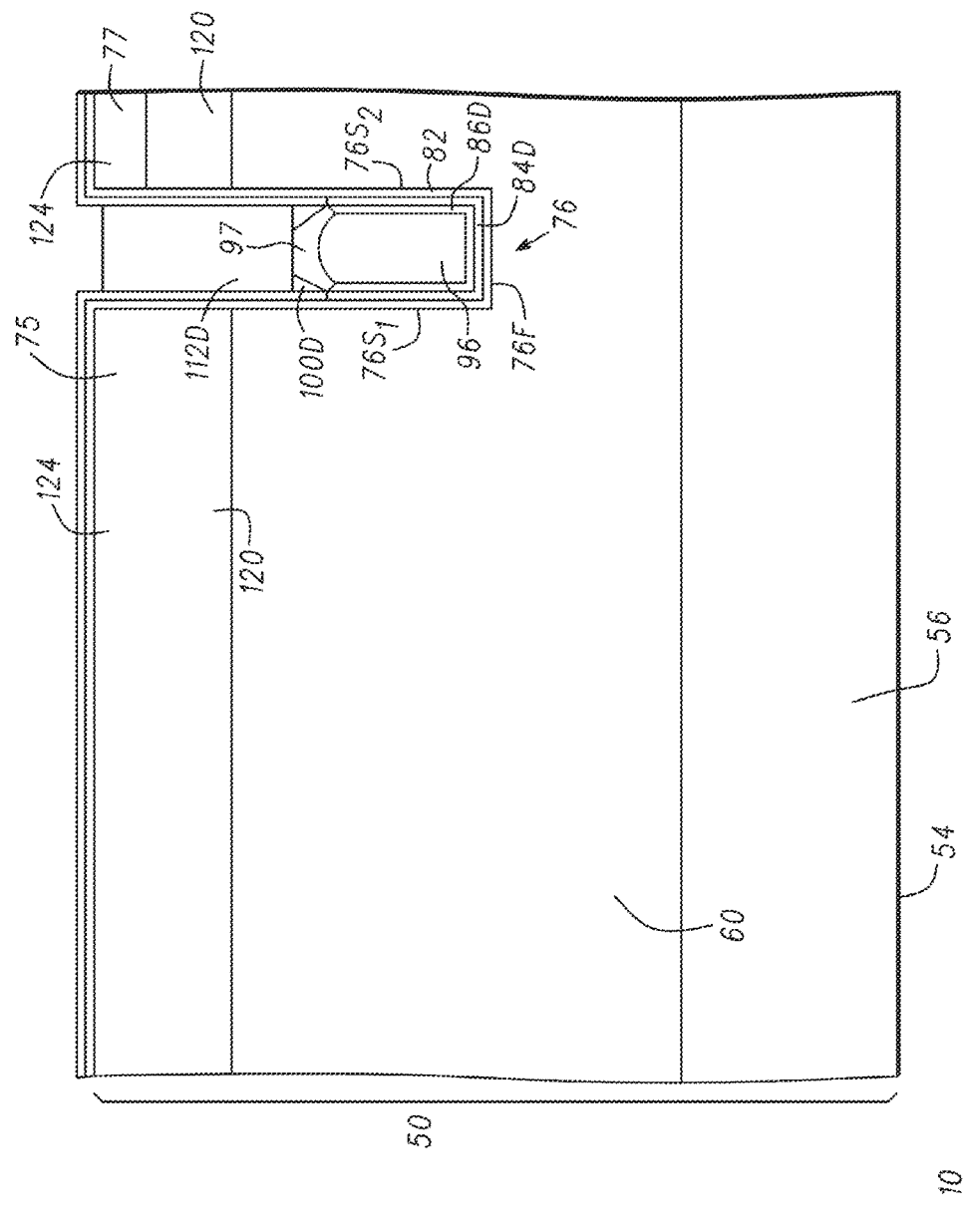

Referring now to FIGS. 13A and 13B, a masking layer (not shown) can be formed overlying portions of major surface 52. It should be further noted that FIGS. 13A and 13B are described together because they represent the region taken along section line 1A-1A of FIG. 1 and occur at the same time in the manufacture of semiconductor component 10 as each other. Collectively, FIGS. 13A and 13B may be referred to as FIG. 13. FIG. 13 is shown as two figures to expand FIG. 13 and better show the features of semiconductor component 10. In one embodiment, source regions, current conducting regions, or current carrying regions 124 can be formed within, in or overlaying body regions 120, and can extend from major surface 52 to a depth, for example, from about 0.1 µm to about 0.5 µm. In accordance with an embodiment, source regions 124 can have N-type conductivity and can be formed using, for example, a phosphorus or arsenic dopant source. In one embodiment, an ion implantation doping process can be used to form source regions 124 within body regions 120. The masking layer can then be removed and the implanted dopant can be annealed. It should be noted that body regions 120 may have a dopant concentration suitable for forming inversion layers that operate as conduction channels or channel regions 122 and that body region 120 separates source region 124 from semiconductor material 50 in at least mesa structure 73.

Figure 14A:
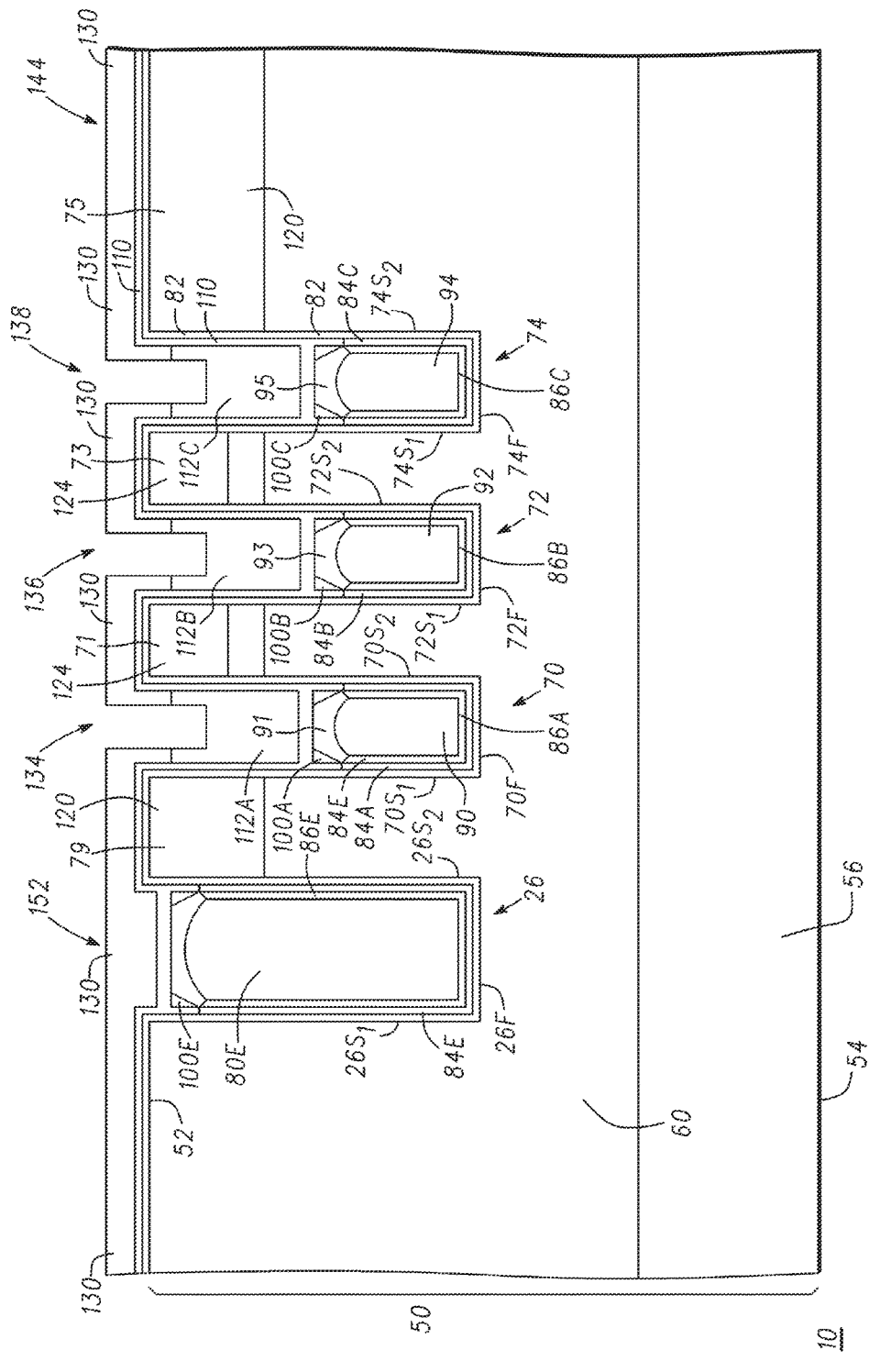
FIG. 14A and FIG. 14B are cross-sectional views of the semiconductor component of FIG. 1 taken along the area of section line 1B-1B of FIG. 1 at a later stage of manufacture than that of the cross-sectional views of FIG. 13A and FIG. 13B, respectively, in accordance with an embodiment of the present invention.
Figure 14B:
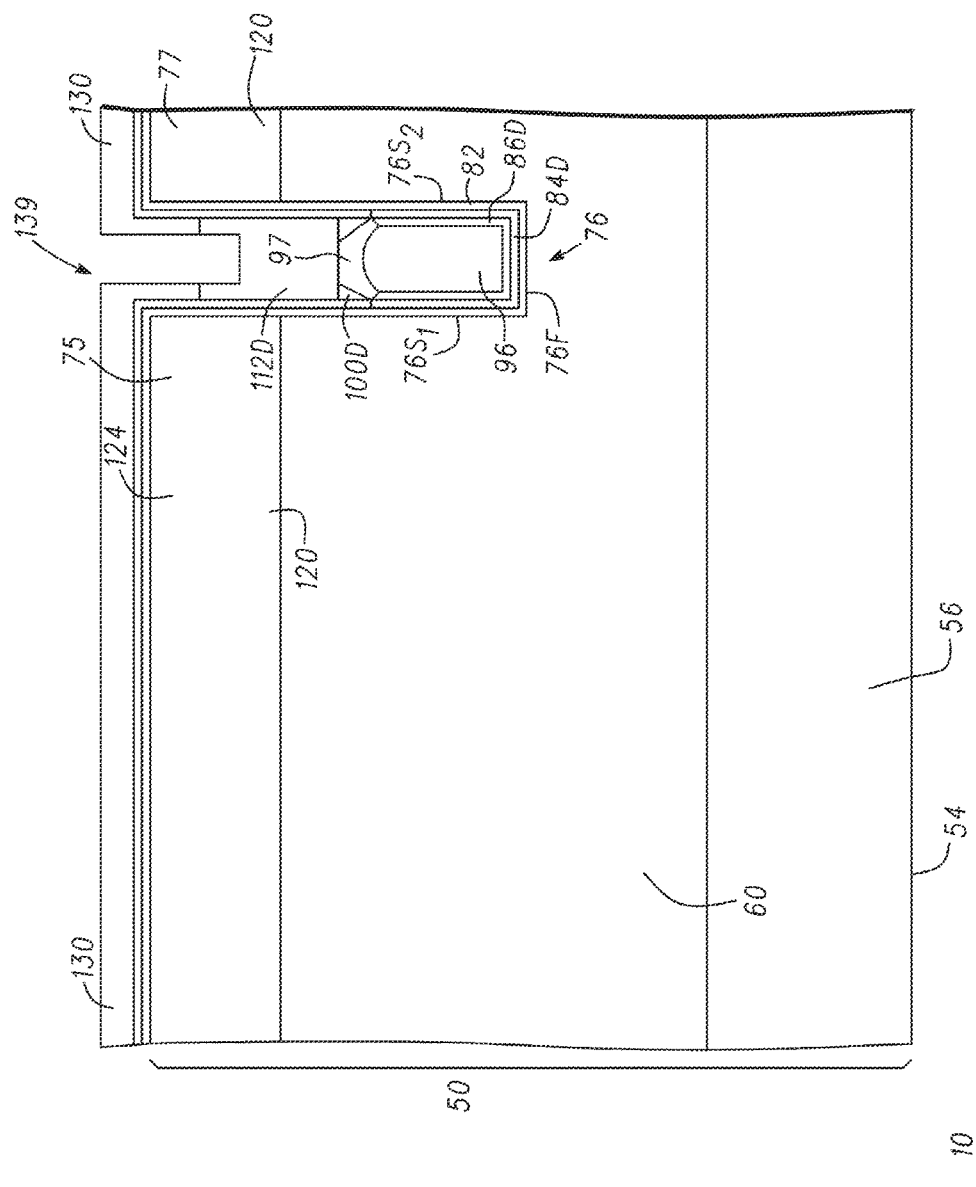
Figure 15A:
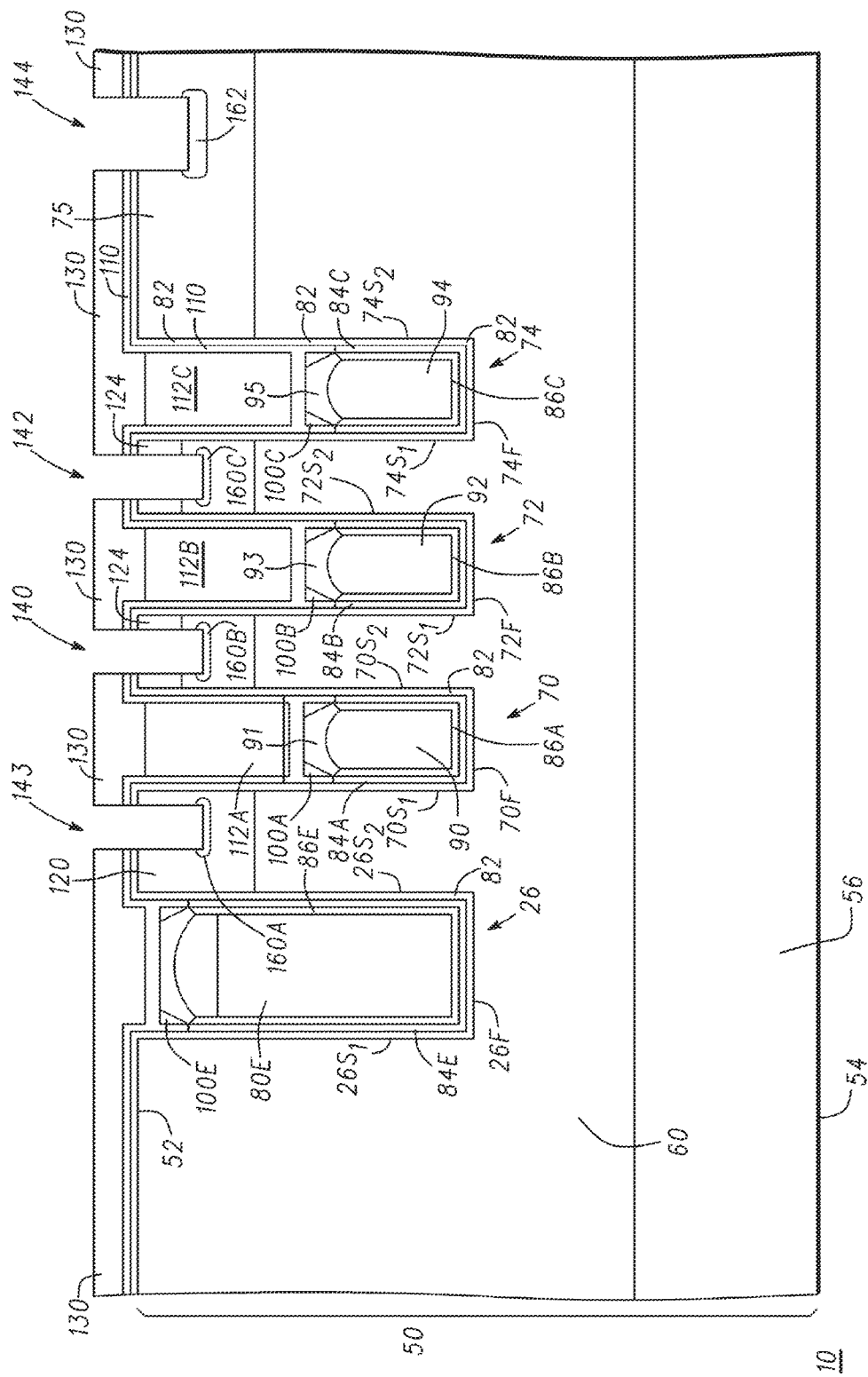
FIG. 15A and FIG. 15B are cross-sectional views of the semiconductor component of FIG. 1 taken along the area of section line 1A-1A of FIG. 1 at the same stage of manufacture than that of the cross-sectional views of FIG. 14A and FIG. 14B, respectively, in accordance with an embodiment of the present invention.
Figure 15B:
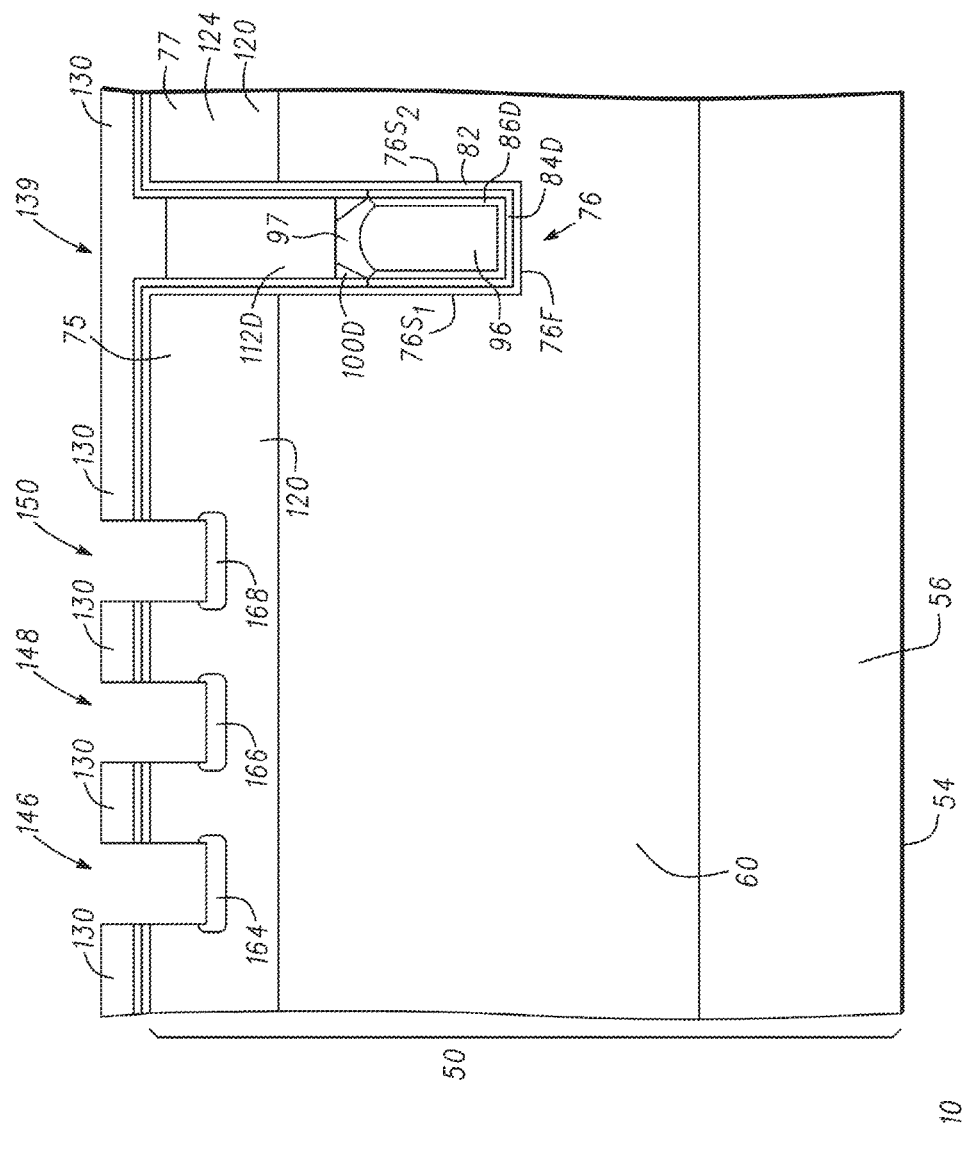

Referring now to FIGS. 14A and 14B and FIGS. 15A and 15B, a dielectric layer or dielectric layers 130 can be formed on dielectric layer 110 and over gate electrodes 112A, 112B, 112C, and 112D and shield electrode 80E. Dielectric layer 130 or dielectric layers 130 comprise a dielectric or insulative layer and can be configured as an inter-layer dielectric ("ILD") structure. By way of example, dielectric layer 130 is silicon dioxide such as, for example a doped or undoped deposited silicon dioxide. In accordance with an embodiment, dielectric layer 130 can include at least one layer of deposited silicon dioxide doped with phosphorus or boron and phosphorus, and at least one layer of undoped oxide. In an example, layer or layer or layers 130 can have a thickness ranging from about 0.4 µm to about 1 µm. Layer or layers 130 can be planarized to provide a more uniform surface topography, which improves manufacturability. It should be noted that FIGS. 14A and 14B are a cross-sectional view of semiconductor component 10 taken along section line 1B-1B of FIG. 1 and FIGS. 15A and 15B are a cross-sectional view of semiconductor component 10 taken along section line 1A-1A of FIG. 1 in accordance with an embodiment of the present invention. It should be further noted that the cross-sectional views of FIGS. 14A and 14B and FIGS. 15A and 15B represent views taken at the same time during the manufacture of semiconductor component 10. Collectively, FIGS. 14A and 14B may be referred to as FIG. 14 and FIGS. 15A and 15B may be referred to as FIG. 15. FIGS. 15A and 15B illustrate a portion of semiconductor component 10 at which contact 28 is absent. FIG. 14 is shown as two figures to expand FIG. 14 and better show the features of semiconductor component 10 and FIG. 15 is shown as two figures to expand FIG. 15 and better show the features of semiconductor component 10.

Still referring to FIGS. 14A and 14B and FIGS. 15A and 15B, a masking layer (not shown) can be formed overlying layer or layers 130. Gate contact openings or gate contact vias 134, 136, 138, and 139 are formed through dielectric layer 130 and into gate electrodes 112A, 112B, 112C, and 112D, respectively, source contact openings or source contact vias 140, 142, and 143 (shown in FIG. 15A) are formed through dielectric layer 130 and into mesa structures 71, 73, and 79, respectively, and shield contact openings or shield contact vias 144, 146, 148, and 150 are formed through dielectric layer 130 and into mesa structure 75. In accordance with an embodiment, the masking layer can be removed and a recess etch can be used to remove portions of the semiconductor material exposed by contact openings 134, 136, 138, 139, 140, 142, 143, 144, 146, 148, and 150. A masking layer (not shown) can be formed overlying portions of layer or layers 130 and in openings 134, 136, 138, and 139 that expose gate electrodes 112A, 112B, 112C, and 112D, respectively. The masking layer leaves contact openings 140, 142, 143, 144, 146, 148, and 150 open. P-type contact enhancement regions or contact regions 160A, 160B, and 160C can be formed to source electrode regions in mesa structures 71, 73, and 79, respectively. P-type enhancement contact regions 162, 164, 166, and 168 can be formed in mesa structure 75. Contact regions 160A, 160B, 160C, 162, 164, 166, and 168 can be formed using doping techniques such as, ion implantation and anneal techniques and provide a lower contact resistance to the semiconductor material in mesa structures 71, 73, 75, and 79.

Referring to FIGS. 16A, 16B, 17A, 17B, 18A, and 18B, barrier layers 180, 182, 184, and 186 are formed in contact openings 134, 136, 138, 139, respectively (shown in FIGS. 14A and 14B), barrier layers 192, 188, 190, 200, 202, 204, and 206 are formed in contact openings 143, 140, 142, 144, 146, 148, and 150, respectively (shown in FIGS. 15A-15B), and barrier layers 208A, 208B, 208C, 208D, and 186 are formed in contact openings (not shown) that are formed in trenches 26, 70, 72, 74, and 76, i.e., barrier layers 208A, 208B, 208C, 208D, and 186 are formed along the floors and sidewalls of the openings formed in trenches 26, 70, 72, 74, and 76, respectively. Contacts 220, 222, 224, and 226 are formed on barrier layers 180, 182, 184, and 186, respectively; contacts 234, 230, 232, 240, 242, 244, and 246 are formed on barrier layers 192, 188, 190, 200, 202, 204, and 206, respectively; and contacts 248, 221, 223, 225, and 227 are formed on barrier layers 208A, 208B, 208C, 208D, and 186, respectively. In accordance with an embodiment, a barrier material is formed on dielectric layer 130 and in contact openings 134, 136, 138, 139, 143, 140, 142, 144, 146, 148, and 150, and in the contact openings (not shown) that formed in trenches 26, 70, 72, 74, and 76. Suitable materials for the barrier layer include titanium nitride, titanium tungsten, or the like. A conductive layer (not shown) such as, for example, tungsten is deposited to fill contact openings 134, 136, 138, 139, 143, 140, 142, 144, 146, 148, and 150 and the contact openings (not shown) that formed in trenches 26, 70, 72, 74, and 76. This conductive layer is planarized using, for example, a CMP process to form contacts 220, 222, 224, and 226 in contact openings 134, 136, 138, 139, respectively, to form contacts 234, 230, 232, 240, 242, 244, and 246 in contact openings 143, 140, 142, 144, 146, 148, and 150, respectively, and to form contacts 248, 221, 223, 225, and 227 in the contact openings (not shown) formed in trenches 26, 70, 72, 74, and 76.

A metallization system 13 such as, for example, an aluminum-copper (AlCu) metallization system, is formed in contact with contacts 248, 221, 223, 226, 240, 242, 244, 246, 227, 234, 230, and 232. A metallization system 15 such as, for example, an aluminum-copper (AlCu) metallization system, is formed in contact with contacts 220, 222, 224, and 226.

Figure 16A:
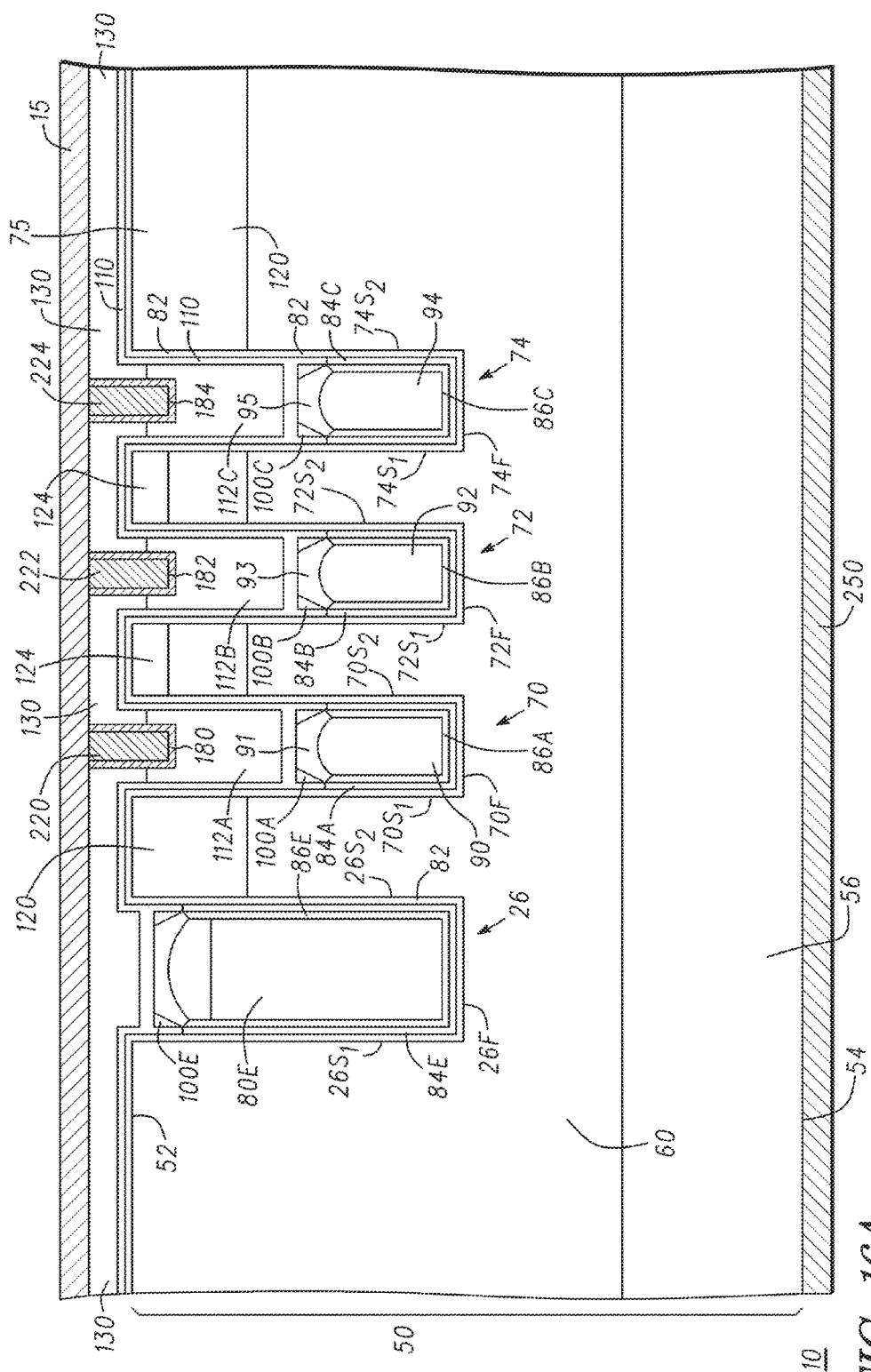
FIG. 16A and FIG. 16B are cross-sectional views of the semiconductor component of FIG. 1 at a later stage of manufacture than that of the cross-sectional views of FIG. 14A and FIG. 14B, respectively, in accordance with an embodiment of the present invention.
Figure 16B:
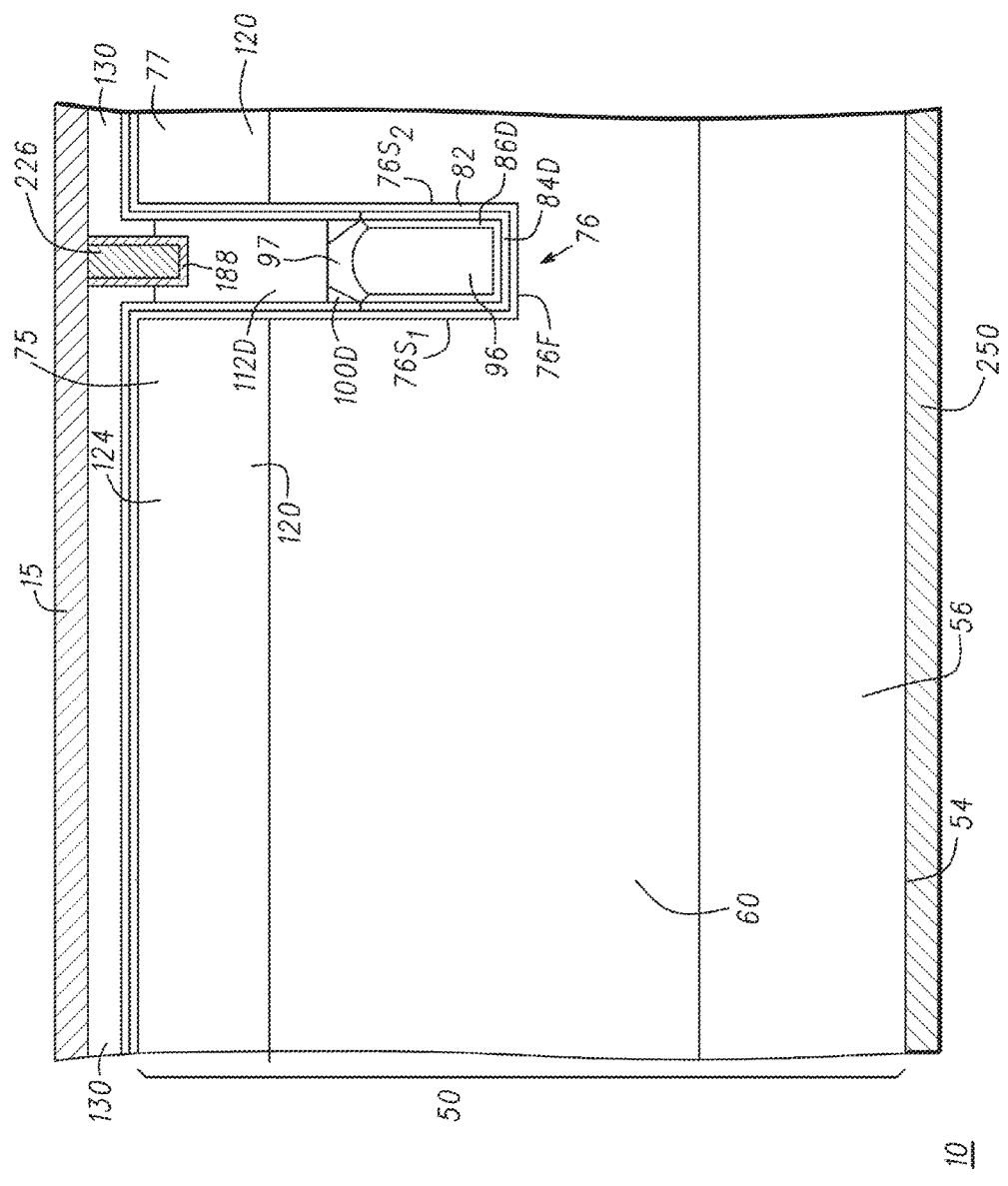
Figure 17A:
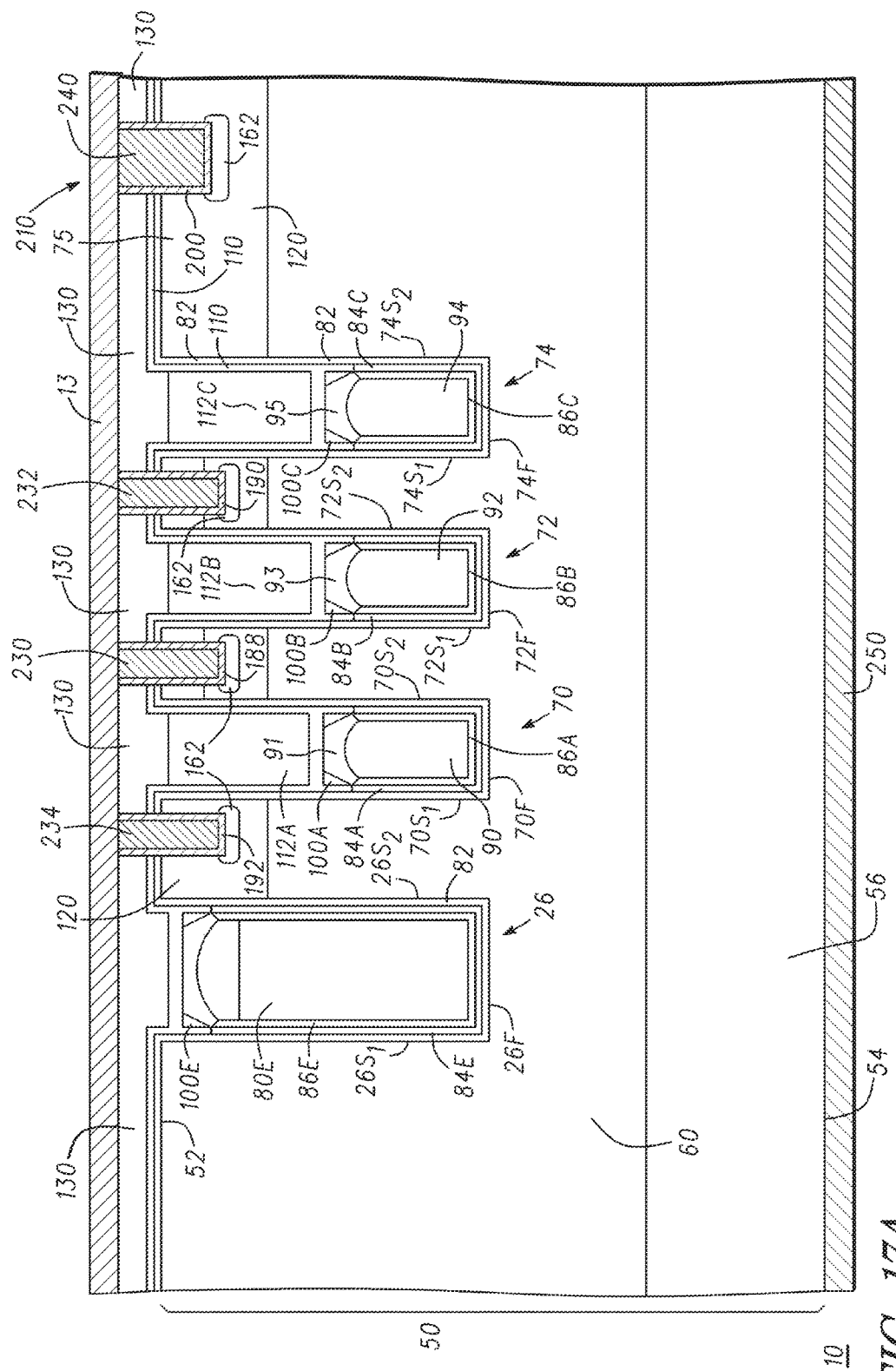
FIG. 17A and FIG. 17B are cross-sectional views of the semiconductor component of FIG. 1 at a later stage of manufacture than that of the cross-sectional views of FIG. 15A and FIG. 15B, respectively, in accordance with an embodiment of the present invention.
Figure 17B:
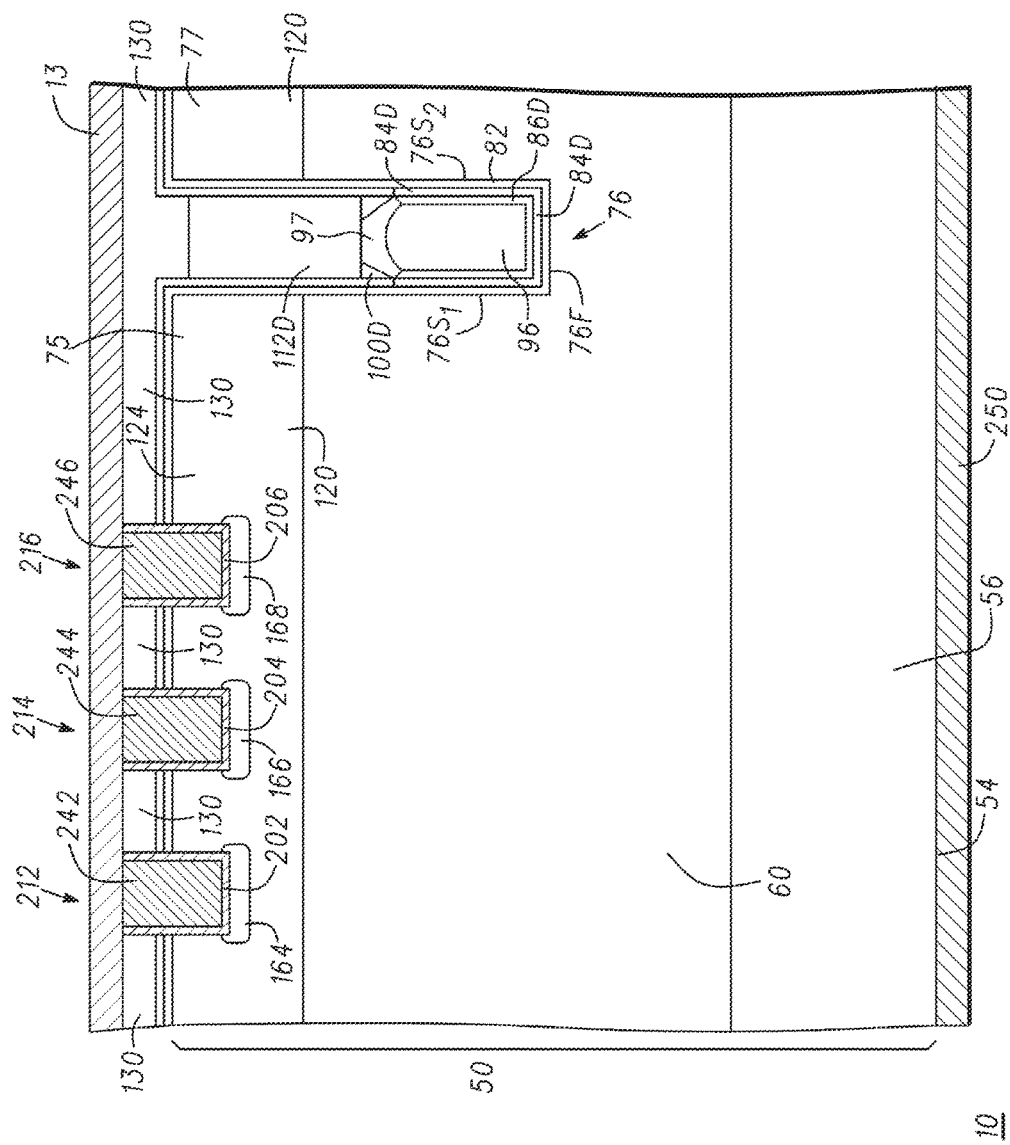
Figure 18A:
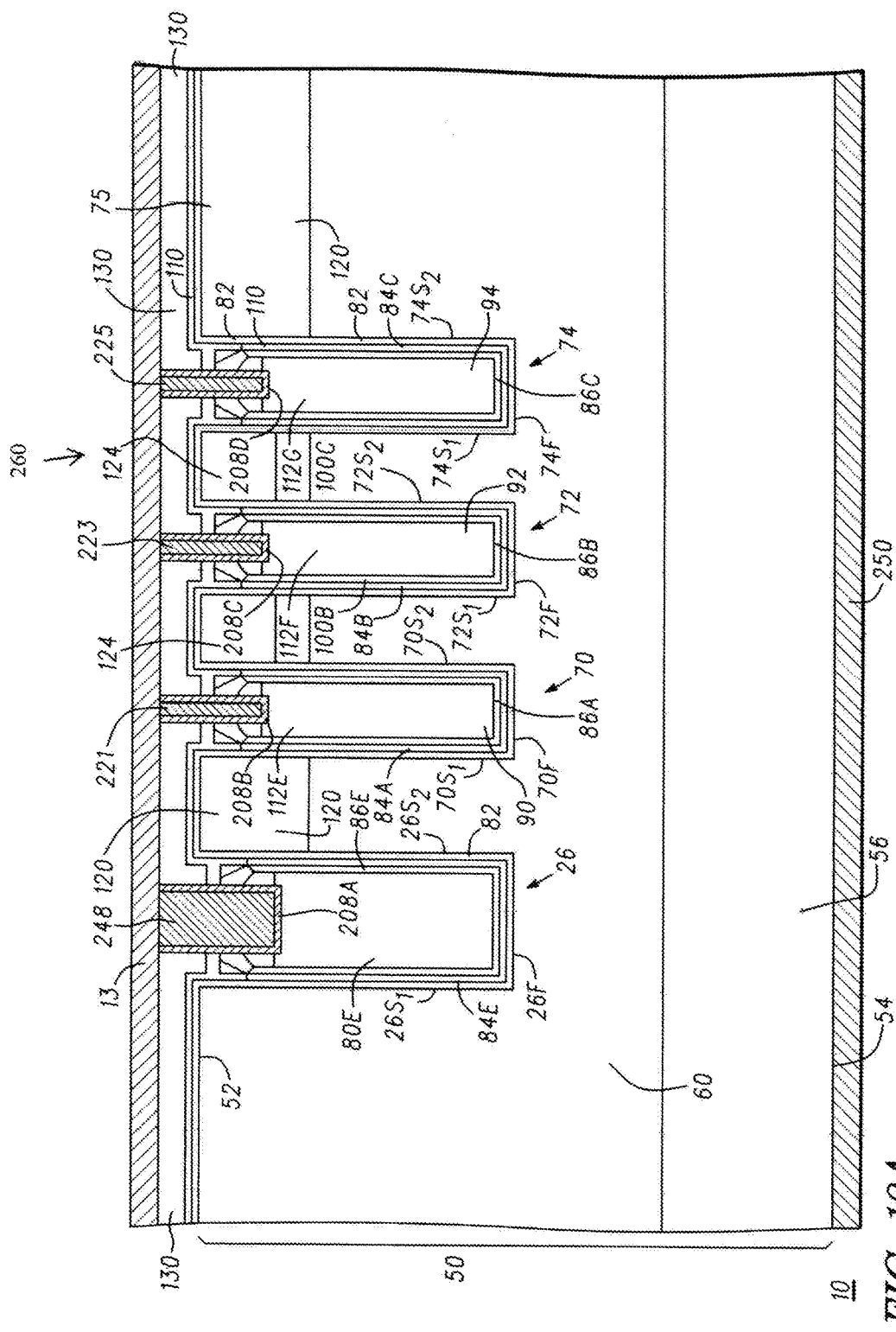
FIGS. 18A and 18B are cross-sectional views of the semiconductor component of FIG. 1 at a later stage of manufacture than that of the cross-sectional views of FIG. 15A and FIG. 15B, respectively, in accordance with an embodiment of the present invention.
Figure 18B:
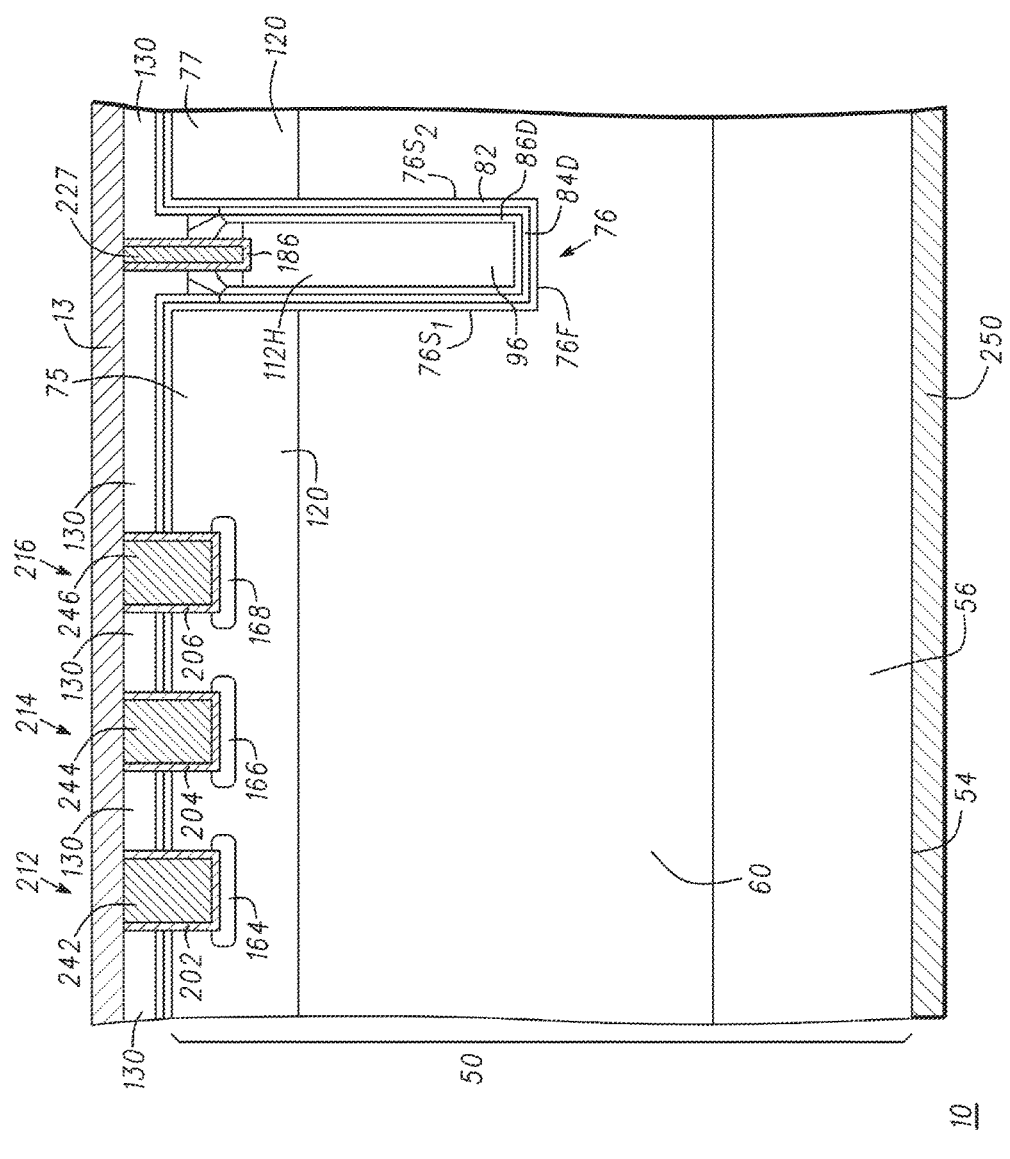

It should be noted that FIGS. 16A and 16B are cross-sectional views of semiconductor component 10 of FIGS. 14A and 14B, respectively, but at a later stage of manufacture; FIGS. 17A and 17B are cross-sectional views of semiconductor component 10 of FIGS. 15A and 15B, respectively, but at a later stage of manufacture; and FIGS. 18A and 18B are described together because they represent the region taken along section line 1C-1C of FIG. 1. FIGS. 16A, 16B, FIGS. 17A, 17B, 18A, and 18B represent views taken at the same time during the manufacture of semiconductor component 10. Collectively, FIGS. 16A and 16B may be referred to as FIG. 16; FIGS. 17A and 17B may be referred to as FIG. 17; and FIGS. 18A and 18B may be referred to as FIG. 18. FIG. 16 is shown as two figures to expand FIG. 16 and better show the features of semiconductor component 10; FIG. 17 is shown as two figures to expand FIG. 17 and better show the features of semiconductor component 10; and FIG. 18 is shown as two figures to expand FIG. 18 and better show the features of semiconductor component 10.

Thus, contact enhancement region 162, barrier structure 200, and clamping contact 240 form a clamping structure 210; contact enhancement region 164, barrier structure 202, and clamping contact 242 form a clamping structure 212; contact enhancement region 166, barrier structure 204, and clamping contact 244 form a clamping structure 214; and contact enhancement region 168, barrier structure 206, and clamping contact 246 form a clamping structure 216.

An electrically conductive layer 250 can be formed overlying major surface 54 of substrate 56. In one embodiment, conductive layer 250 can be a solderable metal structure such as titanium-nickel-silver, chromium-nickel-gold, or other related or equivalent materials as known by one of ordinary skill in the art, and is configured as a drain electrode or terminal.

FIGS. 18A and 18B further illustrate that electrically conductive portions 112E, 112F, 112G, and 112H of electrically conductive material 80 are formed in portions of the trenches 70, 72, 74, and 76, respectively. Electrically conductive portions 112E, 112F, 112G, and 112H are electrically connected to electrical interconnect 13 through contacts 221, 223, 225, and 226, respectively. Electrically conductive portion 112E is electrically connected to shield electrode 90, electrically conductive portion 112F is electrically connected to shield electrode 92, electrically conductive portion 112G is electrically connected to shield electrode 94, and electrically conductive portion 112H is electrically connected to shield electrode 96. It should be noted that electrically conductive portion 112E and shield electrode 90 may be continuous portions in trench 70 that are formed from electrically conductive material 80, electrically conductive portion 112F and shield electrode 92 may be continuous portions in trench 72 that are formed from electrically conductive material 80, electrically conductive portion 112G and shield electrode 94 may be continuous portions in trench 74 that are formed from electrically conductive material 80, and electrically conductive portion 112H and shield electrode 96 may be continuous portions in trench 76 that are formed from electrically conductive material 80.

It should be appreciated that a shielded gate semiconductor component has been provided that includes a trench Metal Oxide Semiconductor Field Effect Transistor ("MOSFET") 260. MOSFET 260 may be referred to as a shielded gate semiconductor device and is formed from mesa structure 73 and trench 74. A gate shield or shield electrode 94 is formed in a portion of trench 74 near floor 74F, an insulating material 95 is formed over shield electrode 94 and a gate electrode 112C is formed over insulating material 95. Thus, gate electrode 112C is vertically spaced apart from gate shield 94 by dielectric material 95. Trench 74 is spaced apart from a trench 76 by a mesa structure 75. One or more clamping structures 210-216 are formed from mesa structure 75. Each clamping structure includes a contact opening 144 extending a first distance into the semiconductor material 50, an enhancement dopant region 162A is formed through contact opening 144, a barrier structure 200 is formed in contact opening 144, and an electrically conductive material 240A is formed on the barrier structure 200, where electrically conductive material 240A serves as a contact.

Thus, a trench MOSFET with an integrated clamping structure has been described. The trench MOSFET includes an active area with mesa structures 71 and 73 having widths D1 and D2, where D1 and D2 are substantially equal. Widths D1 and D2 are chosen such that the N-type epi in mesa structures 71 and 73 can be fully depleted when the MOSFET is in avalanche breakdown. Fully depleting the mesa structures 71 and 73 lowers the electric field at the P-N junction between the body region and the N-epi in mesa structures 71 and 73, which enables a higher breakdown voltage for the MOSFET. The trench MOSFET further includes a clamping structure formed in mesa structure 75 with a width D3, where D3 is larger than widths D1 and D2. The width D3 is chosen such that the N-type epi in mesa structure 75 cannot be fully depleted. The width D3 may be at least 20% larger than widths D1 and D2, and may preferably be between 2 to 100 times larger than widths D1 and D2. This causes the electric field at the P-N junction between the body region and the N-epi in mesa structure 75 to be higher than the electric field in mesa structures 71 and 73, which results in a lower breakdown voltage in mesa structure 75, than in mesa structures 71 and 73. Since the mesa structure 75 cannot be fully depleted, the peak electric field, and hence the avalanche breakdown occurs at the P-N junction, away from trenches 74 and 76, which prevents any charge injection into trenches 74 and 76. Thus by having a lower avalanche breakdown voltage in mesa structure 75, the clamping structure prevents the active area of the trench MOSFET from going into avalanche breakdown, which protects the trench MOSFET.

At least contacts 230 and 232 formed to mesa structures 71 and 73 respectively, serve as source contacts to the body regions in mesa structures 71 and 73. Conductive layer 13 electrically connects contacts 230 and 232 together. Conductive layer 250 serves as a drain terminal of semiconductor component 10.

When a reverse bias voltage is applied between the drain and source terminals of semiconductor component 10, i.e., between conductive layers 250 and 13, respectively, avalanche breakdown occurs in the mesa structure 75 at a lower voltage than in mesa structure 73. Avalanche breakdown occurring in mesa structure 75 occurs at a voltage that is at least 10% (percent) lower than occurs in mesa structure 73.

It should be noted that the avalanche breakdown in the mesa structure 75 occurs at the junction between the body region of second conductivity type, and semiconductor material 50 of first conductivity type, away from trenches 74 and 76.

Figure 19:
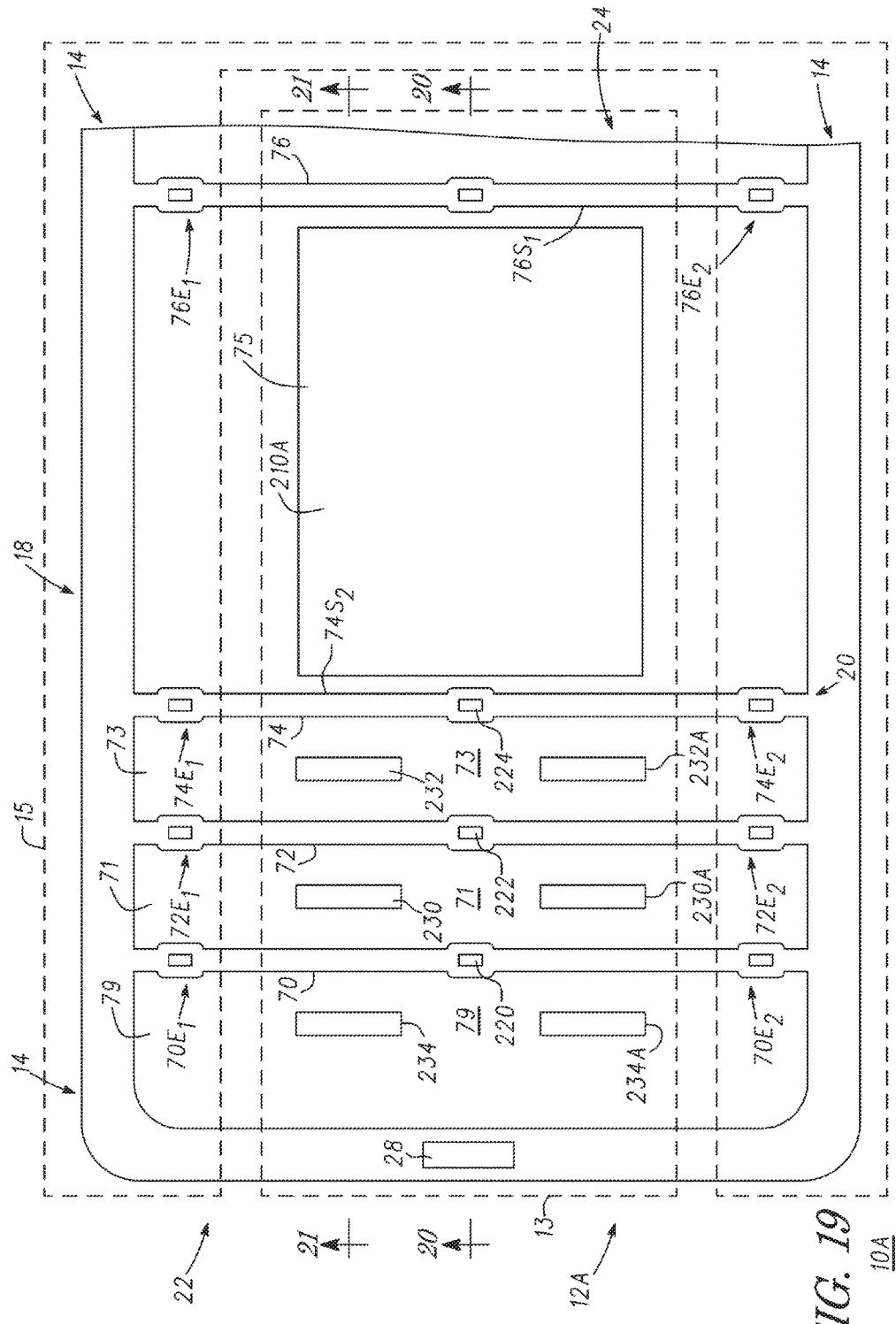
FIG. 19 is a top view of a semiconductor component having an active area and a peripheral area in accordance with another embodiment of the present invention.

FIG. 19 is an enlarged plan view of a semiconductor component 10A comprising a semiconductor chip 12A in accordance with an embodiment of the present invention. Semiconductor component 12A is similar to semiconductor component 12 except that rather than forming a plurality of clamping structures 210, 212, 214, and 216 in mesa structure 75, a single clamping structure 210A is formed in mesa structure 75. It should be noted that in accordance with embodiments, a single clamping structure can be formed from mesa structure 75 that extends less than 100% of the distance of mesa structure 75 extending from side 74S₂ of trench 74 to side 76S₁ of trench 76. For example, the single clamping structure can extend across 10% of mesa structure 75, 25% of mesa structure 75, 50% of mesa structure 75, 60% of mesa structure 75, 75% of mesa structure 75, 80% of mesa structure 75, 90% of mesa structure 75, 95% of mesa structure 75, etc.

Figure 20A:
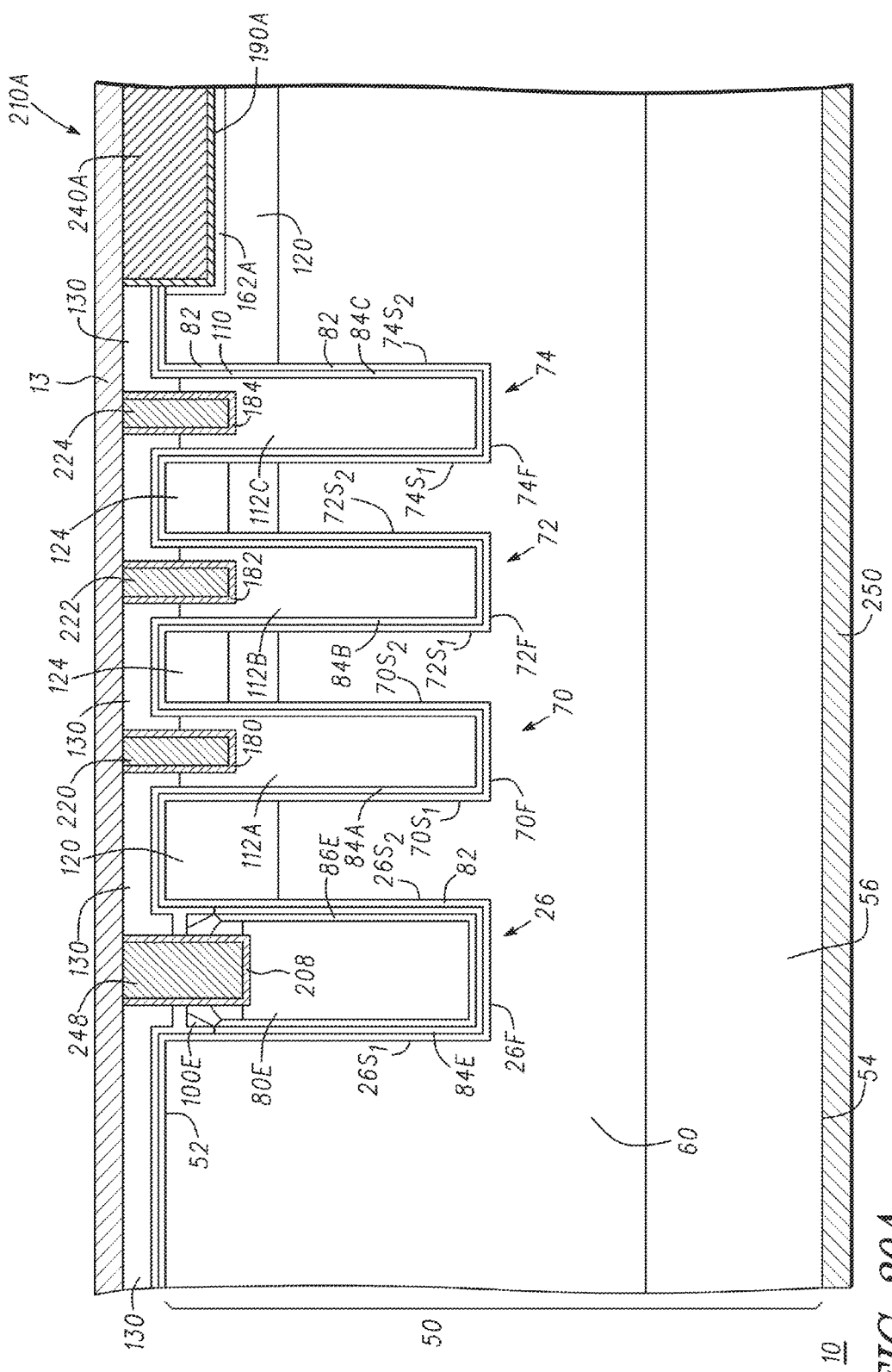
FIG. 20A and FIG. 20B are cross-sectional views of the semiconductor component of FIG. 19 taken along the area of section line 20-20 of FIG. 19 during the manufacture of the semiconductor component of FIG. 19.
Figure 20B:
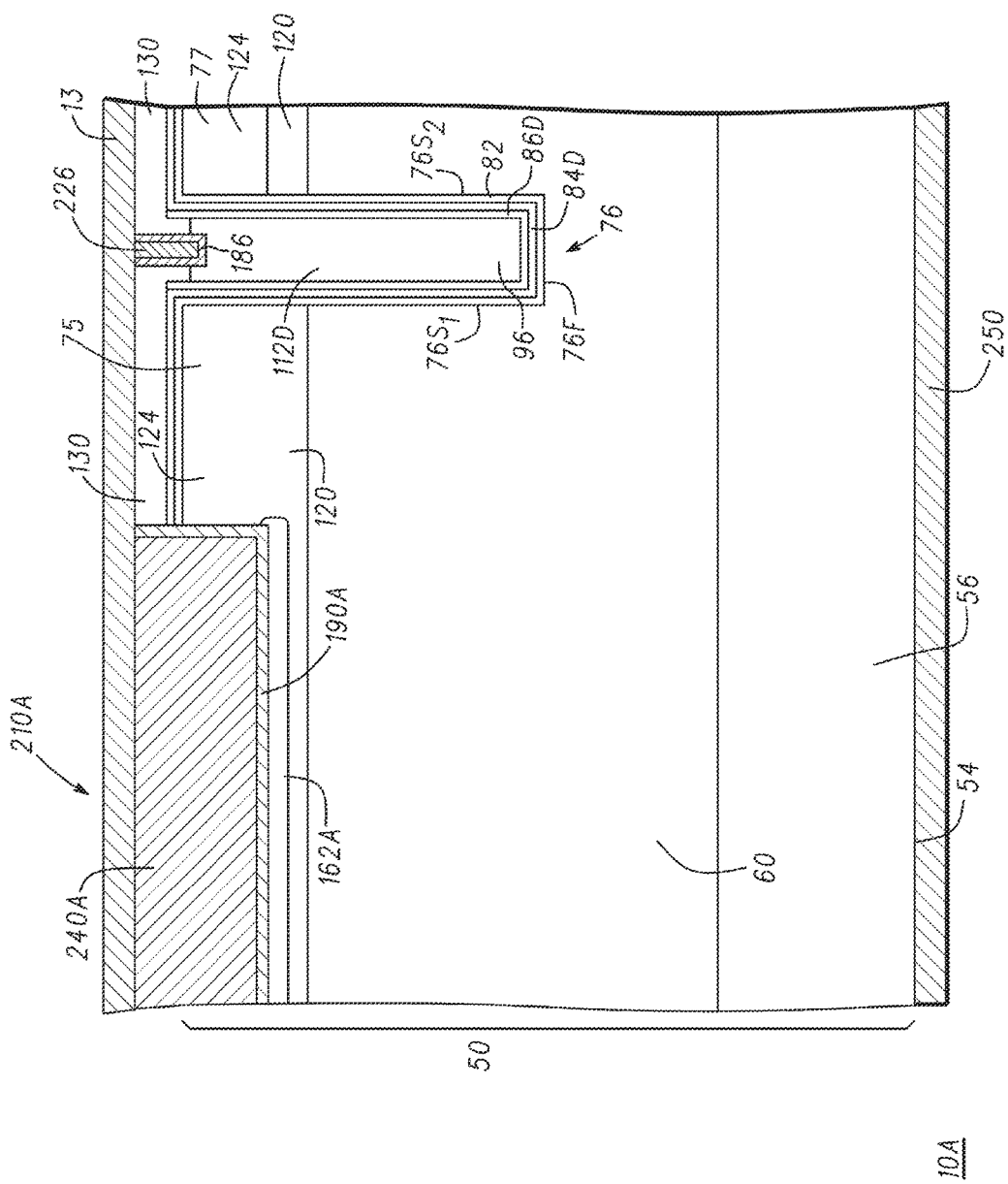

FIGS. 20A and 20B are cross-sectional views of semiconductor component 10A taken along section line 20-20 of FIG. 19 in accordance with an embodiment of the present invention. It should be noted that FIGS. 20A and 20B are described together because they represent the region taken along section line 20-20 of FIG. 19 and occur at the same time in the manufacture of semiconductor component 10A. Collectively, FIGS. 20A and 20B may be referred to as FIG. 20. The cross-sectional views of semiconductor component 10A shown in FIGS. 20A and 20B are similar to the cross-sectional views of semiconductor component 10 shown in FIGS. 18A and 18B, except that a single P-enhancement type contact region 162A is formed in mesa structure 75, a barrier structure 190A is formed from P-enhancement contact region 162A, and a shield electrode 240A is formed from mesa structure 75. Thus, the process steps for manufacturing semiconductor component 10A are similar to those for forming semiconductor component 10.

Figure 21A:
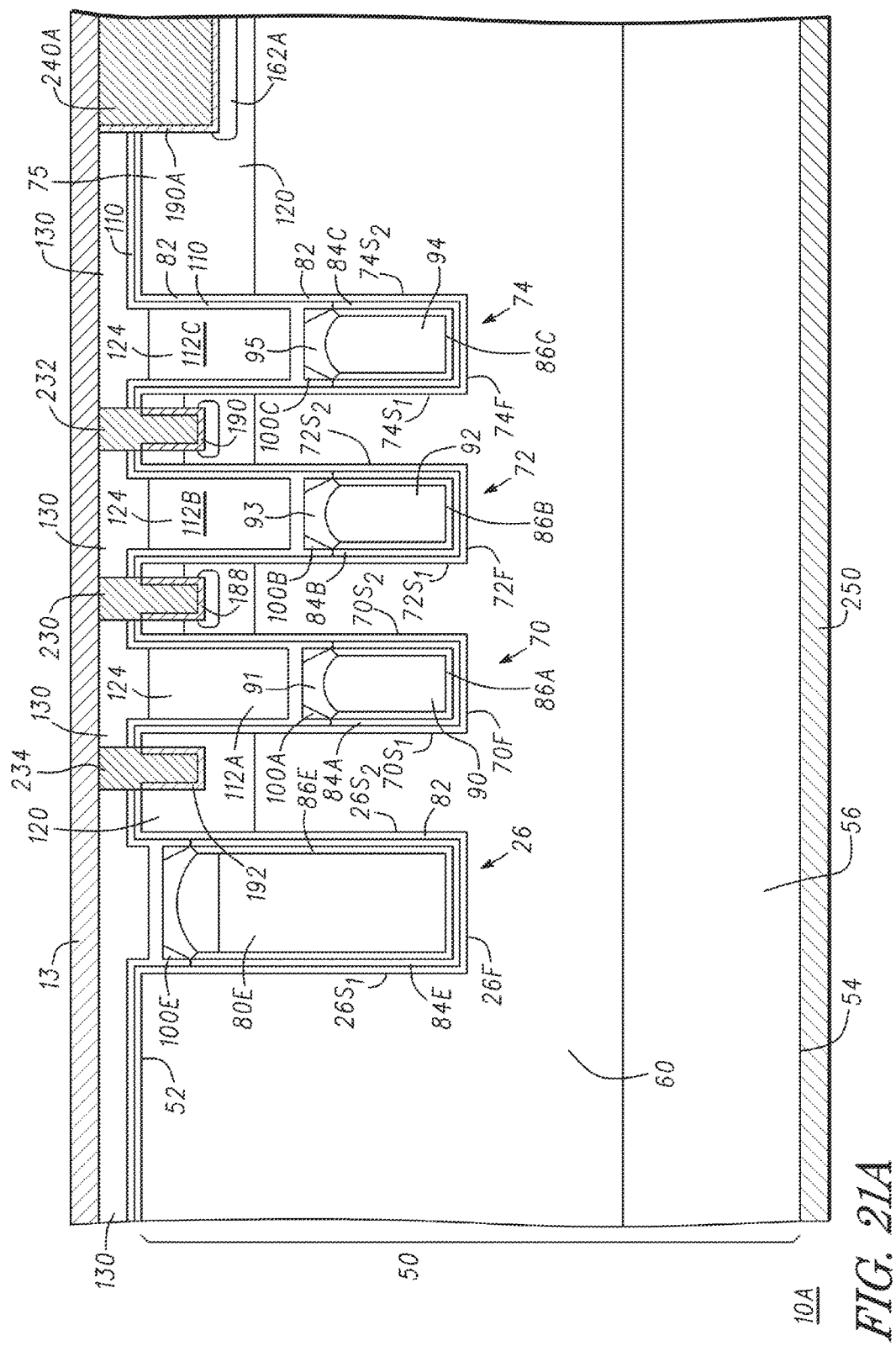
FIG. 21A and FIG. 21B are cross-sectional views of the semiconductor component of FIG. 19 taken along the area of section line 21-21 of FIG. 19 during the manufacture of the semiconductor component.
Figure 21B:
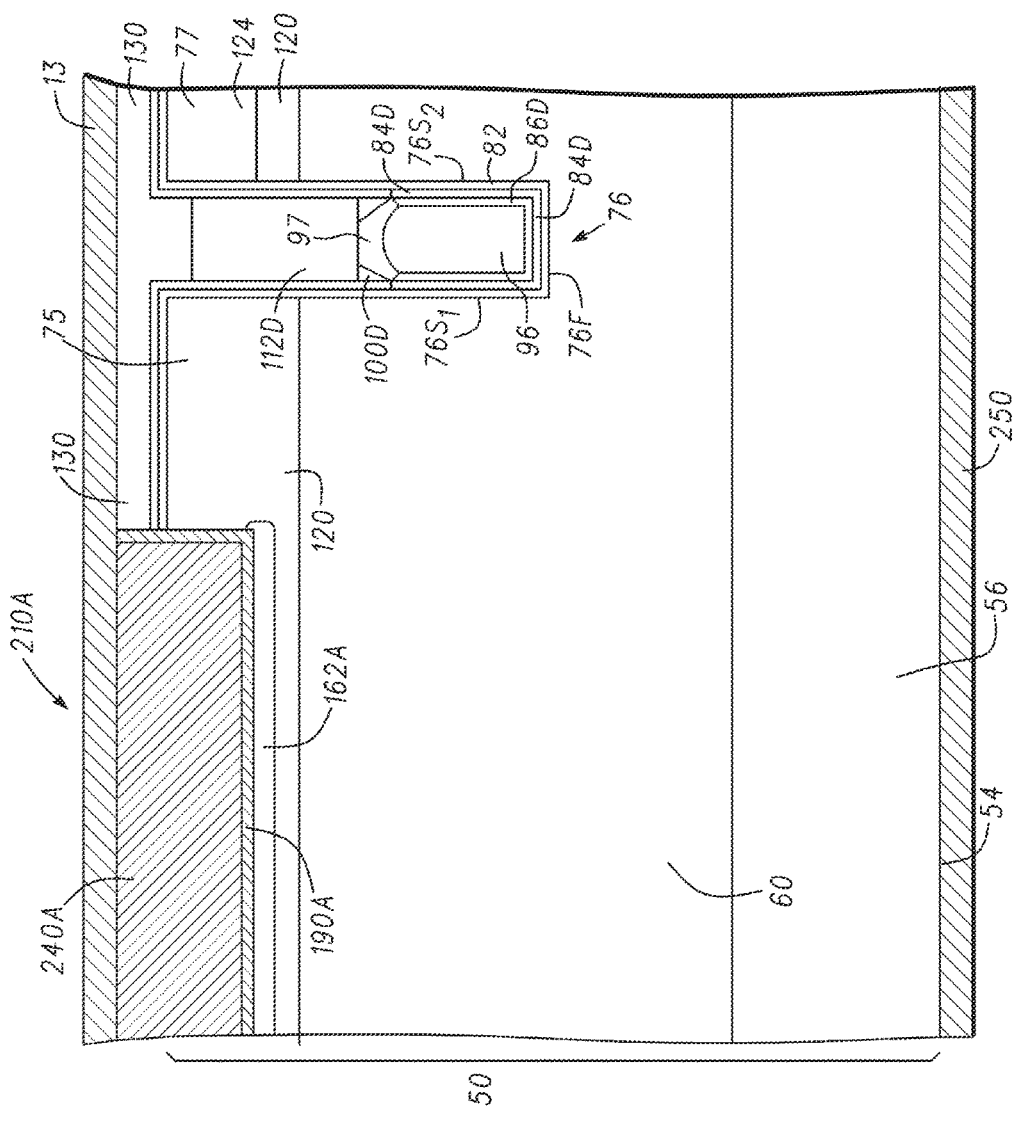

FIGS. 21A and 21B are cross-sectional views of semiconductor component 10A taken along section line 21-21 of FIG. 19 in accordance with an embodiment of the present invention. It should be noted that FIGS. 21A and 21B are described together because they represent the region taken along section line 21-21 of FIG. 19 and occur at the same time in the manufacture of semiconductor component 10A. Collectively, FIGS. 21A and 21B may be referred to as FIG. 21. The cross-sectional views of semiconductor component 10A shown in FIGS. 21A and 21B are similar to the cross-sectional views of semiconductor component 10 shown in FIGS. 17A and 17B, except that a single P-enhancement type contact region 162A is formed in mesa structure 75, a barrier structure 190A is formed from P-enhancement contact region 162A, and a clamping contact 241 is formed from mesa structure 75. Contact enhancement region 162A, barrier structure 190A, and clamping contact 240A form a clamping structure 210A. Thus, the process steps for manufacturing semiconductor component 10A are similar to those for forming semiconductor component 10.

Figure 22:
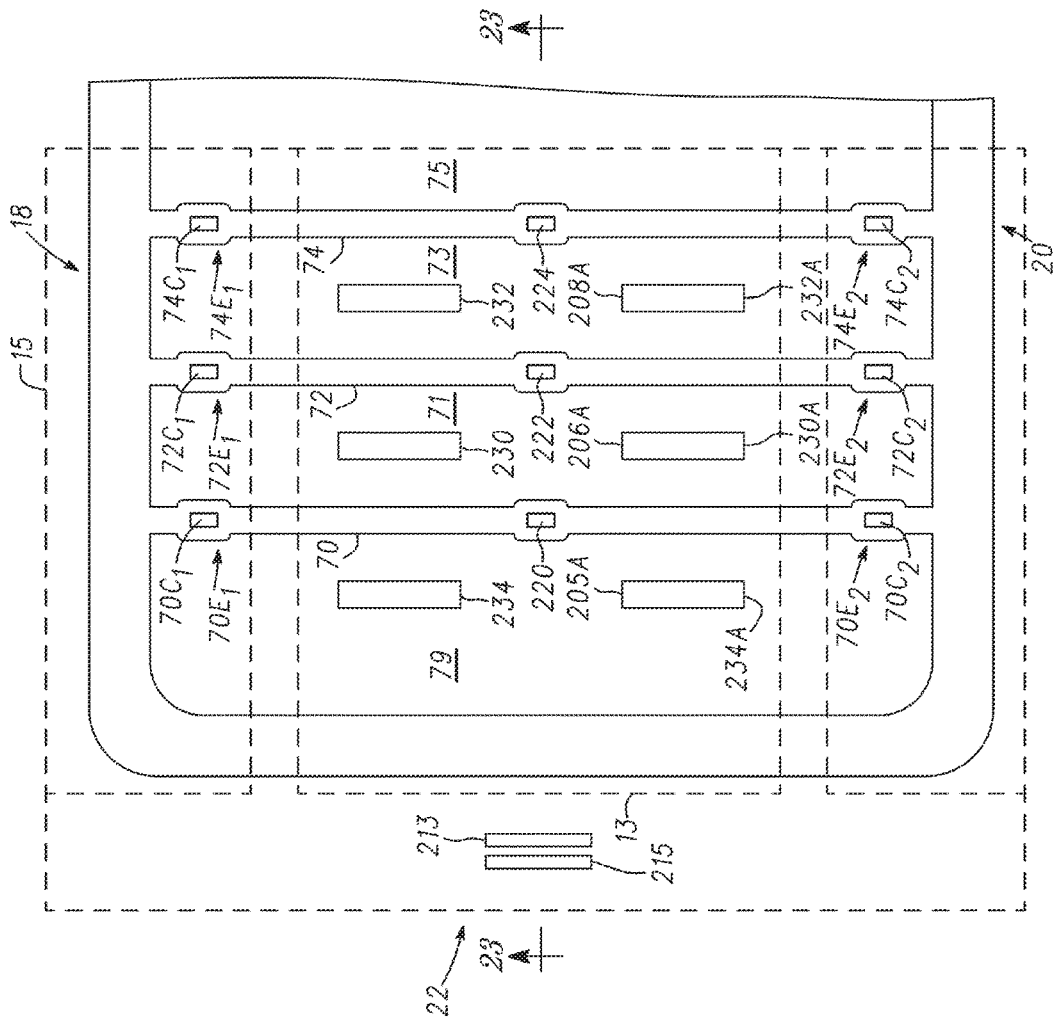
FIG. 22 is a top view of a semiconductor component having an active area and a peripheral area in accordance with another embodiment of the present invention.

FIG. 22 is an enlarged plan view of a semiconductor component 10B in accordance with an embodiment of the present invention. Semiconductor component 12B is similar to semiconductor component 12 except that rather than forming a plurality of clamping contacts 210, 212, 214, and 216 in mesa structure 75, clamping contacts 213 and 215 are formed so that termination trench 26 is between clamping contact 213 and mesa structure 79. Thus, clamping contacts 210, 212, 214, and 216 are absent from mesa structure 75.

Figure 23:
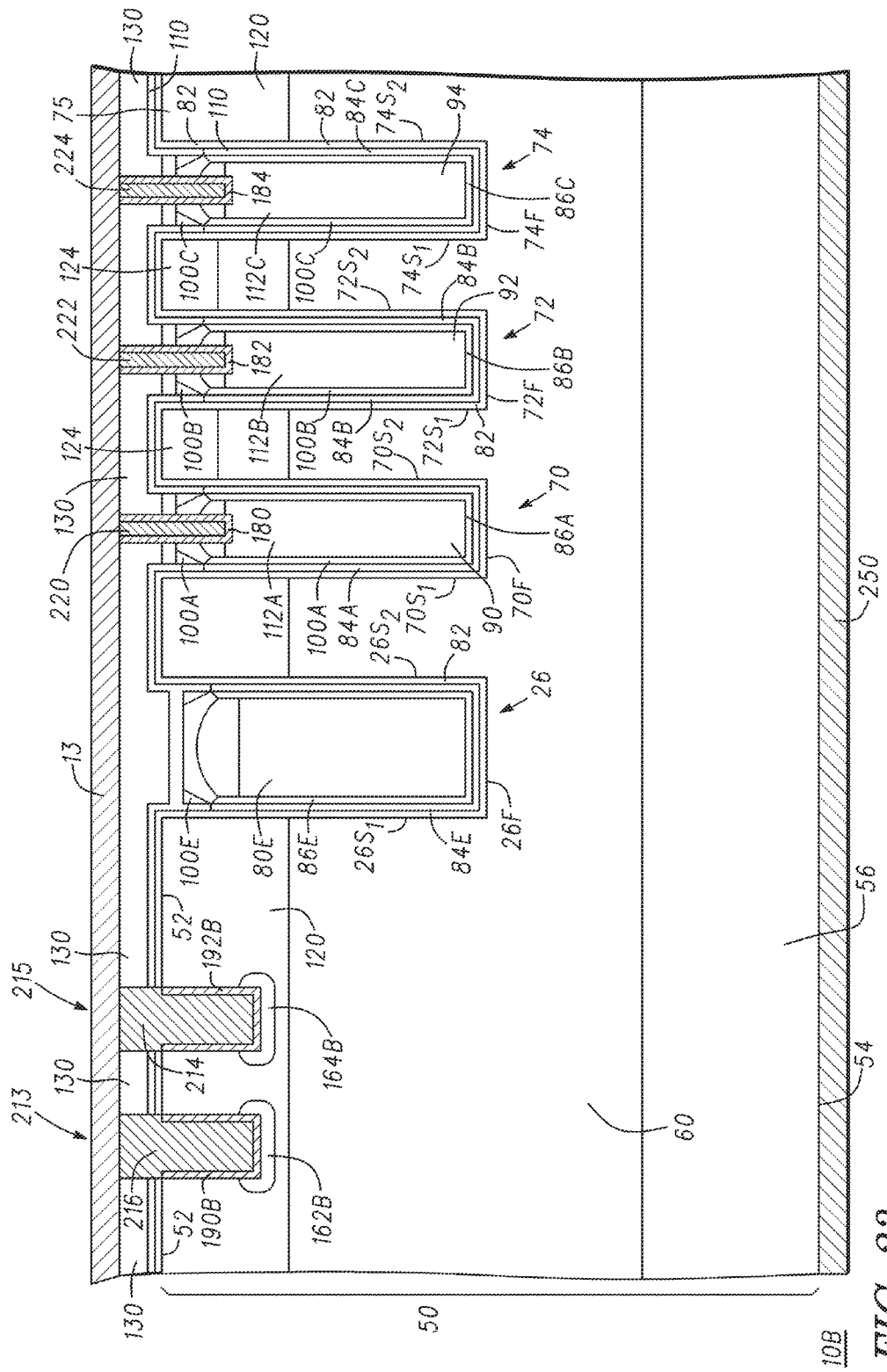
FIG. 23 is a cross-sectional view of the semiconductor component of FIG. 22 taken along the area of section line 23-23 of FIG. 22 during the manufacture of the semiconductor component.

Referring now to FIG. 23, a cross-sectional view of semiconductor component 10B taken along section line 23-23 of FIG. 22 is illustrated. More particularly, FIG. 23 illustrates clamping structures 213 and 215 formed adjacent to side 26S₁ of trench 26. Similar to clamping structures 210-216, clamping structures 213 and 215 include contact enhancement regions, barrier structures, and clamping contacts. More particularly, clamping structure 213 includes a contact enhancement region 164B, a barrier structure 192B, and a clamping contact 214 and clamping structure 215 includes a contact enhancement region 162B, a barrier structure 190B, and a clamping contact 216. Methods for forming contact enhancement regions, barrier structures, and contact enhancement regions have been described with reference to the description of clamping structures 210-216.

Figure 24A:
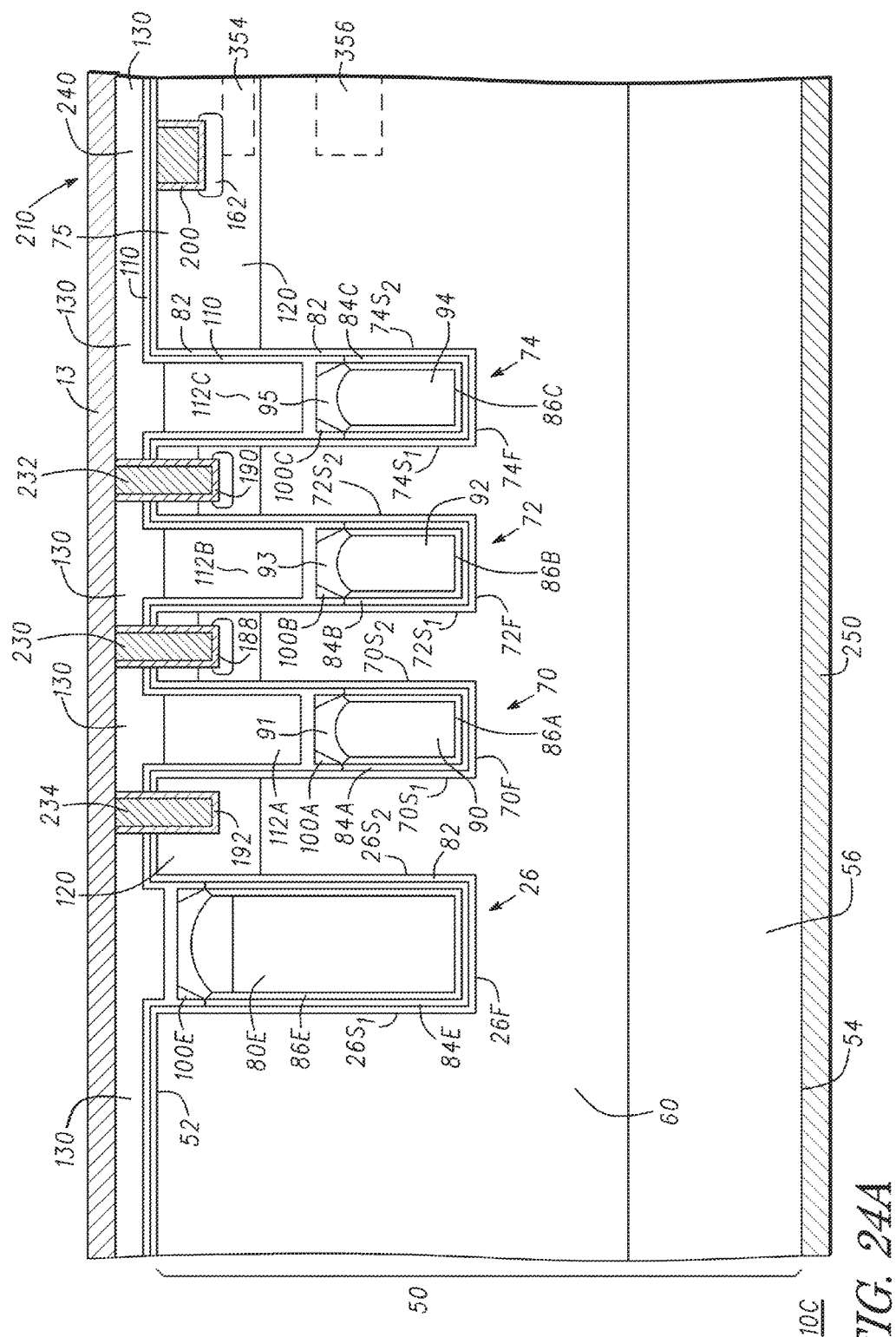
FIG. 24A and FIG. 24B are cross-sectional views of the semiconductor component of FIG.
Figure 24B:
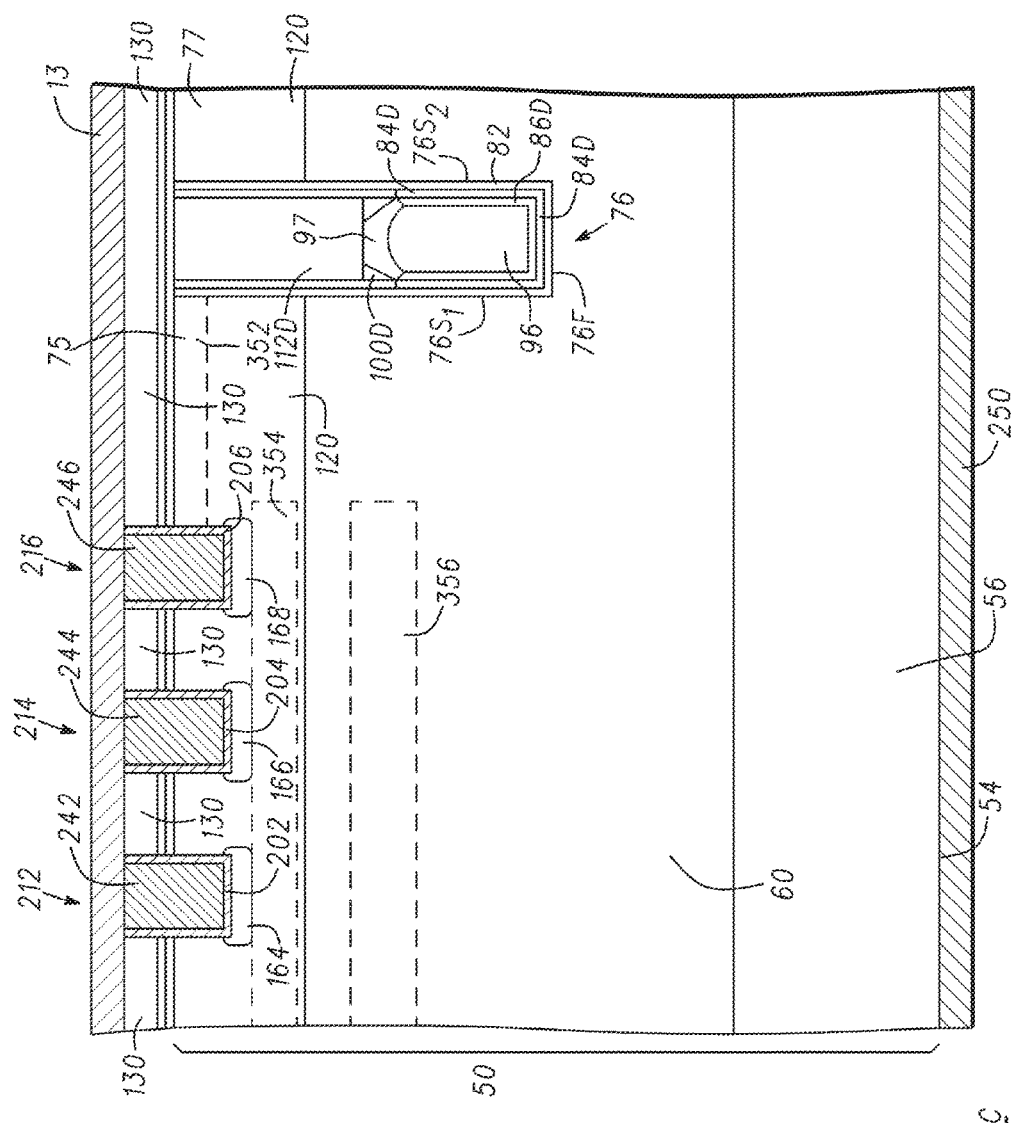

FIGS. 24A and 24B illustrate a semiconductor component 10C that includes a clamping structure in accordance with another embodiment of the present invention. The top view of semiconductor component 10C is similar to that of semiconductor component 10 shown in FIG. 1 and the cross-sectional views of semiconductor component 10C shown in FIGS. 24A and 24B are similar to those of semiconductor component 10 shown in FIGS. 17A and 17B, respectively. In accordance with one aspect, an optional implant of P-type impurity material to form a dopant region 354 may be included. Alternatively, an optional implant of N-type material to form dopant region 356 in semiconductor layer 60 may be included or an optional implant of N-type impurity material to form an optional N-type source/drain dopant region 352. It should be noted that semiconductor component 10 may include each of dopant regions 352, 354, and 356 or a subset of the dopant regions, e.g., only dopant region 352, only dopant region 354, only dopant region 356 or combinations of dopant regions 352, 354, and 356.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for suppressing charge injection in a semiconductor component, comprising:
    providing a semiconductor material of a first conductivity type, a first concentration, and having a first major surface and a second major surface;
    forming a first trench in the semiconductor material that extends from the first major surface into a first portion of the semiconductor material and a second trench in a second portion of the semiconductor material, the first trench having a first sidewall, a second sidewall, and a floor and the second trench having a first sidewall, a second sidewall, and a floor;
    forming a shielded gate semiconductor device from a third portion of the semiconductor material and a portion of the first trench; and
    forming a third trench in the semiconductor material that extends from the major surface into a fourth portion of the semiconductor material, the third trench having a first sidewall, a second sidewall, and a floor;
    forming a first clamping structure in a fifth portion of the semiconductor material between the first trench and the third trench, wherein forming the third trench includes spacing the third trench away from the first trench so that a width of a region of the semiconductor material between the first trench and the third trench is set to prevent the region of the semiconductor material between the first trench and the third trench from fully depleting in response to avalanche breakdown occurring in the region of the semiconductor material between the first trench and the third trench.

2. The method of claim 1, further including forming a first dopant region of a second conductivity type extending from the first major surface into the semiconductor material a first distance.

3. The method of claim 2, wherein forming the first trench and the third trench forms a mesa structure from the semiconductor material between the first trench and the third trench, and further including:
    forming a first dielectric material along the first sidewall, the second sidewall, and the floor of the first trench;
    forming a second dielectric material along the first sidewall, the second sidewall, and the floor of the third trench;
    forming a first shield electrode in the first trench, the first shield electrode adjacent the floor of the first trench;
    forming a first electrically insulating material over the first shield electrode;
    forming a first gate electrode of the shielded gate semiconductor device over the first electrically insulating material; and
    forming a second shield electrode in the third trench and adjacent the floor of the third trench.

4. The method of claim 2, further including:
    forming a first dielectric material along the first sidewall, the second sidewall, and the floor of the first trench;
    forming a second dielectric material along the first sidewall, the second sidewall, and the floor of the third trench;
    forming a first shield electrode in the first trench, the first shield electrode adjacent the floor of the first trench;
    forming a first electrically insulating material over the first shield electrode;
    forming a first gate electrode of the shielded gate semiconductor device over the first electrically insulating material, wherein a breakdown voltage adjacent the first gate electrode is clamped to be lower than a breakdown voltage adjacent the first shield electrode; and
    forming a second shield electrode in the third trench and adjacent the floor of the third trench.

5. The method of claim 2, wherein forming the shielded gate semiconductor device further includes forming a second dopant region of the first conductivity type in the semiconductor material adjacent the first trench, the second dopant region extending a second distance from the first major surface into the semiconductor material, the second distance less than the first distance.

6. The method of claim 5, wherein forming the first clamping structure between the first trench and the third trench includes:
    forming a first clamping contact opening in the fifth portion of the semiconductor material between the first trench and the third trench, the first clamping contact opening extending a third distance into the semiconductor material, the third distance less than the first distance; and
    forming a first clamping contact in the first clamping contact opening.

7. The method of claim 6, further including forming a third dopant region of a second conductivity type in a portion of the semiconductor material exposed by the first clamping contact opening.

8. The method of claim 7, wherein forming the first clamping contact in the first clamping contact opening includes:
    forming a first barrier structure in the first clamping contact opening; and
    forming an electrically conductive material over the first barrier structure.

9. The method of claim 8, further including forming a second clamping structure in a sixth portion of the semiconductor material between the first clamping structure and the third trench.

10. The method of claim 9, wherein forming the second clamping structure between the first clamping structure and the third trench includes:
    forming a second clamping contact opening in a second portion of the semiconductor material between the first trench and the third trench, the second clamping contact opening extending the third distance into the semiconductor material; and
    forming a second clamping contact in the second clamping contact opening.

11. The method of claim 8, further including forming a fourth dopant region of the second conductivity type in a portion of the semiconductor material exposed by the second clamping contact opening.

12. The method of claim 8, further including forming a fourth dopant region of the first conductivity type in a region of the semiconductor material between the first trench and the third trench.

13. A method for suppressing charge injection in a semiconductor component, comprising:
providing a semiconductor material of a first conductivity type, a first concentration, and having a first major surface and a second major surface;
forming first and second device trenches in first and second portions of the semiconductor material, respectively, wherein the first device trench extends from the first major surface into the first portion of the semiconductor material and has a first sidewall, a second sidewall, and a floor, and the second device trench extends from the first major surface into the second portion of the semiconductor material, and wherein the first device trench is separated from the second device trench by a first mesa structure having a first width;
forming first and second clamping trenches in third and fourth portions of the semiconductor material, respectively, wherein the first clamping trench extends from the first major surface into the third portion of the semiconductor material and has a first sidewall, a second sidewall, and a floor, and the second clamping trench extends from the first major surface into the fourth portion of the semiconductor material, and wherein the first clamping trench is separated from the second clamping trench by a second mesa structure having a second width; and wherein
the first width of the first mesa structure is configured so that the first mesa structure is fully depleted of charge carriers before avalanche breakdown occurs in the first mesa structure, and the second width of the second mesa structure is configured so that the second mesa structure is not fully depleted in response to avalanche breakdown occurring in the second mesa structure.

14. The method of claim 13, further including configuring the first mesa structure and the second mesa structure so that avalanche breakdown occurs in the second mesa structure at a lower voltage than in the first mesa structure.

15. The method of claim 14, further including forming the first device trench, the second device trench, the first clamping trench, and the second clamping trench so that the second width of the second mesa structure is at least 20 percent larger than the first width of the first mesa structure.

16. The method of claim 15, further including:
forming a first shield electrode in a first portion of the first device trench;
forming a second shield electrode in a first portion of the second device trench;
forming a first transistor from a second portion of the first device trench and a first portion of the first mesa structure; and
forming a second transistor from a second portion of the second device trench and a second portion of the first mesa structure.

17. The method of claim 15, further including forming a first clamping structure from the second mesa structure.

18. The method of claim 15, wherein forming the first clamping structure includes forming an electrically conductive material in the first clamping trench and the second clamping trench.

19. A method for suppressing charge injection in a semiconductor component, comprising:
providing a semiconductor material of a first conductivity type and having first and second major surfaces;
forming a plurality of mesa structures from the semiconductor material of the first conductivity type, a first mesa structure of the plurality of mesa structures having a first width and a second mesa structure of the plurality of mesa structures having a second width;
forming a shielded gate semiconductor device from the first mesa structure of the plurality of mesa structures and a portion of a first trench adjacent the first mesa structure, wherein the shielded gate semiconductor device includes a first shielded gate structure between the first mesa structure and the second mesa structure;
forming a first clamping structure in the second mesa structure of the plurality of mesa structures; and
forming a first shield structure adjacent the second mesa structure, and wherein
the first width of the first mesa structure is configured so that the first mesa structure is fully depleted of charge carriers before avalanche breakdown occurs in the first mesa structure, and the second width of the second mesa structure is configured so that the second mesa structure is not fully depleted in response to avalanche breakdown occurring in the second mesa structure.

20. The method of claim 19, wherein forming the first shielded gate structure comprises:
forming the first trench between the first mesa structure and the second mesa structure and a second trench adjacent the second mesa structure;
forming a first gate shield in a first portion of the first trench; and
forming a first gate electrode in a second portion of the first trench, the first gate electrode vertically spaced apart from the first gate shield by a first dielectric material; and wherein forming the first clamping structure comprises:
forming a first clamping contact opening in a first portion of the semiconductor material between the first trench and the second trench, the first clamping contact opening extending a first distance into the semiconductor material and having a width equal to at least half a width of the first mesa structure, the first clamping contact opening having a floor and sidewalls;
forming a first dopant region of a second conductivity type extending from the clamping contact opening into the semiconductor material;
forming a barrier structure on the floor and the sidewalls of the of the clamping contact opening; and
forming an electrically conductive material in the clamping opening.

* * * * *